United States Patent
Mevellec et al.

(10) Patent No.: US 9,725,602 B2
(45) Date of Patent: Aug. 8, 2017

(54) METHOD FOR PREPARING AN ORGANIC FILM AT THE SURFACE OF A SOLID SUPPORT UNDER NON-ELECTROCHEMICAL CONDITIONS, SOLID SUPPORT THUS OBTAINED AND PREPARATION KIT

(75) Inventors: Vincent Mevellec, Boulogne Billancourt (FR); Sebastien Roussel, Soisy sur Seine (FR); Serge Palacin, Montigny le Bretonneux (FR); Guy Deniau, Auffargis (FR); Thomas Berthelot, Villebon sur Yvette (FR); Cecile Baudin, Paris (FR); Adhitya Trenggono, Palaiseau (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 1294 days.

(21) Appl. No.: 11/960,109

(22) Filed: Dec. 19, 2007

(65) Prior Publication Data

US 2008/0193668 A1    Aug. 14, 2008

Related U.S. Application Data

(63) Continuation-in-part of application No. 11/835,004, filed on Aug. 7, 2007, now Pat. No. 8,709,542, and a
(Continued)

(30) Foreign Application Priority Data

Dec. 19, 2006 (FR) .................................. 06 55653
Apr. 4, 2007 (FR) .................................. 07 54278
(Continued)

(51) Int. Cl.
*B05D 3/10* (2006.01)
*C09D 4/00* (2006.01)
*H01L 51/00* (2006.01)

(52) U.S. Cl.
CPC ............ *C09D 4/00* (2013.01); *H01L 51/0006* (2013.01); *H01L 51/0075* (2013.01);
(Continued)

(58) Field of Classification Search
CPC ...................................................... C09D 4/00
(Continued)

(56) References Cited

U.S. PATENT DOCUMENTS

| 4,654,299 A | 3/1987 | Lentfer | |
| 5,554,739 A * | 9/1996 | Belmont | .................. 534/885 |

(Continued)

FOREIGN PATENT DOCUMENTS

| EP | 1 258 504 A1 | 11/2002 |
| FR | 2 829 046 A1 | 3/2003 |

(Continued)

OTHER PUBLICATIONS

Hurley, Covalent Bonding of Organic Molecules to Cu and Al Alloy 2024 T3 Surfaces via Diazonium Ion Reduction, Journal of the electrochemical society, 151 (5), B252-B259, 2004.*
(Continued)

*Primary Examiner* — Tabatha Penny
(74) *Attorney, Agent, or Firm* — Nixon Peabody LLP; Khaled Shami

(57) ABSTRACT

This invention relates to a method for preparing an organic film at the surface of a solid support, with a step of contacting said surface with a liquid solution including (i) at least one solvent, (ii) at least one adhesion primer, under non-electrochemical conditions, and allowing the formation of radical entities based on the adhesion primer. The liquid
(Continued)

solution can also include (iii) at least one monomer different from the adhesion primer and radically polymerizable. This invention also relates to a non-electrically-conductive solid support on which an organic film according to said method is grafted, and a kit for preparing an essentially polymeric organic film at the surface of a solid support.

72 Claims, 17 Drawing Sheets

Related U.S. Application Data continuation-in-part of application No. 11/753,394, filed on May 24, 2007, and a continuation-in-part of application No. 11/686,076, filed on Mar. 14, 2007.

(30) Foreign Application Priority Data

| | | |
|---|---|---|
| May 30, 2007 | (FR) | 07 55356 |
| Jun. 11, 2007 | (FR) | 07 55659 |
| Jun. 29, 2007 | (FR) | 07 56182 |
| Oct. 29, 2007 | (FR) | 07 58660 |

(52) U.S. Cl.
CPC .......... *Y10T 428/25* (2015.01); *Y10T 428/26* (2015.01); *Y10T 428/31504* (2015.04); *Y10T 428/31678* (2015.04); *Y10T 428/31989* (2015.04); *Y10T 428/31993* (2015.04)

(58) Field of Classification Search
USPC ........................................................ 427/337
See application file for complete search history.

(56) References Cited

U.S. PATENT DOCUMENTS

| | | | |
|---|---|---|---|
| 6,458,458 | B1 | 10/2002 | Cooke et al. |
| 7,119,030 | B2* | 10/2006 | Bureau et al. ............. 438/758 |
| 8,133,549 | B2 | 3/2012 | Bureau et al. |
| 8,298,946 | B2 | 10/2012 | Bureau et al. |
| 2003/0162039 | A1* | 8/2003 | Pinson et al. ............. 428/457 |
| 2003/0162848 | A1* | 8/2003 | Gimpel et al. ............. 518/716 |
| 2004/0071624 | A1 | 4/2004 | Tour et al. |
| 2005/0095266 | A1* | 5/2005 | Perichaud et al. .......... 424/423 |
| 2005/0207963 | A1* | 9/2005 | Tour et al. ................ 423/447.1 |
| 2005/0233183 | A1* | 10/2005 | Hampden-Smith et al. ... 429/12 |
| 2007/0262449 | A1 | 11/2007 | Bispo et al. |
| 2008/0064783 | A1 | 3/2008 | Chehimi et al. |

FOREIGN PATENT DOCUMENTS

| | | |
|---|---|---|
| FR | 2 841 908 A1 | 1/2004 |
| FR | 2 851 181 A1 | 8/2004 |
| FR | 2 860 523 A1 | 4/2005 |
| FR | 2 883 299 A1 | 9/2006 |
| GB | 1 501 128 | 2/1976 |
| GB | 1 447 886 | 9/1976 |
| WO | WO 03/018212 A1 | 3/2003 |
| WO | 2005/098087 | 10/2005 |
| WO | 2006/000692 | 1/2006 |
| WO | 2007/048894 | 5/2007 |
| WO | 2007/101851 | 9/2007 |

OTHER PUBLICATIONS

Bravo-Diaz, Effects of Monovalent and Divalent Anionic Dodecyl Sulfate Surfactants on the Dediazonation of 2-,3-, and 4-Methylbenzenediazonium Tetrafluoroborate, Langmuir, 1998, 5098-5105.*
Kariuki, Formation of multilayers on glassy carbon electrodes via the reduction of diazonium salts, Langmuir, 2001, 17, 5947-5951.*
Moffat, Patterned Metal Electrodeposition Using an Alkanethiolate Mask, J. Electrochem. Soc., 1995, 142(11), L220-L222.*
Blankespoor, Dense Monolayers of Metal-Chelating Ligands Covalently Attached to Carbon Electrodes Electrochemically and Their Useful Application in Affinity Binding of Histidine-Tagged Proteins, Langmuir, 2005, 21, 3362-3375.*
Huthig &Wept Polymer Synthesis, 1991,7 pages.
Joel Lyskawa, et al., "Direct Modification of a Gold Electrode with Aminophenyl Groups by Electrochemical Reduction of in Situ Generated Aminophenyl Monodiazonium Cations", Chem. Mater., vol. 18, 2006, pp. 4755-4763.
Ryosuke Asami, et al., "Development of a Novel Environmentally Friendly Electropolymerization of Water-Insoluble Monomers in Aqueous Electrolytes Using Acoustic Emulsification", Langmuir. vol. 22, No. 24, 2006, pp. 10258-10263.
Mitsuharu Konuma, "Film Deposition by Plasma Techniques", Springer Series on Atoms and Plasmas, 1992, 8 pages.
Bertha Ortiz, et al., "Electrochemical modification of a carbon electrode using aromatic diazonium salts. 2. Electrochemistry of 4-nitrophenyl modified glassy carbon electrodes in aqueous media", Journal of Electroanalytical Chemistry, vol. 455, 1998, pp. 75-81.
Guy Deniau. et al.. "Coupled chemistry revisited in the tentative cathodic electropolymerization of 2-butenenitrile", Journal of Electroanalytical, vol. 451, 1998, pp. 145-161.
Guy Deniau, et al., "Carbon-to-metal bonds: Electrochemical reduction of 2-butenenitrile", Surface Science, vol. 600, 2006, pp. 675-684.
Serge Palacin, et al., "Molecule-to-Metal Bonds: Electrografting Polymers on Conducting Surfaces", Chemphyschem, vol. 5, 2004, pp. 1468-1481.
Abraham Ulman, "An Introduction to Ultrathin Organic Films", Langmuir-Blodgett to Self-Assembly, 1991, 11 pages.
Hynek Biederman, et al., "Plasma Polymerization Processes", Plasma Technology, 3, 1991,6 pages.
U.S. Final Office Action (U.S. Appl. No. 11/753,394) Dated Feb. 23, 2017.
U.S. Final Office Action (U.S. Appl. No. 11/686,076) Dated Feb. 24, 2017.

* cited by examiner

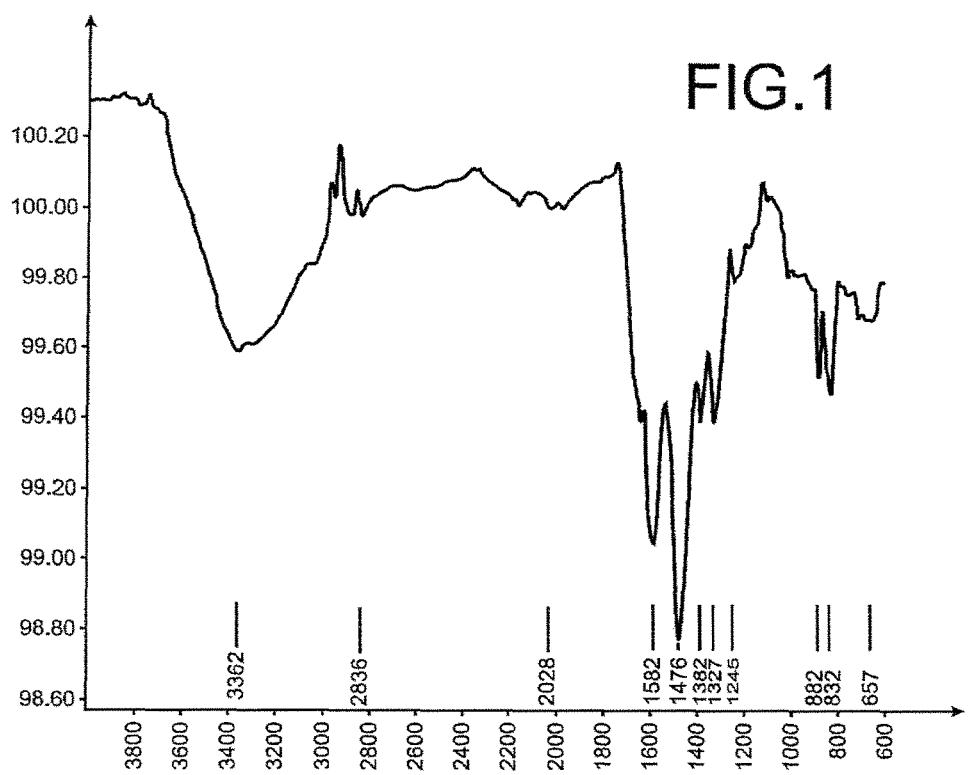
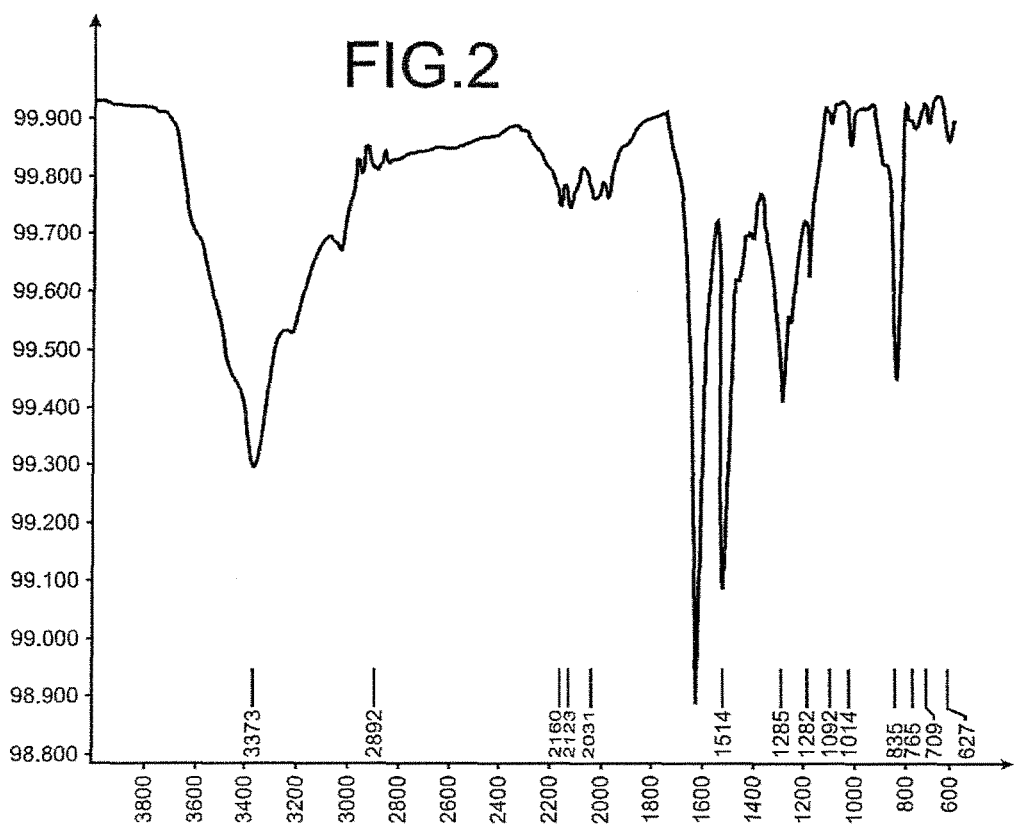

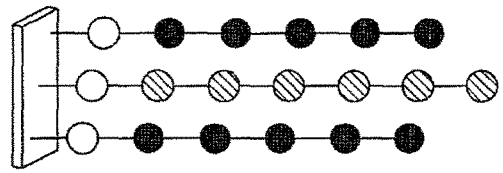 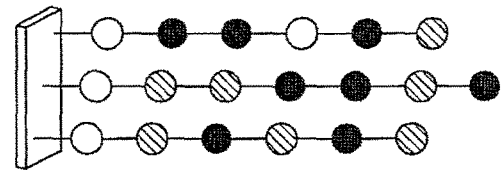
FIG.7a　　　　　　　　FIG.7b
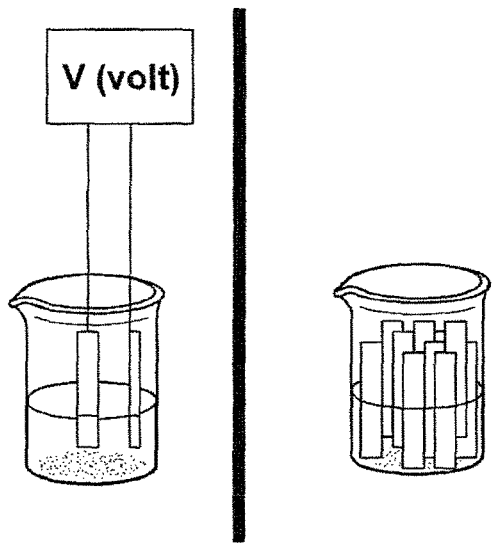
FIG.8a　　　　FIG.8b

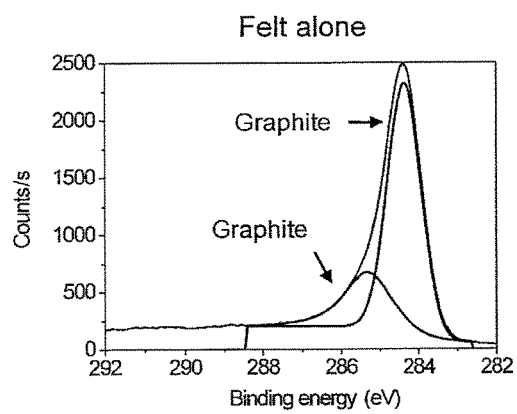
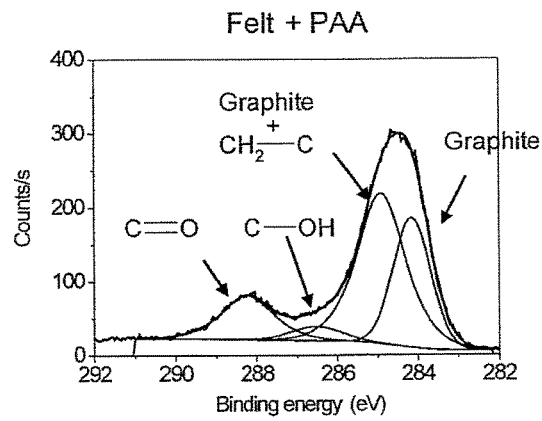
FIG.11a  FIG.11b
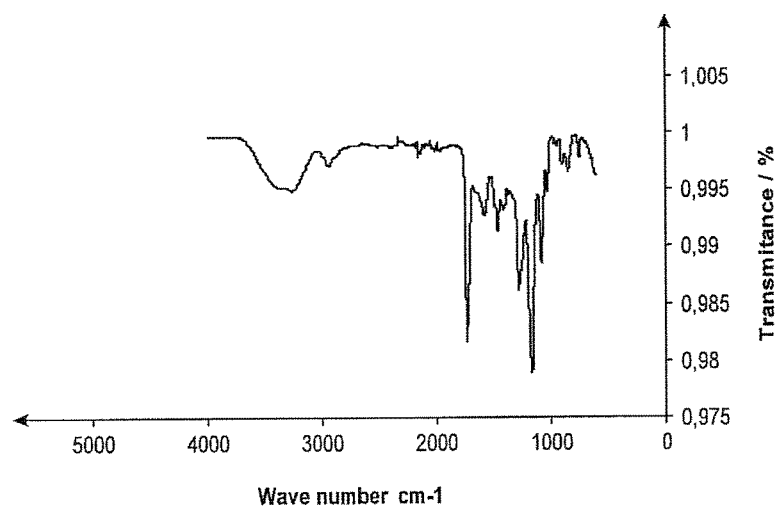
FIG.12

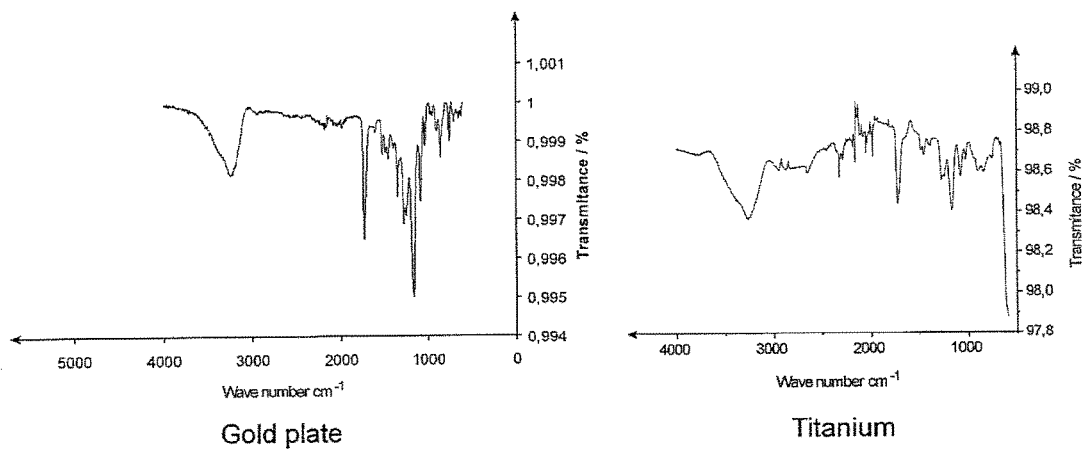
Gold plate
FIG.18a
Titanium
FIG.18b
FIG.19a
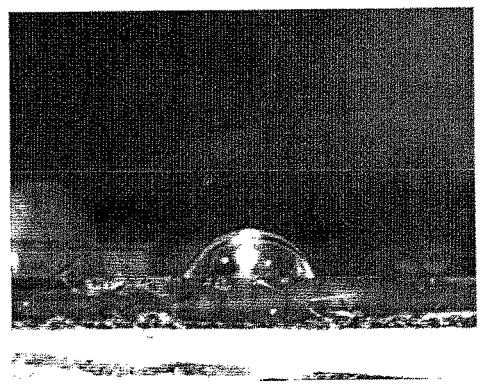
FIG.19b

METHOD FOR PREPARING AN ORGANIC FILM AT THE SURFACE OF A SOLID SUPPORT UNDER NON-ELECTROCHEMICAL CONDITIONS, SOLID SUPPORT THUS OBTAINED AND PREPARATION KIT

TECHNICAL FIELD

This invention relates to the field of organic surface coatings, said coatings being in the form of organic films. It relates more specifically to the use of solutions appropriately selected to allow the simple and reproducible formation of organic films by coating on electrically- or non-electrically-conductive surfaces without using the conventional surface functionalisation techniques. This invention also relates to a method for preparing such organic coatings.

PRIOR ART

There are currently a number of techniques making it possible to produce organic thin films on substrates, each based on a suitable family or class of molecules.

The spin coating method does not require any particular affinity between the molecules deposited and the substrate of interest, which is also true of related techniques for forming coatings by dip coating or by spray coating. Indeed, the cohesion of the deposited film is essentially based on the interactions between the constituents of the film, which can, for example, be cross-linked after deposition so as to improve its stability. These techniques are very versatile, applicable to any type of surface to be covered, and very reproducible. However, they do not allow any effective grafting between the film and the substrate (it involves simple physisorption), and the thickness produced are difficult to estimate in particular for thinnest deposits (less than 20 nanometers). Moreover, the spin coating techniques allow for uniform deposits only when the surface to be coated is essentially planar (U.S. Pat. No. 7,119,030). The quality of the films obtained by spray coating techniques is related to the wetting of the surfaces by the sprayed liquid, since the deposit essentially becomes film-forming only when the drops coalesce. Thus, for a given polymer, there are generally only one or two organic solvents capable of giving satisfactory results in terms of thickness and deposit homogeneity.

Other techniques for forming an organic coating at the surface of a support, such as plasma deposition, described for example in the articles of Konuma M., "Film deposition by plasma techniques", (1992) Springer Verlag, Berlin, and Biederman H. and Osada Y., "Plasma polymerization processes", 1992, Elsevier, Amsterdam or the photochemical initiation are based on the same principle: generating, near the surface to be covered, unstable forms of a precursor, which evolve by forming a film on the substrate. While the plasma deposition requires no particular properties of its precursors, the photo-initiation necessitates the use of photosensitive precursors, the structure of which evolves under light irradiation. These techniques generally give way to the formation of adherent films, although it is usually impossible to discern whether this adhesion is due to a cross-linking of a film topologically closed around the object or to a real formation of bonds at the interface. Unfortunately, these methods require relatively complex and costly pre-treatments, the use of vacuum set-ups for the plasma methods such as plasma-enhanced chemical vapor deposition, irradiation, or the use of potentiostats for the electrochemical methods to which many connection problems are related.

Cataphoresis is a technique that is also suited for the coating of conductive surfaces with organic films. Cataphoresis or cationic electrodeposition makes it possible to coat metal parts using charged polymers and enables uniform films to be provided on conductive surfaces. This method does not apply to non-conductive parts and can be performed only using charged polymers that have already been pre-synthesized. Therefore, there is no growth of films during the use of the cataphoresis, but only deposition on the surface. In addition, the treatment requires the parts to be in direct contact with the cathode, as well as very strict monitoring the set of parameters of the cathodic bath, which must be complied with. The electrodeposited layer is insoluble, but lacks physical or chemical resistance, and therefore requires an additional baking step in order to acquire all of these properties. Moreover, this technique is unsuitable for small parts with a complex shape.

The self-assembly of monolayers is a very simple technique to implement (Ulman A., "An introduction to ultrathin organic films from Langmuir-Blodgett films to self-assembly", 1991, Boston, Academic Press). However, this technique requires the use of generally molecular precursors having an adequate affinity for the surface of interest to be coated. Then, there is the precursor-surface pair, such as sulfur compounds having an affinity for gold or silver, tri-halogenosilanes for oxides such as silica or alumina, and polyaromatics for graphite or carbon nanotubes. In each case, the formation of the film is based on a specific chemical reaction between a portion of the molecular precursor (the sulfur atom in the case of thiols, for example) and some "receptor" sites on the surface. A chemisorption reaction ensures the adhesion. Thus, at room temperature and in solution, films of molecular thickness (less than 10 nm) are obtained. However, while the pairs involving oxide surfaces give way to the formation of very solidly grafted films (the Si—O bond involved in the chemisorption of tri-halogenosilanes on silica is among the most stable in chemistry), this is not at all the case when considering metals or semiconductors without oxide. In these cases, the interface bond between the conductive surface and the monomolecular film is fragile. Thus, the self-assembled monolayers of thiols on gold desorb when they are heated to above 60° C., or in the presence of a suitable solvent at room temperature, or when they are placed in contact with an oxidizing or reducing liquid medium. Similarly, the Si—O—Si bonds are fragilized when they are in an aqueous or even a moist medium, in particular under the effect of heat.

The electrografting of polymers is a technique based on the initiation, then electrically induced polymerization, by chain propagation, of electroactive monomers on the surface of interest acting both as electrode and polymerization primer (Palacin, S., et al., "Molecule-to-metal bonds: Electrografting polymers on conducting surfaces.", Chemphyschem, 2004. (5)10: p. 1469-1481). The electrografting requires the use of precursors suitable for its mechanism of initiation by reduction and propagation, generally anionic because cathodically-initiated electrografting is often preferred, applicable on noble and non-noble metals (unlike the electrografting by anodic polarization, which is applicable only on noble or carbon substrates: graphite, vitreous carbon, boron-doped diamond). The "depleted vinyl" molecules, i.e. bearing electroattractive functional groupings, such as acrylonitriles, acrylates and vinyl-pyridines, are particularly suitable for this method, which allows for numerous applications in the microelectronics or biomedical field. The adherence of these electrografted films is ensured by a carbon-metal covalent bond (G. Deniau et al., "Carbon-to-metal bonds: electroreduction of 2-butenenitrile" Surf. Sci. 2006, 600, 675).

According to this electrografting technique, polymerization is indispensable to the formation of the carbon/metal interface bond: it was indeed shown (G. Deniau et al., "Coupled chemistry revisited in the tentative cathodic electropolymerization of 2-butenenitrile.", Journal of Electroanalytical Chemistry, 1998, 451, 145-161) that the electrografting mechanism involves an electro-reduction of the monomer in the immediate vicinity of the surface, to yield to an unstable anion radical capable of being covalently grafted by its radical termination on the electrode. The grafted anion thus obtained, if it was not in the immediate vicinity of the polymerizable molecules, would desorb and return to the solution (op. cit.). In competition with this desorption reaction, the addition reaction (Michael addition) of the charge of the first anion chemisorbed on a free monomer provides a second means of stabilizing the reaction intermediary: the product of this addition again yields a grafted anion, where the charge is, however, "away" from the surface, which contributes to the stabilization of the adsorbed structure. This dimer anion can itself again be added to a free monomer, and so on, each new addition providing additional stability by relaxing the polarized surface/charge repulsion, which means that the bonding interface of the first anion radical, which is temporary, becomes stable to the extent that polymerization occurs.

Among the various techniques mentioned above, electrografting is the only technique that makes it possible to produce grafted films with a specific control of the bonding interface. Indeed, the only technique making it possible to graft polymer films resulting from vinyl monomers activated on surfaces, which are necessarily conductive, consists of electrically initiating the polymerization reaction from the surface via a potentiostat, followed by a growth of chains, monomer-by-monomer, requiring the use of an electrochemical cell with a cathode and an anode, as well as an application of a voltage at the terminals thereof.

Ortiz et al. (Electrochemical modification of a carbon electrode using aromatic diazonium salts. 2. Electrochemistry of 4-nitrophenyl modified glassy carbon electrodes in aqueous media. Journal of Electroanalytical Chemistry, 1998. 455(1-2)) described the grafting of diazonium salts synthesized in situ in the aqueous acid phase by electrochemical initiation. The international patent application WO 03 018212 describes, in particular, a method for grafting and growing an organic conductive film on an electrically conductive surface, the grafting and the growth being performed simultaneously by electroreduction of a diazonium salt that is a precursor of said organic film.

However, no technical solution has been proposed for producing organic coatings grafted on any type of surface, in non-electrochemical conditions and without any particular pre-treatment technique.

DESCRIPTION OF THE INVENTION

This invention makes it possible to solve the disadvantages of the prior art methods and coatings, and differs from the latter in that it makes it possible to perform the grafting of organic polymer or copolymer films in the absence of an electric voltage. The method proposed thus makes it possible to graft films onto surfaces of various types, and its application is not limited to electrically conductive or semiconductive surfaces.

This invention relates to a method for preparing an organic film at the surface of a solid support, characterized in that it includes a step of contacting said surface with a liquid solution comprising:
 at least one solvent,
 at least one adhesion primer,
 under non-electrochemical conditions, and enabling the formation of radical entities based on the adhesion primer.

In the sense of this invention, by "organic film", we mean any film of an organic nature, resulting from a plurality of units of organic chemical species, covalently bound to the surface of the support on which the method of the invention is carried out. It particularly concerns films covalently bound to the surface of a support and including at least one layer of structural units of similar types, according to the thickness of the film, with its cohesion being ensured by the covalent bonds that develop between the different units.

The solvent may either be protic or aprotic, advantageously, the adhesion primer is soluble in the solvent.

By "protic solvent", we mean, in the context of this invention, a solvent that comprise at least one hydrogen atom capable of being released in proton form.

The protic solvent is advantageously chosen from the group constituted by water, deionized water, distilled water, acidified or not, acetic acids, hydroxylated solvents such as methanol and ethanol, low-molecular-weight liquid glycols such as ethyleneglycol, and their mixtures. In a first alternative, the protic solvent used in the context of this invention is constituted only by a protic solvent or by a mixture of various protic solvents. In another alternative, the protic solvent or the mixture of protic solvents can be used in a mixture with at least one aprotic solvent, provided that the resulting mixture has the characteristics of a protic solvent. Acidified water is the preferred protic solvent and, more specifically, distilled or deionized acidified water.

By "aprotic solvent", we mean, in the context of this invention, a solvent that is not protic. Such a solvent is not able to release or accept one hydrogen in the form of a proton under non-extreme conditions. The aprotic solvent is advantageously chosen from the group constituted by dimethylformamide (DMF), acetone and dimethyl sulfoxide (DMSO).

The term "adhesion primer", in the context of this invention, refers to any organic molecule capable, under certain conditions, of being chemisorbed at the surface of a solid support by a radical reaction such as radical chemical grafting. Such molecules comprise at least one functional group capable of reacting with a radical and also a reactive function with respect to another radical after chemisorption. These molecules are thus capable of forming a polymer-type film after the grafting of a first molecule to the surface of a support, then a reaction with other molecules present in its environment.

The term "radical chemical grafting" refers in particular to the use of molecular entities having a non-paired electron for forming covalent bonds with a surface of interest, said molecular entities being generated independently of the surface on which they are intended to be grafted. Thus, the radical reaction leads to the formation of covalent bonds between the surface concerned and the derivative of the grafted adhesion primer, then between a grafted derivative and molecules present in its environment.

By "derivative of the adhesion primer", we mean, in the context of this invention, a chemical unit resulting from the adhesion primer, after the latter has reacted by radical chemical grafting, in particular with the surface of the solid support, or with another radical, implemented in the context of this invention. It is clear for a person skilled in the art that the reactive function with respect to another radical after chemisorption of the derivative of the adhesion primer is different from the function involved in the covalent bond in particular with the surface of the solid support.

The adhesion primer is advantageously a cleavable aryl salt chosen from the group constituted by aryl diazonium salts, aryl ammonium salts, aryl phosphonium salts and aryl sulfonium salts. In these salts, the aryl group is an aryl group that can be represented by R as defined below.

Among the cleavable aryl salts, the compounds of the following formula (I) can be cited in particular:

  (I)

in which:
A represents a monovalent anion, and,
R represents an aryl group.

As the aryl group of the cleavable aryl salts, and in particular of the above-mentioned compounds of formula (I), we can advantageously cite aromatic or heteroaromatic carbon structures, possibly mono- or polysubstituted, constituted by one or more aromatic or heteroaromatic cycles each comprising 3 to 8 atoms, the heteroatom(s) being N, O, P or S. The substituent(s) can contain one or more heteroatoms, such as N, O, F, Cl, P, Si, Br or S as well as alkyl groups in $C_1$ to $C_6$, in particular.

Within the cleavable aryl salts, and in particular the above-mentioned compounds of formula (I), R is preferably chosen from the aryl groups substituted by electron-attracting groups such as $NO_2$, COH, ketones, CN, $CO_2H$, $NH_2$, esters and halogens. The aryl-type R groups especially preferred are the nitrophenyl and phenyl radicals.

Within the above-mentioned compounds of formula (I), A can in particular be chosen from inorganic anions such as halides, for example $I^-$, $Br^-$ and $Cl^-$, halogen borates such as tetrafluoroborate and organic anions such as alcoholates, carboxylates, perchlorates and sulfonates.

As compounds of formula (I), it is particularly advantageous to use a compound chosen from the group constituted by phenyldiazonium tetrafluoroborate, 4-nitrophenyldiazonium tetrafluoroborate, 4-bromophenyldiazonium tetrafluoroborate, 4-aminophenyldiazonium chloride, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)diazenyl]benzenediazonium sulfate, 9,10-dioxo-9,10-dihydro-1-anthracenediazonium chloride, 4-nitronaphthalenediazonium tetrafluoroborate and naphthalenediazonium tetrafluoroborate.

It is preferable for the adhesion primer to be soluble in the solvent used. In the sense of the invention, an adhesion primer is considered to be soluble in a given solvent if it remains soluble until reaching a concentration of 0.5 M, i.e. the solubility is at least equal to 0.5 M under normal conditions of temperature and pressure (NTP). Solubility is defined as the analytical composition of a saturated solution, expressed in terms of the proportion of a given solute in a given solvent; it can be expressed in particular in molarity. A solvent containing a given concentration of a compound will be considered to be saturated, when the concentration is equal to the solubility of the compound in this solvent. The solubility can be finite or infinite. In the latter case, the compound is soluble in any proportion in the considered solvent.

The amount of adhesion primer present in the solution used, according to the method of the invention, can vary as desired by the experimenter. This amount is related in particular to the desired thickness of the organic film as well as the amount of adhesion primer that can possibly and reasonably be integrated in the film. Thus, to obtain a film grafted on the entire surface of the solid support in contact with the solution, it is necessary to use a minimum amount of adhesion primer, which can be estimated by molecular size calculations. According to a particularly advantageous embodiment of the invention, the adhesion primer concentration in the liquid solution is between around $10^{-6}$ and 5 M, and preferably between $5.10^{-2}$ and $10^{-1}$ M. A so-called "primer" layer is formed when the surface is coated with at least one film of monomolecular thickness derived from the adhesion primer and in particular derived from diazonium. The organic film can thus be constituted solely by a primer layer. It is of course possible to use any means of analysis to test the presence of the primer layer and determine its thickness; such means can in particular be infrared spectrometry (IR) measurements or X photoelectron spectroscopy (XPS) and ultraviolet (UV) measurements depending on the atoms and chemical groups present on the adhesion primer used.

When the solvent is a protic solvent, and advantageously, if the adhesion primer is an aryl diazonium salt, the pH of the solution is less than 7, typically less than or equal to 3. It is recommended to work with a pH between 0 and 3. If necessary, the pH of the solution can be adjusted to the desired value using one or more acidifying agents well known to a person skilled in the art, for example using organic or mineral acids such as hydrochloric acid, sulfuric acid, and so on.

The adhesion primer can either be introduced in the liquid solution as defined above, or be prepared in situ in the latter. Thus, in a particular embodiment, the method according to this invention comprises a step of preparing the adhesion primer, in particular when it is an aryl diazonium salt. Such compounds are generally prepared from arylamines, which may comprise a plurality of amine substituents, by reaction with $NaNO_2$ in an acidic medium. For a detailed description of the experimental modes that can be used for such an in situ preparation, a person skilled in the art can refer to the open literature [D. Belanger et al. Chem. Mater. 18 (2006) 4755-4763]. The grafting will then preferably be performed directly in the solution for preparation of the aryl diazonium salt.

By "non-electrochemical conditions", we mean, in the context of this invention, in the absence of electric voltage. Thus, the non-electrochemical conditions are conditions which allow the formation of radical entities from the adhesion primer, in the absence of the application of any voltage to the surface of the solid support or in the liquid solution. These conditions involve parameters such as, for example, temperature, nature of solvent, presence of a particular additive in the solution, agitation, while the electric current does not intervene during the formation of radical entities. The non-electrochemical conditions allowing for the formation of radical entities are numerous, and this type of reaction is known and studied in detail in the prior art (Rempp & Merrill, Polymer Synthesis, 1991, 65-86, Huthig & Wepf).

It is thus possible, for example, to adjust the thermal, kinetic, chemical, photochemical or radiochemical environment of the adhesion primer so as to destabilize it so that it will form a radical entity. It is of course possible to simultaneously adjust a plurality of these parameters.

The thermal environment is based on the temperature of the solution. It is easy to control using heating methods normally used by a person skilled in the art. The use of a thermostatically controlled environment is of particular interest when it allows for precise control of the reaction conditions.

The kinetic environment corresponds essentially to the agitation within the solution. In this case, it is not the agitation of molecules in itself (elongation of bonds, etc.), but the overall movement of the molecules within the solution. Vigorous agitation, for example using a magnetic stirring bar or ultrasound, makes it possible in particular to provide kinetic energy in the solution and thus destabilize the adhesion primer so that it forms radicals.

Finally, the action of various types of radiation, such as electromagnetic radiation, γ radiation, UV rays, or electron or ion beams can also adequately destabilize the adhesion primer so that it forms radicals. The wavelength used will be dependent on the primer used, for example 306 nm for 4-hexylbenzenediazonium.

In the context of this invention, the non-electrochemical conditions allowing for the formation of radical entities are typically chosen from the group constituted by thermal, kinetic, photochemical, or radiochemical conditions and combinations thereof. Advantageously, the non-electrochemical conditions allowing for the formations of radical entities are chosen from the group constituted by thermal, chemical, photochemical or radiochemical conditions and combinations thereof with one another and/or with kinetic conditions. The non-electrochemical conditions are more specifically chemical conditions.

In the context of chemical conditions, it is envisaged to add one or more chemical initiator to the liquid solution as defined above. Indeed, it is also possible to adjust the chemical environment of the adhesion primer by adding one or more chemical initiator to the liquid solution. The presence of chemical initiator is often combined with non-chemical environmental conditions, as mentioned above. Typically, a chemical initiator of which the stability is lower than that of the adhesion primer under the chosen environmental conditions will evolve in an unstable form, which will act on the adhesion primer and cause the formation of a radical entity based on the latter. It is also possible to use chemical initiator of which the action is not essentially related to the environmental conditions, and which are efficient on a wide range of thermal or kinetic conditions, for example. The initiator will be chosen according to the solvent used for the reaction, advantageously the initiator will be soluble in the solvent.

There are numerous chemical initiators for radical polymerization. Three major types can be distinguished on the basis of the environmental conditions used:

thermal initiators, the most common of which are peroxides or azo compounds. Under the effect of heat, these compounds dissociate into free radicals; in this case, the reaction is performed at a minimum temperature corresponding to that necessary for the formation of radicals based on the initiator. This type of chemical initiator is generally used specifically within a certain temperature interval, according to their decomposition kinetics;

photochemical or radiochemical initiators, which are excited by the radiation triggered by irradiation (usually UV, but also γ radiation or electron beams) allow for the production of radicals by more or less complex mechanisms. $Bu_3SnH$ and $I_2$ belong to photochemical or radiochemical initiators;

essentially chemical initiators, which act rapidly and under normal conditions or temperature and pressure on the adhesion primer so as to allow it to form radicals. Such initiators generally have an redox (for reduction/oxidation reaction) potential that is less than the reduction potential of the adhesion primer used under the reaction conditions. Depending on the type of initiator, it can thus be a metal, generally in a finely divided form, such as metallic wool (also more commonly called "steel wool") or metal filings, reductive, such as iron, zinc, nickel, or metal salts such as a metallocene, a reductive compound such as hypophosphorous acid or ascorbic acid, or have an organic or inorganic base in proportions sufficient to allow for destabilization of the adhesion primer; a pH greater than or equal to 4 is generally sufficient. Radical reservoir-type structures, such as polymeric matrices irradiated beforehand by an electron beam or by a heavy ion beam and/or by all irradiation means cited above, can also be used as chemical initiators for destabilizing the adhesion primer and leading to the formation of radical entities based on the primer.

The liquid solution implemented in the method according to the invention advantageously also includes one or more chemical primer(s) chosen from:

a reducing metal in a finely divided form, as defined here,
a metallocene,
an organic or inorganic base in proportions sufficient for the pH of the liquid solution to be greater than or equal to 4,
a pre-irradiated polymeric matrix, as defined here.

Among the primers capable of being used in the context of the invention, and in particular when the adhesion primer is a cleavable aryl salt such as a diazonium aryl salt, it is possible in particular to cite halogenated initiators such as iodine, α-halogenoalkyls having aryl, allyl, carbonyl or sulfonyl groups, polyhalogenated compounds such as $CCl_4$ or $CHCl_3$, compounds having highly-labile covalent bonds with halogens and generally corresponding to bonds established between a heteroatom, such as N, S or O, and a halogen, potassium persulfate ($K_2S_2O_8$) azobis(isobutyronitrile), peroxidated compounds such as benzoyl peroxide, tert-butyl peroxide, cumyl peroxide, tert-butyl perbenzoate, tert-butyl hydroperoxide, and finely-divided reductive metals such as iron, zinc, nickel, preferably in the form of filings, fine particles or metallic wool fibers, metal salts, in particular, metallocenes such as ferrocene, irradiated polymeric matrices and in particular matrices of polymers chosen from polyurethanes, polyolefines, polycarbonates, and polyethylene terephthalates, which polymers are advantageously fluorinated or even perfluorinated.

The amount of initiator will be chosen according to the process conditions used. Generally, the amounts are between 5 and 20% mass of monomers, and typically around 10%. Thus, for example, when the adhesion primer is an aryl diazonium salt, it is possible to use, as the initiator, iron filings, of which the diameter of the particles is between 50 and 250 μm. It is also possible to use iron or steel wool, which will generally be (according to degree of fineness) fine (0), extra fine (00) or super fine (000). More specifically, the diameter of the wool fibers will be less than or equal to $3.81 \times 10^{-2}$ mm and typically greater than $6.35 \times 10^{-3}$ mm. Alternatively, it is possible to use basic conditions so that the pH of the solution is high enough to cause destabilization of the adhesion primer in the form of radicals.

It is also possible to use matrices irradiated in various forms such as membranes. Typically, such a membrane will have a thickness in the micrometer range, generally between 1 and 100 µm, in particular between 5 and 50 µm, and, more specifically, close to 9 µm. It will advantageously be a polyvinylidene fluoride (PVDF). In particular, it is possible to use a polyvinylidene fluoride (PVDF) membrane irradiated with electrons. The irradiation dose is generally between 10 and 200 kGy, and more specifically 100 kGy for PVDF. Such a membrane can, for example, have dimensions of 1 cm×2 cm×9 µm, i.e. a total surface of around 4 $cm^2$.

It is also possible to use a pre-irradiated polymeric matrix in the form of:
granules, for example with a mean diameter of 200 µm to 1 cm,
microparticles, for example from 1 µm to 100 µm in diameter, or
nanoparticles, generally from 5 nm to 900 nm in diameter.

Indeed, the decrease in the diameter of the particles makes it possible to increase the specific contact surface and therefore the quantity of radicals at the surface with respect to the same mass of irradiated polymeric material in membrane form. Typically, the specific contact surface of the irradiated matrix available will be much lower than that of the surface of the solid support on which the grafting is to be performed.

The irradiation of a polymeric matrix can consist of subjecting said matrix to an electron beam (also called electronic irradiation). More specifically, this step can consist in scanning the polymeric matrix with an accelerated electron beam, which beam can be emitted by an electron accelerator (for example, a Van de Graaf accelerator, 2.5 MeV). In the case of irradiation with an electron beam, the energy deposition is homogeneous, which means that the free radicals created by this irradiation will be distributed uniformly at the surface and in the volume of the matrix.

The irradiating step of the polymeric matrix can also consist in subjecting said matrix to a heavy ion bombardment. It is specified that "heavy ions" are ions of which the mass is greater than that of carbon. Generally, these are ions chosen from krypton, lead and xenon.

Whether in the context of the first embodiment or the second embodiment described above, the irradiation creates free radicals in the material constituting the matrix, which creation of free radicals is a consequence of the transfer of irradiation energy to said material.

The radicals present in such an irradiated matrix can be trapped in crystallites, so as to prolong the lifetime of the matrix in its irradiated form. It is therefore recommended to use matrices comprising crystallites, and, preferably, between 30% and 50%, and generally 40% v/v of crystallites. Thus, for example, polyvinylidene fluoride (PVDF) is semi-crystalline (it is generally 40% crystalline and 60% amorphous) and can exist in a plurality of crystalline phases, $\alpha$, $\beta$, $\gamma$ and $\delta$ constituted by the planar or helical association of chains. The phases $\alpha$ and $\beta$ are the most common. PVDF is a thermoplastic polymer that can therefore be melted, then molded. Thus, PVDF primarily in the $\alpha$ phase is generally obtained by cooling from the molten state, for example after simple extrusion. PVDF primarily in the $\beta$ phase is generally obtained by stretch molding of $\alpha$-phase PVDF, at temperature below 50° C. It is recommended to use for the present invention PVDF comprising primarily the $\beta$ phase because the crystallinity is greater in this case.

To increase the quantity of radicals accessible at the surface of the irradiated polymers in the various forms described above, the specific contact surface of the polymeric materials with the solution can advantageously be increased by making them micro or nanoporous. To obtain this type of material, the irradiation step can be performed as follows:
irradiation of the polymeric matrix by heavy ions;
chemical exposure, generally by hydrolysis, of the latent traces created along the heavy ions tracks, resulting in open channels;
electronic irradiation of said open channels.

The chemical exposure consists in placing the matrix in contact with a reagent capable of hydrolyzing the latent traces, so as to form hollow channels in their place.

According to this particular embodiment, after the irradiation of the polymeric matrix by heavy ions, the generated latent traces exhibit short chain polymers formed by splitting of the existing chains when the ion passes through the material during irradiation. In these latent traces, the speed of hydrolysis during the exposure is greater than those of the non-irradiated parts. It is thus possible to perform selective exposure.

The reagents capable of ensuring the exposure of the latent traces are dependent on the material constituting the matrix. Thus, the latent traces can in particular be treated by a highly basic and oxidizing solution, such as a KOH 10N solution in the presence of $KMnO_4$ at 0.25% by weight at a temperature of 65° C., when the polymeric matrix is, for example, constituted by polyvinylidene fluoride (PVDF), poly(VDF-co-HFP) (vinylidene-co-hexafluoropropene fluoride), poly(VDF-co-TrFE) (vinylidene-co-trifluoroethylene fluoride), poly(VDF-co-TrFE-co-ChloroTrFE) (vinylidene-co-trifluoroethylene-co-monochlorotrifluoroethylene fluoride) and other perfluorinated polymers. A treatment with a basic solution, optionally combined with a sensitization of the traces by UV, can be sufficient, for example, for polymers such as polyethylene terephthalate (PET) and polycarbonate (PC). The treatment leads to the formation of hollow cylindrical pores, the diameter of which can be modulated according to the duration of the treatment with the basic and oxidizing solution. The irradiation will generally be performed so that the resulting membrane has between $10^6$ and $10^{11}$ traces per $cm^2$. It will typically be between $5.10^7$ and $5.10^{10}$, more specifically on the order of $10^{10}$ for membranes. Other information concerning reagents and the process conditions that can be used for chemical exposure according to the material constituting the matrix can be found in Rev. Mod. Phys., Vol. 55, N° 4, October 1983, p. 925.

After that exposure step, the electron irradiation is performed to cause the formation of free radicals on the wall of the channels, with the implementation in this case being similar to that described for electron irradiation in general. The beam is generally oriented in a direction normal to the surface of the membrane, and the surface thereof is scanned homogeneously. The irradiation dose generally ranges from 10 to 200 kGy, and will typically be close to 100 kGy for PVDF. The dose is generally such that it is greater than the "gel dose". The latter corresponds to the dose at which the recombinations between radicals are promoted, leading to the creation of interchain bonds leading to the formation of a three-dimensional (or cross-linked) network, i.e. the formation of a gel. Thus, using a dose greater than the "gel dose" generates cross-linking within the matrix, thus enabling the mechanical properties of the end polymer to be improved in the same single step that generates the free radicals.

As a non-limiting example, the specific contact surface of a 2-$cm^2$ PVDF membrane with a thickness of 9 µm increases from around 4 $cm^2$ to around 60 $cm^2$ after irradiation-induced creation of $10^{10}$ pores per $cm^2$ with an average diameter of 10 nm, thus enabling 15 times more radicals present at the surface than for the same non-porous membrane.

The liquid solution according to the present invention can further comprise at least one surfactant as hereinafter described and disclosed.

The solid support of which the surface is treated according to the method of the invention can be of any type. Indeed, it is at the surface of the sample in contact with the solution that the radical grafting reaction will take place. Thus, the surface of the solid support to be treated in accordance with the method according to this invention typically has at least one atom capable of being involved in a radical reaction. The solid support can be electrically conductive or non-conductive. The solid support can have a more or less large surface and a variable roughness. The method is applicable to samples of nanometric or metric size. Thus, for example, the method can be applied to surfaces of nano-objects such as nanoparticles or nanotubes, typically carbon, or to more complex devices.

The invention is applicable to a wide variety of surfaces of interest, of which the composition may be chosen from a wide variety of materials. Indeed, the method uses grafting of a purely radical type, and does not require the surface to have specific limiting characteristics such as high conductivity. Thus, the surface can be organic or non-organic, and can also be of a composite nature and have a non-uniform composition. Any surface having one or more atom(s) or atom group (s) capable of being involved in a radical addition or substitution reaction, such as CH, C=C, carbonyls (ketone, ester, acid, aldehyde), OH, ethers, amines, or halogens, such as F, Cl and Br, is in particular concerned by this invention.

The solid support can have an inorganic surface that can be chosen from conductive materials such as metals, noble metals, oxidized metals, transition metals, metal alloys and, for example, Ni, Zn, Au, Pt, Ti, and steel. The inorganic surface can also be chosen from semiconductive materials such as Si, SiC, AsGa, Ga, and so on. It is also possible to apply the method to solid supports having a non-conductive surface such as non-conductive oxides such as $SiO_2$, $Al_2O_3$ and MgO. More generally, the inorganic surface of the solid support can be constituted, for example, by an amorphous material such as glass, generally containing silicates, or even ceramic, as well as crystalline such as diamond.

The solid support can have an organic surface. As an organic surface, it is possible to cite natural polymers, such as latex or rubber, or artificial polymers such as derivatives of polyamide or polyethylene, and in particular polymers having π-type bonds such as polymers with ethylene bonds, carbonyl groupings and imine. It is also possible to apply the method to more complex organic surfaces, such as surfaces including polysaccharides, such as cellulose for wood or paper, artificial or natural fibers, such as cotton or felt, or fluoro-polymers such as polytetrafluoroethylene (PTFE). It is of course possible to apply the method to a surface corresponding to a primer layer as defined above.

The solid support and/or the surface of the solid support implemented in the context of this invention are advantageously constituted by a material chosen from the group constituted by metals, wood, paper, cotton, felt, silicon, carbon nanotubes, fluoro-polymers and diamond.

According to a specific embodiment, the surface of the solid support on which the organic film is to be formed is equipped with a mask that covers it at least partially and that insulates it from the liquid solution. The mask typically corresponds to a physical entity that is neither grafted to the surface nor covalently bonded thereto. It can in particular be a bulk material or a thin film of material, typically several angstrom to several microns, generally organic, deposited on the surface.

The mask makes it possible to locally "mask" the chemical reactivity of the surface with regard to the radicals generated during the process and thus leads to the controlled formation of a film solely on the portions of the surface exposed to the solution, with the areas of the surface of the support equipped with the mask being protected from the formation of the organic film. The surface of the solid support contacted with the liquid solution as defined above thus typically comprises at least one area covered with a mask. After removal of the mask at the end of the operation, the surface that was protected, unlike the surface that was not equipped with a mask, does not comprise a grafted film.

The mask will preferably be constituted by a thin layer of inorganic or organic material acting as a layer of lower cohesion that can easily be removed under gentle conditions. A layer of material is considered as such insofar as it does not require the use of extreme conditions detrimental to the grafted film. Typically, the gentle conditions correspond to a simple chemical wash, generally performed with a solvent, an ultrasound treatment in a solvent or an increase in temperature. It is of course desirable for the mask not to be soluble in the solvent present in the liquid solution, i.e. used in the grafting reaction. Thus, it is recommended to use a mask that has a higher affinity for the surface than it has for the reaction solvent.

The material constituting the mask can thus be chosen from a wide range of materials. It will generally be chosen according to the nature of the solid support. Advantageously, the mask is composed of alkylthiols, in particular long-chain alkylthiols, often at $C_{15}$-$C_{20}$ and typically at $C_{18}$.

The mask can react with the radicals generated during the process. In every case, it is possible to remove it so as to expose the areas of the solid support surface protected from the grafting on which no organic film will be observed (similar to the so-called "lift-off" methods in lithography).

The mask deposition techniques are known to a person skilled in the art. They can involve, in particular, coating, vapor deposition or immersion. Thus, the mask, in the form of a thin layer of material, can be deposited, for example, by direct drawing with a felt (pencil-type) pen impregnated with the chosen material. On glass, it is possible, for example, to use, as a mask, a marker such as those provided for paper, or else greasy substance like wax. It is also possible to use the so-called microcontact printing method. This technique can be applied in particular if the surface of the solid support has a strong affinity for sulfur atoms, such as a gold surface. In this case the mask will generally be composed of alkylthiols, in particular long-chain alkylthiols (so-called microcontact printing techniques), often at $C_{15}$-$C_{20}$ and typically at $C_{18}$. More generally, the classic lithography techniques can be used to form the mask: spin-coating, then insulation through a physical mask or via a light beam or controllable particles, then exposure.

According to another embodiment of this invention, the method for preparing an organic film at the surface of a solid support is characterized in that it includes a step of contacting said surface with a liquid solution comprising:
at least one solvent,
at least one adhesion primer,
at least one radically polymerizable monomer, said monomer being different from the adhesion primer, under non-electrochemical conditions, and enabling the formation of radical entities based on the adhesion primer.

Everything described above concerning the adhesion primer and the possibilities for action on its environment, the solvent, either protic or aprotic and in which the monomer is advantageously soluble, the support, the possible chemical primers and a possible mask, also applies to the embodiment described above.

The radically polymerizable monomers implemented in the context of this invention correspond to monomers capable of polymerizing under radical conditions after initiation by a radical chemical entity. Typically, it involves molecules comprising at least one ethylene-type bond. The vinyl monomers, in particular the monomers described in the patent application FR 05 02516 as well as in patent FR 03 11491, are particularly concerned.

According to a particularly advantageous embodiment of the invention, the vinyl monomer(s) is (are) chosen from the monomers of the following formula (II):

in which the $R_1$ to $R_4$ groups, identical or different, represent a non-metallic monovalent atom such as a halogen atom, a hydrogen atom, a saturated or unsaturated chemical group, such as an alkyl or aryl group, a —COOR$_5$ group in which $R_5$ represents a hydrogen atom or an alkyl group in $C_1$-$C_{12}$ and preferably $C_1$-$C_6$, a nitrile, a carbonyl, an amine or an amide.

The above-mentioned compounds of formula (II) are in particular chosen from the group constituted by vinyl acetate, acrylonitrile, methacrylonitrile, methyl methacrylate, ethyl methacrylate, butyl methacrylate, propyl methacrylate, hydroxyethyl methacrylate, hydroxypropyl methacrylate, glycidyl methacrylate and their derivatives; the acrylamides and in particular the aminoethyl, propyl, butyl, pentyl and hexyl acrylamides and in particular methacrylamides, the cyanoacrylates, the di-acrylates and di-methacrylates, the tri-acrylates and tri-methacrylates, the tetra-acrylates and tetra-methacrylates (such as tetramethacrylate pentaerythritol), styrene and its derivatives, parachloro-styrene, pentafluoro-styrene, N-vinyl pyrrolidone, 4-vinyl pyridine, 2-vinyl pyridine, the vinyl halides, acryloyl or methacryloyl, di-vinylbenzene (DVB), and more generally the vinyl cross-linking agents based on acrylate, methacrylate and their derivatives.

According to a specific embodiment, the monomers used are those that, unlike the components that are soluble in any proportion in the solvent considered, are soluble only to a certain proportion in the solvent, i.e. the value of their solubility in said solvent is finite. The monomers that can be used in accordance with the method of the invention can thus be chosen from the compounds of which the solubility in the solvent is finite, and more specifically less than 0.1 M, more preferably between $5.10^{-2}$ and $10^{-6}$ M. Among such monomers, it is possible, for example, to cite butyl methacrylate and methyl methacrylate of which the solubility in water, measured under normal conditions of temperature and pressure, is respectively around $2.5.10^{-3}$ and $4.10^{-2}$ M. According to the invention, and unless otherwise indicated, the normal conditions of temperature and pressure (NTP) correspond to a temperature of 25° C. and to a pressure of $1.10^5$ Pa.

The invention also applies to a mixture of two, three, four or more monomers chosen from the monomers described above.

The amount of polymerizable monomers in the solution may vary as desired by the experimenter. This amount can be greater than the solubility of the monomer considered in the solvent used, and can be, for example, 18 to 40 times the solubility of said monomer in the solution at a given temperature, generally room temperature or the temperature of the reaction. Under these conditions, it is advantageous to use means allowing for the dispersion of the monomer molecules in the solution, such as a surfactant or ultrasound.

When the solvent is protic, according to a specific embodiment of the invention, it is recommended to add a surfactant when the monomer has a solubility of less than $5.10^{-2}$ M. A precise description of the surfactants that can be used in the context of the invention is provided in patent applications FR 06 01804 and FR 06 08945 and in the literature (Deniau et al., Chem. Mater. 2006, 18, 5421-5428), to which a person skilled in the art can refer. A single surfactant or a mixture of a plurality of surfactants can be used. The amount of surfactant(s) necessary is variable; it must in particular be enough to allow for the formation of the organic film. The minimum amount of surfactant(s) can easily be determined by sampling solutions with identical compositions but variable surfactant concentrations. In general, the surfactant concentration is such that the critical micellar concentration (CMC) is reached and the formation of micelles can thus take place. The CMC of a surfactant can be determined by methods known to a person skilled in the art, for example, by measuring surface tensions. Typically, the surfactant concentration will be between 0.5 mM and around 5 M, preferably between 0.1 mM and around 150 mM. The recommended surfactant concentration is usually 10 mM.

The surfactants are molecules comprising a lipophilic portion (apolar) and a hydrophilic portion (polar). Among the surfactants that can be used according to the invention, the following can be cited in particular:

i) anionic surfactants of which the hydrophilic portion is negatively charged; the surfactant will preferably be an alkyl or an aryl sulfonate, sulfate, phosphate or sulfosuccinate associated with a counterion such as an ammonium ion ($NH_4^+$), a quaternary ammonium such as tetrabutylammonium, and the alkaline cations such as $Na^+$, $Li^+$ and $K^+$;

ii) cationic surfactants of which the hydrophilic portion is positively charged; they are preferably chosen from the quaternary ammoniums comprising at least one aliphatic chain in $C_4$-$C_{22}$ associated with an anionic counterion chosen in particular from the boron derivatives such as tetrafluoroborate or the halogenide ions such as $F^-$, $Br^-$, $I^-$ or $Cl^-$;

iii) zwitterionic surfactants, which are neutral compounds having formal unit electrical charges of opposite sign; they are preferably chosen from the compounds having an alkyl chain in $C_5$-$C_{20}$ generally substituted by a negatively charged function such as a sulfate or a carboxylate and a positively charged function such as an ammonium;

iv) amphoteric surfactants, which are compounds acting both as an acid or as a base according to the medium in which they are placed; these compounds can have a zwitterionic nature; amino acids are a specific example of this family, v) neutral surfactants (non-ionic): the surfactant properties, in particular hydrophilia, are provided by non-charged functional groupings such as an alcohol, an ether, an ester or an amide, containing heteroatoms such as nitrogen or oxygen; due to the low hydrophilic contribution of these functions, the non-ionic surfactant compounds are usually polyfunctional.

Charged surfactants can of course have a plurality of charges.

As anionic surfactants, it is for example possible to use tetraethylammonium paratoluenesulfonate, sodium dodecylsulfate, sodium palmitate, sodium stearate, sodium myristate, sodium di(2-ethylhexyl) sulfosuccinate, methyl benzene sulfonate and ethyl benzene sulfonate.

As cationic surfactants, it is possible for example to use tetrabutylammonium chloride, tetradecylammonium chloride, tetradecyltrimethyl ammonium bromide (TTAB), alkylpyridinium halogenides carrying an aliphatic chain and alkylammonium halogenides.

As zwitterionic surfactants, it is possible to use sodium N,N-dimethyldodecylammoniumbutanate, sodium dimethyldodecylammonium propanate and the amino acids.

As amphoteric surfactants, it is possible to use disodium lauroamphodiacetate, betaines such as alkylamidopropylbetaine or laurylhydroxysulfobetaine.

As non-ionic surfactants, it is possible to use polyethers such as polyethoxylated surfactants such as, for example, polyethyleneglycol laurylether (POE23 or Brij® 35), polyols (surfactants derived from sugars) in particular glucose alkylates such as, for example glucose hexanate.

Among the preferred surfactants according to the invention, it is possible to cite the anionic surfactants such as sulfonates, quaternary ammoniums and non-ionic surfactants such as polyoxyethylenes.

According to another embodiment of the invention, it is possible to use ultrasound to promote the solubilization of the monomer or to form a dispersion when the monomer is insoluble in the medium [R. Asami et al. Langmuir B, 2006, in press].

According to the provisions presented, the solubility of the monomer appears not to be an obstacle to the method owing to the use of technical means, such as vigorous agitation, which can be induced by ultrasound, which allow for the formation of a dispersion and/or an emulsion, for the liquid monomer(s). In the case of polymerizable monomer(s) not having an affinity for the solvent used, such as non-water soluble monomers, it is therefore advantageous for the solution to be in the form of an emulsion or a dispersion. It is also possible to switch from one family of solvent to the other and to consequently adapt the initiator.

In an alternative, particularly in the case of protic solvents, the method according to this invention includes a preliminary step in which the polymerizable monomer or the mixture of polymerizable monomers is dispersed or emulsified in the presence of at least one surfactant, or by ultrasound, before its mixture with the liquid solution including at least one protic solvent and at least one adhesion primer.

The method is generally carried out under gentle and non-destructive conditions either for the surface of the sample on which the film is to be grafted, or for the monomer that may be used. Thus, it is desirable to work under conditions in which the monomer does not deteriorate. In addition, the temperature of the reaction medium is limited by the solvent, which is preferably preserved in liquid form. The method is carried out between 0 and 100° C. and generally under normal conditions of temperature and pressure (NTP), depending on where the user is, often at around 25° C. at a pressure of around 1 atm.

The reaction time can be adjusted. Indeed, the adjustment of the time of exposure of the surface of the solid support to the solution makes it possible to vary the thickness of the film that is obtained. It is of course possible for the same type of surface to precisely calibrate the process conditions that the user considers to be optimal. The analysis means described in the examples below are particularly suitable for determining in particular the thickness of the film, its composition and, incidentally, the reaction time. It is, for example, possible to obtain films of which the thickness is between 2 nm and 200 nm causing the reaction time to vary between 1 and 15 minutes, for a diazonium salt concentration of $5.10^{-2}$ M, or a monomer concentration of 0.9 M and a diazonium salt concentration of $5.10^{-2}$ M.

In one alternative, and when taking advantage of the presence of a monomer different from the adhesion primer, the method according to the invention can include the following steps, consisting of:

a) adding at least one monomer to a solution containing at least one adhesion primer different from said monomer in the presence of at least one solvent and optionally at least one chemical initiator, b) placing the solution obtained in step (a) under non-electrochemical conditions allowing for the formation of radical entities based on the adhesion primer and possibly based on the chemical initiator, c) placing the surface of the solid support in contact with the solution of step (b).

In a second alternative of the method according to the invention, the latter can include the following steps, consisting of:

a') placing the surface of the solid support in contact with a solution containing at least one adhesion primer in the presence of at least one solvent, and possibly at least one chemical initiator and at least one monomer, b') placing the surface of the solid support in contact with the solution of step (a') under non-electrochemical conditions allowing for the formation of radical entities based on the adhesion primer and possibly based on the chemical initiator, c') possibly adding at least one monomer to the solution obtained in step (b').

In the second alternative of the method as defined above, it is possible to envisage the following three cases:

i. the monomers are not present in the solution of step (a') and are added only in step (c'). This case is particularly advantageous when the monomer used is relatively insoluble and in particular in an aqueous solution; when the monomer is non-water-soluble and the adhesion primer is diazonium salt. Thus, in step (c'), the monomer can be added to the solution in particular in the same solvent as that used in step (a') and advantageously in the form of an emulsion or a dispersion produced previously using ultrasound or surfactants.

ii. the monomers are present in the solution of step (a') and the method does not have a step (c'). This case applies in particular when the primer is a diazonium salt and when the monomer is water-soluble. The method according to the first alternative can also be used in this case.

iii. one portion of the monomers is present in the solution of step (a') and another portion of the monomers of the same or of a different type is added only in step (c').

As explained above, the adhesion primer can be introduced either to the solution(s) as is, or prepared in situ in the solution.

The method according to this invention advantageously comprises an additional step, prior to the grafting, of cleaning the surface on which the organic film is to be formed, in particular by brushing and/or polishing; an additional ultrasound treatment with an organic solvent such as ethanol, acetone or dimethylformamide (DMF) is even recommended.

According to specific provisions, it is possible to produce, using the method of this invention, organic films essentially of the statistical or sequential polymer type.

To prepare a sequential film, it is sufficient to prepare, as described above, a layer of a first polymer on the surface of a solid support, then to re-start the experiment by changing the type of the monomer in solution. It is thus possible to iteratively produce a alternate film of high quality (FIG. 1a). During each of the successive steps, the adhesion primer will be grafted on the surface at its contact and will allow for the growth of a film based on the monomer or monomers present in the solution. Between each of the grafting sequences, it is entirely possible to perform a cleaning of the surface obtained.

To obtain a statistical copolymer (FIG. 7b), it is sufficient to use monomers of different types in the solution. The exact composition of the film is, in this case, based on the reactivity of each of the monomers present.

The organic films obtained according to the methods described above are thus essentially polymeric or copolymeric, from a plurality of monomeric units of identical or different chemical species and/or adhesion primer molecules. The films obtained by the method of this invention are "essentially" of the polymer type insofar as the film also incorporates species resulting from the adhesion primer and not only the monomers present. An organic film in the context of this invention is in particular a film prepared from at least one type of polymerizable monomer, particularly radically polymerizable, and at least one type of adhesion primer. The organic film in the context of this invention advantageously has a monomer unit sequence in which the first unit is constituted by a derivative of the adhesion primer, and the other units are indifferently derived from adhesion primers and polymerizable monomers.

The thickness of the film is easy to estimate according to the method of this invention, as explained above. For each of the parameters, and on the basis of each of the reagents used, a person skilled in the art will be capable of iteratively determining the optimum conditions for obtaining a film of variable thickness. It is also useful to refer to the examples showing the invention and demonstrating that it is possible, for example, to produce films of which the thickness is between several nanometers and several hundred nanometers.

The method described above also makes it possible to obtain supports comprising functionalisable films. These typically correspond to films having, on their surface, chemical groups capable of reacting with another chemical group, typically outside of the film, to form ionic, covalent or hydrogen bonds. A group responding to this definition will be called a chemical functionalisation group (CFG) throughout the remainder of this document. Such groups generally correspond to groups comprising at least one covalent bond between a heteroatom and another element corresponding to a carbon, a hydrogen or another heteroatom. The heteroatom(s) are generally chosen from N, O, S, Cl, Br and Si. A person skilled in the art can in particular consult the international application WO 2004/005410, which describes a method involving the modification of the chemical functions of the films and which can easily be applied to the method of this invention.

A functionalisable film can thus comprise a CFG, which can in particular be chosen from the hydroxyl, thiol, azide, epoxide, azyridine, amine, nitrile, isocyanate, thiocyanate, nitro, amide, halogenide and carbonyl functions, such as carboxylic acids, aldehydes, ketones, acid halogenides, esters and active esters, and among the alkenes or the alkynes.

As an example of functionalisable films derived from a primer alone such as a diazonium salt, it is in particular possible to cite the films derived from primers, in this case diazoniums, presented in table 1 with their associated CFG.

TABLE 1

| Possible functionalisable group | Primer capable of being used |
|---|---|
| Amine or nitrogen function (capable of being used as an amine precursor) | 4-nitrophenyldiazonium tetrafluoroborate, 4-cyanophenyldiazonium tetrafluoroborate, 4-nitronaphthalenediazonium tetrafluoroborate |
| Nitrile and alcohol | 4-benzoylbenzenediazonium tetrafluoroborate, 2-methyl-4-[(2-methylphenyl)diazenyl]benzenediazonium sulfate, 9,10-dioxo-9,10-dihydro-1-anthracenediazonium chloride |
| Carboxylic acid and derivatives (ester, acid chlorides) | 4-carboxyphenyldiazonium tetrafluoroborate, 4-benzoylbenzenediazonium tetrafluoroborate, 4-phenylacetic acid tetrafluoroborate |
| Halogen | 4-bromophenyldiazonium tetrafluoroborate, 2-methyl-4-chlorophenyldiazonium chloride |

The use of a functionalisable film derived from a primer and a monomer allows for great latitude in the choice of functionalisable groups. On the one hand, it is possible to consider CFG groups carried by the primer as described above. On the other hand, it is in particular possible to use films prepared from vinyl monomers so as to obtain one or more groups associated with them and as shown in table 2.

TABLE 2

| Possible functionalisable group | Monomer capable of being used |
|---|---|
| Ester | vinyl acetate |
| Nitrile | methacrylonitrile, methyl methacrylate, ethyl methacrylate, butyl methacrylate, propyl methacrylate, di-acrylates and di-methacrylates, tri-acrylates and tri-methacrylates, tetra-acrylates and tetra-methacrylates (such as pentaerythritol tetramethacrylate) |
| Nitrile and alcohol | hydroxyethyl methacrylate, hydroxypropyl methacrylate |
| amide | acrylamides and in particular amino-ethyl, propyl, butyl, pentyl and hexyl methacrylamides |

TABLE 2-continued

| Possible functionalisable group | Monomer capable of being used |
| --- | --- |
| Nitrile and amide | cyanoacrylates |
| Carboxylic acid and derivatives | Acrylic acid, acryloyl chlorides and derivatives |
| Halogen | styrene and its derivatives (parachlorostyrene, pentafluorostyrene) |
| Double bonds | Vinyl cross-linking agents or cross-linking agents based on acrylate, methacrylate, and their derivatives |

A person skilled in the art is capable of choosing the type of film, in particular among the vinyl monomer films, to be used according to the CFG to be integrated in the film present on the support. It may be useful for a person skilled in the art to consult the international application WO 2004/005410.

Insofar as a CFG is not directly available to a person skilled in the art from the films that he/she is capable of preparing, it is of course possible to modify the CFGs of the film by means of one or more simple chemical reactions. Thus, for example, a film derived from acrylic acid, which comprises a $CO_2H$ function as CFG can be modified by a reaction with thionyl chloride ($SOCl_2$) to form a film comprising acid chlorides as CFG. Similarly, in the context of a nitrobenzene film having a nitro function as CFG, it can be reduced by iron to yield a film having an amine as CFG. A polyacrylonitrile film comprising a nitrile grouping as CFG makes it possible, for example, after treatment with $LiAlH_4$, to obtain a film comprising an amine as CFG. It may be useful for a person skilled in the art to refer to the international application WO 2004/005410.

Access to functionalisable films allows for their subsequent functionalisation. Thus, according to a particular provision, the method for preparing an organic film on a support, as described above, can comprise an additional functionalisation step, with such a step being applicable in particular to functionalisable films.

The functionalisation can be produced by contacting the surface of a film, in particular obtained by the method described above, which is functionalisable and particularly with a CFG of the film, with a functionalizing compound. The contact can be performed with a solution, called a "functionalisation solution", comprising at least one functionalizing compound.

The reaction will in particular take place at the surface of the film, but also throughout the film according to the CFGs present, the thickness of the film and the solvent of the solution.

Among the chemical reactions that can be produced on CFGs, it is possible to cite, for example, nucleophilic additions and substitutions, electrophilic additions and substitutions, cycloaddition reactions, rearrangements, transpositions and metatheses, as well as more generally click-chemistry reactions (Sharples et al., Angew. Chem. Int. Ed., 2001, 40, 2004-2021). The type of reaction is of course dependent on the functionalizing compound that the user wants to link with the CFGs of the film. A person skilled in the art can easily find, in general organic chemistry literature, comprehensive lists of chemical reactions in which a CFG can be involved.

The solvent of the solution comprising the functionalizing compound will preferably be a swelling solvent. Such a solvent corresponds to a solvent capable of penetrating the organic film present on the support. Such solvents, when they are placed in contact with the film, generally cause swelling of the film that can be seen by optical means, by the naked eye, or by simple optical microscopy. A standard test to determine whether a solvent is particularly suitable for a film consists of depositing a drop of solvent on the surface of the film and observing whether the drop is absorbed into the film. It is desirable to use, among a set of solvents tested, those for which the absorption is the fastest. The use of such a solvent leads to a deeper grafting of the functionalizing compound in the film. Of course, it is also preferable for the reagents used for the reaction to be soluble in such a solvent.

In the sense of the invention, a functionalizing compound corresponds to an organic compound capable of reacting with the functionalisable film and particularly with a CFG of the functionalisable film. The functionalizing compound can be any type of organic molecule insofar as it has a group capable of reacting with a CFG of the support film.

The functionalizing compound can comprise, in its structure, a group of interest (GI) corresponding to a substructure having one or more properties of interest, as well as optionally a linking group (LG) corresponding to a structure essentially free of properties of interest. The functionalisation is advantageously performed by means of the LG, which has a group capable of reacting with the CFG.

The functionalizing compound, and especially the GI, can in particular have a chelating structure, or a biologically active structure. The GI can thus in particular be chosen from the cyclodextrins (CD), such as peranhydrocyclodextrin derivatives, calixarenes, such as calix[4]arene, porphyrins, such as tetrakis(benzoic acid)-4,4',4'',4'''-(Porphyrin-5,10,15,20-tetrayl), and their derivatives that have chelation properties. The GI can also for example be chosen from the polysaccharides and the polypeptides.

The linking group (LG) generally corresponds to a group that does not develop an interaction other than that of a steric, hydrophilic or hydrophobic nature or an affinity with the GI, and that does not react significantly with it (not detectably). It can typically for example be essentially an aliphatic chain, i.e. an alkyl chain, preferably 1 to 22 and typically 3 to 16 carbon atoms, an aromatic chain or a heterocyclic chain, such as a polyether. The LG advantageously comprises one or more reactive heteroatoms capable of reacting with a CFG.

As shown in the reading above, it is possible, according to the method of the invention, to prepare a film comprising grafted molecules and having properties of interest at the surface of a support. Such films can in particular correspond to chelation or filtration films or to films having biomolecules. It may be useful for a person skilled in the art to refer to the international application WO 2004/005410 for examples of molecules that it is possible to graft.

According to a specific functionalisation modality, it is possible to obtain supports coated with an organic complexing film. To do this, it is necessary to functionalize the film with complexing or chelating groups such as cyclodextrins, porphyrins and calixarenes.

According to another functionalisation modality, it is possible to obtain supports coated with an organic film comprising biomolecules such as proteins, polypeptides, peptides, antibodies and antibody fragments, polysaccharides or oligonucleotides. The functionalizing compound typically corresponds to a derivative of a biomolecule. Thus, for example, from a support having a film comprising polymethacrylonitrile, obtained by means of a diazonium and methacrylonitrile, it is possible to graft a protein such as avidine and to verify its activity according to the modalities described in the international patent WO 2004/005410.

This invention also relates to a non-electrically-conductive solid support on which an organic film is grafted, of which the first unit covalently bound to said non-electrically-conductive support is a derivative of an adhesion primer. The non-electrically conductive solid support according to this invention can possibly have a mask as defined above.

The organic film advantageously includes, in addition to the first unit covalently bound to the non-electrically-conductive support derived from an adhesion primer, monomers of the same or different type bound to one another by a radical reaction, and possibly derivatives of the adhesion primer. Thus, as explained above, the organic film is essentially a polymer film. More specifically, it can be in the form of a sequential polymer film or a statistical copolymer film. The non-electrically-conductive solid supports, the adhesion primers and the monomers are as defined above. The solid support, according to the invention can also comprise functionalizing compounds grafted as described above.

According to another embodiment of the invention, it is possible to obtain organic films comprising nano-objects. In the sense of this invention, an organic film comprising nano-objects, such as nanoparticles (NPs) nanocrystals (NCs) or nanotubes (NTs), typically corresponds to a film at the surface and within which nano-objects (NBs) are present.

This embodiment can be applied to a support coated with an organic film and in particular a support coated with an organic film covalently bound to its surface. It will typically be a support obtained by a method as described above.

Thus, this embodiment corresponds in particular to a method for preparing an organic film comprising nano-objects based on a solid support coated with an organic film, typically obtained by the method described above, characterized in that the surface of the support is placed in contact with a suspension of at least one nano-object (NB) in a suspension solvent and in that the film and the nano-object have a physicochemical affinity.

A nano-object (NB) corresponds to an object of nanometric size, generally with its largest size being smaller than 1 μm and typically smaller than 25 nm. It can in particular be a nanoparticle (NP), a nanocrystal (NC), a nanowire or a nanotube (NT), or a nanocolumn. It is clear that the NBs concerned here will advantageously have a size smaller than the thickness of the organic film present on the support, advantageously with their largest dimension not exceeding 20%, generally 10% and typically 5% of the thickness of the organic film.

There is a physico-chemical affinity between the film and the NBs when it is possible to correlate the duration of contact between the suspension and the surface of the support with a reduction in the NB concentration in the solution, a plateau value generally being reached, independently of any demixing of the NBs in the suspension. It is thus possible to determine NB/organic film pairs between which there is an affinity. The affinity is generally due to weak or strong interactions that develop between the surface of the NBs and the film. Among the weak interactions, it is possible to cite in particular hydrogen bonds, ionic bonds, complexing bonds, pi interactions ("pi stacking"), Van der Waals bonds, hydrophobic bonds (or surfactant-type apolar bonds); among the strong bonds, it is possible to cite the covalent bonds that can form spontaneously.

The structure of the NBs is variable. It is simple or complex. A simple NB is constituted by a single material, often a NP, a NC, a nanowire or a nanocolumn, nevertheless capable of having a variable constitution, in particular in the case of a NB non-uniformly doped throughout its volume. A complex NB generally has various structural elements or parts of which the composition is clearly distinct. It can, for example, involve artificial assemblies of nanometric size having organic and inorganic structures or NPs comprising ligands or NPs with multiple coatings. A complex NB can be constituted by a plurality of simple NBs.

In a non-exhaustive manner, NBs can in particular comprise at least one metal. The metals can in particular be chosen from the noble metals and the transition metals, the metals of groups IIIA, IVA and VA of the periodic table of elements, their alloys, the oxides and the metallic carbides, mixtures of these materials and alloys. They can also be doped, in particular by elements such as nitrogen, boron and rare earth elements. More specifically, the invention applies to gold, platinum, palladium, rhodium, ruthenium, cobalt, nickel, silver, copper, titanium oxide, iron oxide, and iron-platinum, iron palladium, gold-platinum and cobalt-platinum alloys. The NBs can also be constituted solely by the elements cited above. In this case, they will be metallic NBs.

The NBs can also comprise a semiconductor or an inorganic insulator. This can be, for example, compounds of formula AB with A being an element of which the oxidation state is +II and B being an element of which the oxidation state is −II. Typically A is chosen from Mg, Ca, Sr, Ba, Zn, Cd, Hg, Sn, Pb and mixtures of these elements, and B is chosen from O, S, Se, Te and mixtures of these elements. Among the semiconductors, it is also possible to cite the semiconductors of formula CD with C being an element of which the oxidation state is +III and D being an element of which the oxidation state is −III. Typically, C is chosen from Al, Ga, In and mixtures of these elements, and D is chosen from N, P, As, Sb, Bi and mixtures of these elements. The semiconductors of formula $ECB_2$ with E being an element of which the oxidation state is +I, C being an element of which the oxidation state is +III and B being an element of which the oxidation state is −II, in which B and C are chosen as above, and E being chosen from Cu, Ag and Au, are also concerned by the invention. Finally, it is of course possible to use simpler semiconductors such as Si or Ge, as well as their oxides and carbides, or insulators such as diamond. The semiconductors can be in an intrinsic or doped form. The NBs can also be constituted solely by the elements cited above.

The NBs can also comprise an element of an organic nature. In this case, and for complex NBs, this generally involves specific molecular edifices such as stabilizers or organic ligands or coating films. For simple NBs, it generally involves carbon in a specific structural form such as a nanotube or a fullerene. The NBs can also be constituted solely by the elements mentioned above.

According to the invention, and in order to give the user greater flexibility, it is recommended to use functionalized nano-objects. A NB is said to be "functionalized" when its surface comprises one or more $BG_1$ having an affinity for the "host film", which is the film present on the support. In the case of a simple NB, $BG_1$ can thus correspond to a chemical function present at the surface, such as the OH functions, which are present on silica particles as well as shown in the examples. In the case of a complex NB, $BG_1$ can be present on one of the elements or on only one of the parts of the NB, and, for example in the case of a NP comprising stabilizing elements, ligands or having a coating, $BG_1$ can be present on a plurality of organic stabilizers or on the coating.

A stabilizer corresponds to an organic molecule bound to the surface of the core of the nano-object and that maintains the NB in the colloidal state. It may be useful in this field for a person skilled in the art to refer to Roucoux et al., Chem. Rev. 2002, 102, 3757-3778. Thus, according to a first possibility, a functionalized nano-object typically has an inorganic core, or at least its surface is inorganic, constituted by at least one metal and/or at least one semiconductor or an insulator as defined above, to which at least one stabilizer comprising an organic group $BG_1$ is bound. According to the number of stabilizing molecules present, it is possible to speak of an organic crown. According to a second possibility, it is also possible to use a functionalized NB comprising an organic coating. Such a functionalized NB can in particular be obtained by the method for preparing an organic film at the surface of a support described above applied to a NB, i.e. corresponding to the core to be coated. In this case, it should be noted that, in consideration of the great flexibility with which the method for preparing an organic film at the surface of a support as described above can be applied, the nature of the core may be variable, both simple and complex, and inorganic and organic. For further details, it may be useful to refer to what has been described as well as the examples that illustrate the application to various surfaces. The organic film will be prepared so that it comprises a $BG_1$ group.

Typically, stabilizers are chosen from amphiphilic molecules such as surfactants or polyoxanions, polymers such as PVP (polyvinylpyrolydone), PEG (polyethylene glycol), charged low-molecular-weight molecules, in general less than 200 g·mol$^{-1}$, such as sodium citrate or sodium acetate, and finally chemical coordination ligands such as Lewis bases such as BINAP derivatives (2,2'-bis(diphenylphosphino)-1,1'-binaphthyl).

The stabilizers that can be used in the context of the invention for the functionalized NBs comprising a core composed of a metal and/or a semiconductor and/or an insulator, or of which the surface has such a composition, are in particular ligands of formula (III):

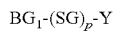

$BG_1\text{-}(SG)_p\text{-}Y$ in which:
Y represents an atom or a group of atoms capable of binding to a metal and/or a semiconductor compound and/or an insulator;
SG represents a spacer group;
$BG_1$ is as defined above;
p is equal to 0 or 1.

According to the invention, Y will be chosen according to the core of the NB that is used in the context of the method. Y can bind covalently, by complexing, by chelation, or by electrostatic interaction at the surface of the core. It may be useful, in order to determine the structure most suitable for the NB considered, for a person skilled in the art to refer to the prior art and in particular Colloids and Colloid Assemblies, Frank Caruso (Ed.), 1. Ed. December 2003, Wiley-VCH, Weinheim or Templeton, A. C.; Wuelfing, W. P.; Murray, R. W., Monolayer-Protected Cluster Molecules. Acc. Chem. Res. 2000, 33 (1), 27-36.

Y can in particular be a thiol, a dithiol, a carbodithioate, dithiocarbamate, xanthate, when the core, or the surface of the core, corresponds to a metal such as gold, silver, copper, platinum, palladium or when it corresponds to an AB semiconductor such as CdSe, CdTe, ZnO, PbSe, PbS, CuInS$_2$, CuInSe$_2$ or Cu(In,Ga)Se$_2$. In the case of cores composed of oxides, such as titanium zirconium, aluminum or iron oxide, or when the surface of the core has such a composition, Y can in particular correspond to a carboxylic, dicarboxylic, phosphonic, diphosphonic, sulfonic or hydroxamic acid, which acids can be in deprotonated form, as described in the prior art and in particular in the international application WO 2004/097871.

According to the invention, it is preferable for p to be equal to 1. A spacer group SG generally corresponds to a group that does not develop an interaction other than that of a steric, hydrophilic or hydrophobic nature, or an affinity with the core of the NB or the organic host film to which the method is applied, and that does not react significantly with them (not detectably). Typically, the spacer can be a carbonated chain not comprising a heteroatom. It can, for example, be an aliphatic chain, i.e. an alkyl chain, preferably 1 to 22 and typically 6 to 16 carbon atoms, an aromatic chain, or a heterocyclic chain, such as a polyether chain.

According to a first modality, it is possible to apply the method to a support coated with a functionalized organic film so that it has an organic group $BG_2$ having an affinity for the core of the NB. Thus, according to the specific embodiment, $BG_2$ can be chosen from the groups listed above for Y and the NBs will have a composition, at least on their surface, as listed above in accordance with Y.

According to a second modality, it is possible to apply the method to a support coated with a functionalized organic film so that it has an organic group $BG_3$ having an affinity for the $BG_1$ group present on the stabilizer or the coating of the NB core. $BG_1$ and $BG_3$ then form a pair having an electronic-type interaction, which will typically be the site of the affinity between the organic film and the functionalized NBs.

According to a third modality, it is possible to apply the method to a support coated with a functionalized organic film so that it has both an organic group $BG_3$ and a $BG_2$ group. This embodiment is suitable when the NB comprises a coating or a stabilizer comprising $BG_1$-type groups and when the surface of its core also comprises this type of group. The chemical functions present at the surface of the core, although they are both capable of developing an interaction with the host film, can of course be different.

As an organic host film, functionalized by $BG_2$ and/or $BG_3$ groups, and as a coating film, functionalized by a $BG_1$ group for the NB core, it is advantageous to use a film prepared according to the method described above on the basis of a primer and a monomer different from the adhesion primer and radically polymerizable. It is recommended to use functionalisable films as defined above. Typically $BG_2$ and $BG_3$ can correspond to a CFG of the film. The presence of a monomer often easily derivatizable or having particular organic functions is suitable. As specified above, it is possible to modify the CFGs of the film in order to obtain other CFGs. In this context, it is especially recommended to use vinyl monomers and in particular vinyl monomers of general formula (II), and particularly those for which $R_1$ is a carboxylic acid, an amine, a carbonated group having these functions, typically with the other substituents $R_2$ to $R_4$ being H. This will particularly involve acrylic acid. Of course, in the synthesis of the organic film, it can comprise a precursor of the $BG_1$, $BG_2$ or $BG_3$ group. Such a precursor can be transformed, when the user so decides, into a corresponding affinity group by performing a few, typically one or two, simple chemical steps. Thus, for example, it is possible to easily convert the carboxylic acid functions of a film developed from acrylic acid into a carboxylate function by a simple acid-base reaction.

In addition, as an organic host film, it is of course possible to use a film functionalized by a functionalizing compound. According to this modality, it is desirable to use a functionalizing compound having a chelation property. In this case, the $BG_2$ and/or $BG_3$ group advantageously corresponds to a GI as defined above, with such a GI being a chelating or complexing structure. The functionalizing compound can be grafted according to the modalities presented above. It is in particular possible for it to also comprise a linking group LG as defined.

Thus, for example, it is possible to use films comprising molecules derived from cyclodextrins, porphyrins or calixarenes. Thus, molecules or salts, for example lead, such as lead nitrate, can be chelated or complexed.

Typically, Y will develop a weaker interaction with the core of the NB than the interaction that the surface of the core may develop with the host film of the support. Thus, the interaction that may exist between the core of a complex NB and Y will advantageously be less strong than that which may exist between the core of such a NB and $BG_2$.

In the sense of the invention, the suspension solvent is a solvent that enables the formation of a suspension of NBs. Such solvents typically correspond to the solvents in which the NBs are prepared because they prevent or slow the aggregation of NBs. The suspension solvent will advantageously be chosen from the swelling solvents, as defined above.

The suspension of NBs will preferably be homogenized before being used. It is possible, for example, to subject the suspension to mechanical agitation, preferably vigorous, or to an ultrasound treatment.

The NB concentration in the suspension and the duration of contact of the film with the suspension are variable and can be adjusted according to the amount of NB that the user wants to integrate in the film. Preliminary tests according to the affinity existing between the film and the NBs make it possible to easily determine the reasonable procedure conditions for implementing the method. The user may find it useful to refer to the examples. It is clear that the increase in the concentration of the suspension makes it possible to reduce the time necessary for integrating a given amount of NBs into the film. Similarly, the increase in the duration of contact makes it possible to integrate a larger amount of NBs for a given time. Thus, for example, for a film of 200 to 300 nm, contact with a suspension of NPs of Pt for 15 to 60 min makes it possible to obtain a film comprising nanoparticles. As a solvent, it is possible, for example, when the film comprises carboxyl-type affinity groups, to use, as the suspension solvent, a hydrophilic solvent such as water or a low-molecular-weight alcohol such as methanol or ethanol, or a mixture thereof. The choice of a hydrophilic solvent makes it possible, for example, to produce a suspension of NPs of silica, gold or platinum stabilized by a stabilizer comprising a hydrophilic group, such as ammonium. In such suspension solvents, it is also possible to use NBs comprising hydrophilic groups at their surface such as silica NPs. It may be useful for a person skilled in the art to refer to the examples.

The invention also makes it possible to produce supports coated with films comprising one or more coalescence zones on the basis of supports coated with organic films comprising NBs, which films can be obtained by the method presented above. Thus, advantageously, the method for incorporating NBs will be applied to NBs capable of coalescing under the action of a coalescence agent, and will comprise an additional step of exposing a zone of the surface of the support, coated with the organic film comprising the NBs, to a coalescence agent. The coalescence of NBs is generally defined as the disappearance of the boundary between two NBs in contact with one another, or between an NB and an object of larger size and similar composition, followed by a change in shape leading to a reduction in the total surface of the system.

The method is generally performed by placing the film comprising the NBs, typically obtained according to the method described above, in the presence of the coalescence agent. The method can of course be performed on one or more zones of the support comprising the film by exposing said zone to the coalescence agent. This method can thus be performed in a localized manner. The coalescence agent can lead to a modification of the support and any organic films and layers present on the support. A localized application of the agent can thus be preferable.

The NBs capable of undergoing coalescence are, for example, simple NBs. These will generally be metallic NBs and in particular metal or metal alloy NCs or NPs, or complex NBs such as functionalized NBs having a metallic core.

The coalescence agent can be a variation of a physical parameter or irradiation. When the method is applied to a particular zone of the support, the parameter will be modified only in this zone. The physical parameters capable of being modified in order to obtain a coalescence of NBs are known to a person skilled in the art. Thus, for example, a modification of the temperature or photon or electron irradiation can be used. Generally, a heat treatment at a temperature between 250 and 500° C., and for example 250 to 350° C. for 2 to 5 min makes it possible to obtain the coalescence of platinum nanoparticles. Such a treatment performed on the entire surface of the support having a film comprising nanoparticles leads to the formation of a homogeneous metallic film. Tests can be performed to determine the minimum temperature for a given time according to the NBs and in particular according to their size as well as their composition. Similarly, the localized application of a coherent infrared source, such as a $CO_2$-type laser, easily leads to localized coalescence zones. The application of an electron beam, for example, using a microscope, makes it possible to produce a localized coalescence of NPs.

This invention also relates to a non-electrically conductive solid support on which an organic film, comprising NBs, and particularly NPs, is grafted, of which the first unit covalently bound to said non-electrically conductive support is a derivative of an adhesion primer. The non-electrically conductive solid support according to this invention can optionally have a mask as defined above. It can also comprise molecules grafted according to the modalities described above.

Advantageously, the organic film comprising NBs, and particularly NPs, includes, in addition to the first unit covalently bound to the non-electrically conductive support derived from an adhesion primer, identical or different monomers, bound to one another by a radical reaction and optionally derivatives of the adhesion primer. Thus, as explained above, the organic film is essentially a polymer film. More specifically, it can be in the form of a sequenced polymer or a statistical copolymer film. The non-electrically conductive solid supports, the adhesion primers and the monomers are as defined above. Typically, the NBs, and particularly the NPs, will be present in the outermost layers of the film.

In addition, it is possible to use electrodeposition solutions to form a metallic coating, and in particular copper, on a support coated with an organic film obtained by the method described above. The electrodeposition will generally be performed on organic films not comprising NBs. Typically, to implement such provisions, a person skilled in the art may find it useful to refer to the international application WO 2007/034116 and in particular the examples. Thus, the method of electrodeposition on a support coated with an organic film, capable of being obtained by the method described above, can in particular be performed by carrying out the following steps:
- a so-called "cold inlet" step, in which the surface of the support is placed in contact, without electric polarization, with an electrodeposition bath, and preferably kept in this state for a period of at least 5 seconds, preferably between 10 and 60 seconds, and advantageously around 10 to 30 seconds,
- a step of forming the metallic coating, in which said surface is polarized for a sufficient time to form said coating,
- a so-called "hot outlet" step, in which said surface is separated from the electrodeposition step while it is still under electric polarization.

This invention also relates to a method for metalizing an organic film prepared at the surface of a solid support including steps consisting in:
(a") preparing, at the surface of a solid support, an organic film comprising nano-objects (NBs) according to a method as defined above;
(b") placing the film prepared in step (a") in contact with a solution containing at least one metal salt capable of being reduced by said NBs.

Indeed, to form a metal coating on a support coated with an organic film obtained by the method described above, it is also possible to take advantage of the presence of NBs, and in particular NPs, in the organic film. For this, it is possible to use a solution comprising one or more metal salts capable of being reduced by the NBs present in the organic film. In general, the support coated with an organic film comprising NBs will be immersed directly in a solution comprising one or more metal salts. The time of exposure of the support coated with the organic film comprising NBs to the metal salt solution is generally between one and around ten minutes. The concentration of NBs and metal salts in the film can be adapted according to the desired thickness of the film.

As an NB, it is possible to use, in particular, simple NBs, generally metal NBs and in particular metal NCs or NPs such as platinum or palladium, or metal alloys, or complex NBs such as functionalized NBs having a metal core.

Among the metal salt solutions, it is, for example, possible to choose copper sulfate or nickel sulfate solutions.

The choice of the type of NB and the type of solution is closely linked to the reduction reaction that takes place.

This invention also relates to the use of a solution containing at least one solvent, at least one adhesion primer, optionally at least one monomer different from the adhesion primer and, possibly, at least one chemical initiator as defined above, to form, under non-electrochemical conditions allowing for the formation of at least one radical on the adhesion primer, an organic film at the surface of a solid support in contact with said solution.

The invention also relates to a kit for preparing a polymeric organic film at the surface of a sample. Such a kit includes, in particular:
- in a first compartment, a solution containing at least one adhesion primer as defined above,
- optionally, in a second compartment, a solution containing at least one radically polymerizable monomer different from the adhesion primer as defined above,
- and, possibly, in a third compartment, a solution containing at least one chemical polymerization initiator as defined above.

The kit according to this invention can optionally also contain a compartment containing a suspension of at least one nano-object in a suspension solvent and/or a compartment containing a functionalisation solution.

In an alternative of the kit according to the invention, the first compartment contains at least one precursor of an adhesion primer. A "precursor of an adhesion primer", means a molecular entity separated from the adhesion primer by a single process step that is easy to implement. In this case, the kit will possibly include at least one other compartment containing at least one element necessary for developing the primer from its precursor (third compartment or fourth compartment if a chemical primer is present). Thus, the kit can, for example, contain a solution of an arylamine, precursor of the adhesion primer, and also a $NaNO_2$ solution to allow, by addition, the formation of an aryl diazonium salt, the latter being an adhesion primer. A person skilled in the art will understand that the use of a precursor makes it possible to avoid storing or transporting reactive chemical species.

The solvent can be contained in any one of the solutions of the first and second compartments, and possibly in the solution of the third or the fourth compartment. An identical or different solvent is advantageously contained in each of the solutions of the first and second compartments, and possibly in the solution of the third or the fourth compartment.

The solutions of the various compartments can of course contain various other identical or different agents, such as stabilizing agents or surfactants. The use of the kit is simple, since it is simply necessary to place the sample, of which the surface is to be treated, in contact with the mixture of the solutions prepared extemporaneously by mixing the solutions of the different compartments, preferably by agitation and in particular by ultrasound. Advantageously, only the solution containing the monomer, i.e. of the second compartment, is subjected to ultrasound before being mixed with the solution containing the adhesion primer prepared extemporaneously from a precursor, or present in the solution of the first compartment.

The invention also makes it possible to obtain polymer films having remarkable properties. It should first be noted that the films have a particularly good resistance since, after a step of washing with a solvent in which the monomer is particularly soluble and in the presence of ultrasound, the thickness of the film does not vary significantly. Moreover, it is possible to test, with remarkable success, the thickness of the film obtained by varying the experimental parameters such as the reaction time or the active species concentration. The composition of the films is also homogeneous, and it is possible to test it with great precision, which makes it possible to produce both random and sequential polymer films (also called block or alternate). The films are uniform, i.e. they have a homogenous surface over the entire surface on which the method has been applied. This invention therefore makes it possible to produce numerous functionalizations on a very wide variety of surfaces with different monomers that may be combined with one another.

It is of course possible to apply all of the methods described using a base support. The order and sequence of the various methods, as well as the application of certain modalities offered by this invention, such as the use of masks and the localized formation of coalescence zones, result in supports coated with films capable of having a complexity, such as a lamination of successive organic and inorganic films, unequalled by such a simple methodology on such a low scale.

The invention has numerous advantages. This method makes it possible, using a single, simple and reproducible process, to carry out the grafting of conductive or non-conductive surfaces. The implementation of this method does not require any significant investment with regard to specific equipment such as potentiostats, costly vacuum set-ups, and so on. Moreover, the implementation of the method is simple and fast by comparison with the other techniques known today for grafting or coating surfaces. This method does not require a connection to an electric circuit, unlike electrochemistry, and thus enables it to be applied on surfaces that are difficult to connect, such as nano objects. Furthermore, this radical polymerization can be performed in the presence of oxygen, and does not involve any special precautions during the synthesis.

As shown diagrammatically in FIG. 2, this invention can be used in an aqueous medium without any equipment other than a container in which the reaction takes place. Therefore, it is no longer necessary to connect the surface to be grafted to a potentiostat (FIG. 8a), but only to soak it in the solution of the reaction medium (FIG. 2b). This technique makes it possible to synthesize a large number of polymers, the monomers of which may or may not be soluble in an aqueous medium, on a very wide variety of electrically- or non-electrically-conductive surfaces with very strong cohesion, with the films obtained being resistant to ultrasound in various solvents.

The invention thus makes it possible to very effectively coat and functionalize a considerable number of surfaces of various types, heretofore not decorated or grafted, such as a PTFE surface. There are numerous fields of application and such a method can be applied, for example, in biology, in particular for biocompatibility processes (stents coating), for the functionalisation and in particular the protection of surfaces, such as metals (anticorrosion) or fibers (water-repellent), for effluent treatments by coating films with complexing molecules, or for producing a structural bond from the grafted film.

In addition, the functionalisation can be localized by using the mask. It is thus possible to specifically coat various areas of the same surface while protecting other areas with one or more masks. This type of procedure is easy to implement because organic masks that are easy to remove can be used. In particular, it is possible to use simple depositions using ink-impregnated felt pens or a coating with fat.

Finally, the functionalisation of the surfaces of interest can be further enhanced by the use of functionalizing compounds themselves linked onto the grafted film.

The method according to the invention can also be implemented in a pollution-free approach, since it can be performed in an aqueous medium and it produces little waste, with one of the products of the reaction capable of being in particular dinitrogen.

Other features and advantages of this invention will become clear to a person skilled in the art on reading the following non-limiting examples provided for the purpose of illustration in reference to the appended figures.

BRIEF DESCRIPTION OF THE DRAWINGS

FIG. 1 shows the IR spectrum of a gold plate according to an alternative of the method of this invention with a solution of which the diazonium salt was prepared in situ from p-benzylamine.

FIG. 2 shows the IR spectrum of a gold plate treated according to an alternative of the method of this invention, i.e. with a solution of which the diazonium salt has been prepared in situ from p-phenyldiamine.

FIG. 7 provides a diagrammatic representation of a sequential film (FIG. 7a) and a statistical film (FIG. 7b) prepared according to this invention.

FIG. 8 provides a diagrammatic representation of the grafting methods of the prior art (FIG. 8a) and the method according to this invention (FIG. 8b).

FIG. 11 shows the XPS spectrometry (X photoelectron spectroscopy) analyses of a conductive carbon felt (FIG. 11a) and of the same carbon felt on which an organic film is grafted, which film is prepared according to the method of this invention, i.e. from a diazonium salt created in situ and acrylic acid, in the presence of iron filings (AAP for acrylic acid polymer) (FIG. 11b).

FIG. 12 shows the IR spectrum of a gold plate treated according to the method of this invention for forming a sequential film.

FIG. 18 shows the IR spectra obtained for a gold plate (FIG. 18a) and a titanium plate (FIG. 18b) treated identically according to the method of this invention, i.e. based on 2-hydroxyethylmethacrylate and a diazonium salt prepared in situ, in the presence of iron filings.

FIG. 19 shows the photograph of a water drop on a pristine glass plate (FIG. 19a) and the photograph of a water drop on the same glass plate coated with p-butylmethacrylate (p-BuMA) according to the method of the invention (FIG. 19b).

DETAILED DESCRIPTION OF SPECIFIC EMBODIMENTS

Figure 3:
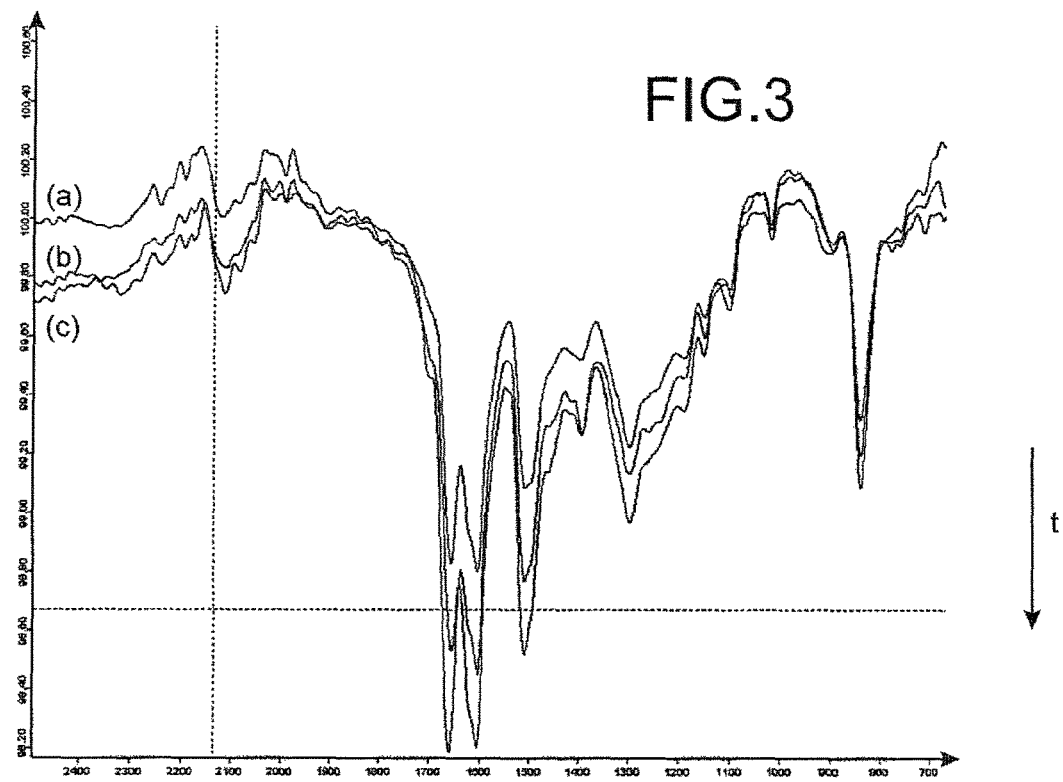
FIG. 3 shows the IR spectrum of a gold plate treated according to an alternative of the method of this invention, i.e. with a diazonium solution, after 5, 10, and 15 minutes of exposure of the plate (respectively (a), (b) and (c)).

The following examples were performed in a glass cell. Unless otherwise indicated, they were conducted under normal conditions of temperature and pressure (around 25° C. under around 1 atm) in ambient air. Unless otherwise indicated, the reagents used were obtained directly on the market without any additional purification. The glass plates used had a surface of 1 cm².

No precaution was taken with regard to the composition of the atmosphere, and the solutions were not degassed. When the reaction time is not specified, the exposure of the surface to be treated with the reagent solution lasted for 1 to 15 minutes.

Four series of examples illustrate the embodiments of the invention. The first concerns films prepared with an adhesion primer, the second concerns films prepared with an adhesion primer and a monomer, the third concerns functionalisable films, and the fourth concerns films comprising nano-objects.

I—Adhesion Primer Alone

Example I-1—Preparation of a Film on a Gold Plate Using a Diazonium Salt from Para-Benzylamine, Prepared In Situ in the Presence of Iron Filings 4 ml of a solution of $NaNO_2$ at 0.1 M in water were added to 4 ml of a solution of para-benzylamine at 0.1 M in HCl (0.5 M), in order to form the diazonium salt. A gold plate was then added to the reaction medium for 15 min. The plate was then rinsed in water with acetone, and subjected to ultrasound in DMF and then a basic soda solution with a pH=9.5 so as to deprotonate the primary amine, before being dried.

The XPS spectrometry (X photoelectron spectroscopy) and IR analyses confirm the presence of the film expected, of which the thickness increases with the reaction time. The specific poly-benzylamine bands at 1476 cm$^{-1}$ (Deformation C=C), 1582 cm$^1$ (Deformation N—H) and 3362 cm$^{-1}$ (Elongation N—H) are visible on the IR spectrum of a plate after the treatment (FIG. 1).

Example I-2—Preparation of a Film on a Gold Plate Using a Diazonium Salt from p-Phenyldiamine, Prepared In Situ in the Presence of Iron Filings 4 ml of a solution of $NaNO_2$ at 0.1 M in water were added to 4 ml of a solution of p-phenyldiamine at 0.1 M in HCl (0.5 M), in order to form the diazonium salt. 200 mg of iron filings were added to this diazonium salt solution. A gold plate was then added to the reaction medium for 15 min. The plate was then rinsed in water with acetone, and subjected to ultrasound in DMF and then rinsed in water before being dried.

The XPS spectrometry (X photoelectron spectroscopy) and IR analyses confirm the presence of the film expected, of which the thickness increases with the reaction time. The specific p-phenylamine bands at 1514 cm$^{-1}$ (Deformation C=C), 1619 cm$^{-1}$ (Deformation N—H) and 3373 cm$^{-1}$ (Elongation N—H) are visible on the IR spectrum of a plate after the treatment (FIG. 2).

Example I-3—Test of the Film Thickness

To show the influence of various parameters on the thickness of the organic film, the method was applied to a gold plate, placed in the presence of a solution containing 4-aminobenzyldiazonium, under non-electrochemical conditions allowing for the formation of radical entities. This choice was in particular motivated by the presence of characteristic absorption bands of the film obtained at 1504 cm$^{-1}$ (Deformation C=C), 1605 cm$^1$ (Deformation N—H) and 1656 cm$^{-1}$ (Elongation N—H).

A solution of diazonium salt in water was prepared by adding 4 ml of a solution of $NaNO_2$ at 0.1 M ($4.10^{-4}$ moles) to 4 ml of a solution at 0.1 M ($4.10^{-4}$ moles) of p-4-aminobenzylamine in HCl (0.5 M), under agitation. A gold plate was added to this solution.

To study the influence of the reaction time, the solution was then placed under non-electrochemical conditions allowing for the formation of radicals on the adhesion primer by adding 200 mg of iron filings. The plate was then removed from the reaction medium and immediately rinsed with water then acetone and dimethylformamide (DMF) under ultrasound, and finally dried under an argon current.

As shown by the IR spectrum in FIG. 3, the time of exposure of the sample to the reaction medium has an influence on the thickness of the film obtained. Exposure times of 5, 10 and 15 minutes were tested. It appears that a prolonged exposure increases the thickness of the film. Indeed, the increase in the intensity of the absorption bands of the poly-p-4-aminobenzylamine at 1504 cm$^{-1}$, 1605 cm$^{-1}$ and 1656 cm$^{-1}$ indicates an increase in the thickness of the film over time.

Example I-4—Preparation of a Film on a Gold Plate Using Commercial p-Nitrophenyldiazonium in the Presence of Iron Filings The experiment was conducted according to the protocol described in example I-2, using commercial p-nitrophenyldiazonium (Aldrich®) solubilised at 0.05 M in an HCl solution (0.5 M). The gold plate was then immersed in the solution for around 15 min. The plate was then rinsed with water and acetone, and subjected to ultrasound in DMF and then in water before being dried.

As above, the XPS spectrometry (X photoelectron spectroscopy) and IR analyses confirmed the presence of the film expected, of which the thickness increases with the reaction time.

Example I-5—Preparation of a Film on a Gold Plate Using a Diazonium Salt Created In Situ in the Presence of Steel Wool The procedure is identical to that of example I-1. The iron filings were replaced by around 5.10 mg of steel wool fibers (supplier CASTORAMA®), successively fine (0), extra fine (00) and super fine (000), which makes it possible not to have solid iron residue in the solution.

The XPS and IR analyses confirm the presence of the film expected, of which the thickness increases with the reaction time.

Example I-6—Preparation of a Film on a Gold Plate Using a Diazonium Salt Created In Situ in a Basic Medium The procedure is identical to that of example I-1. 0.3 ml of a soda solution at 2.5×10$^{-3}$ M were substituted for the iron filings in order to allow for a slight increase in the pH to above 4.

The XPS and IR analyses confirm the presence of the film expected, of which the thickness increases with the reaction time.

Example I-7—Preparation of a Film on a Gold Plate Using a Diazonium Salt Created In Situ, Primed by an Irradiated PVDF Membrane The protocol is identical to that of example I-1. An irradiated PVDF membrane (2 cm$^2$, thickness 9 μm, electron irradiation dose: 100 kGy) was substituted for iron filings.

The IR analyses confirmed the presence of the expected film, the thickness of which increased with the reaction time.

Example I-8—Preparation of a Film on a Gold Plate Using a Diazonium Salt Created In Situ in the Presence of Iron Filings The protocol is identical to that of example I-1. A glass plate was used in this case. The IR spectrum confirms the presence of the expected film, of which the thickness increases with the reaction time.

Figure 4:
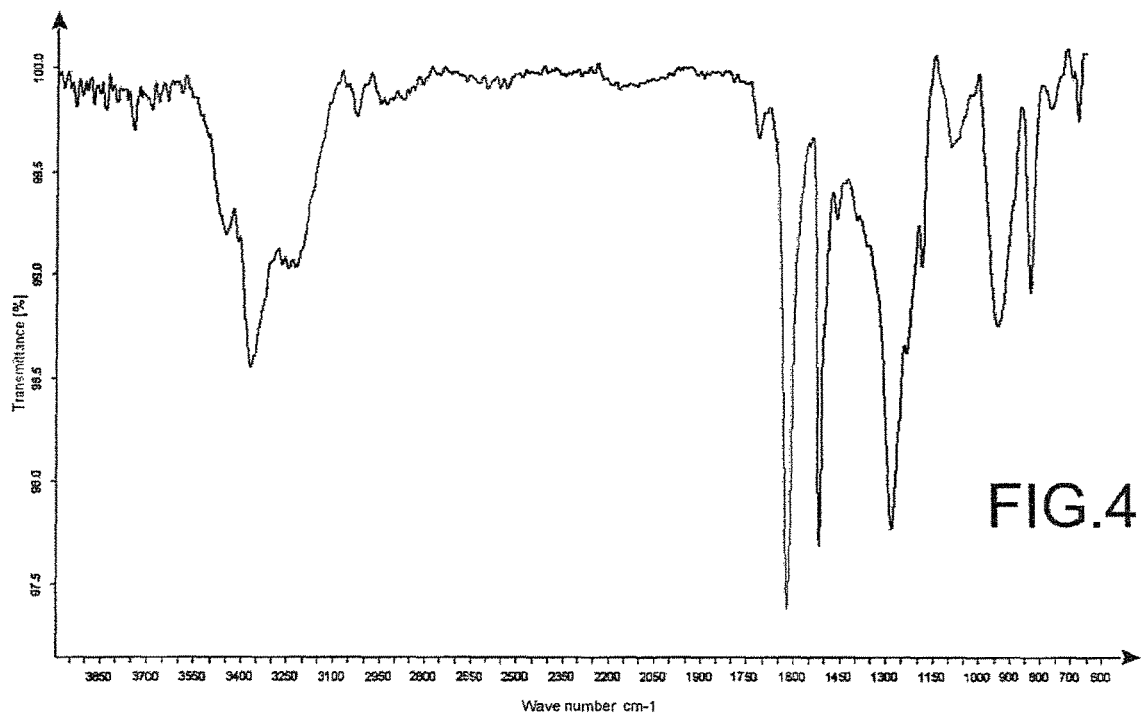
FIG. 4 shows the IR spectrum of a nickel plate treated according to an alternative of the method of this invention with a solution of which the diazonium salt was prepared in situ from p-benzylamine.

Example I-9—Preparation of a Film on a Nickel Plate Using a Diazonium Salt Prepared In Situ in the Presence of Iron Filings The protocol is identical to that of example I-1. A nickel plate was used in this case with a reaction temperature of 40° C. The IR spectrum obtained (FIG. 4) confirms the presence of the expected film, of which the thickness increases with the reaction time.

Figure 5:
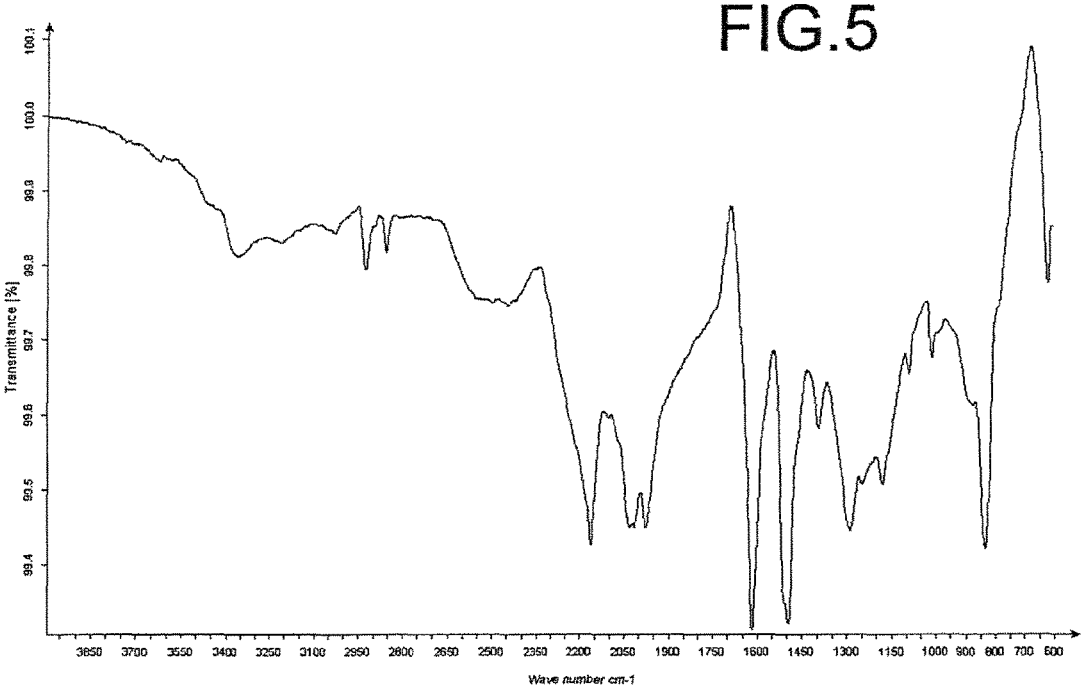
FIG. 5 shows the IR spectrum of a steel plate (AISI 316L) treated according to an alternative of the method of this invention with a solution of which the diazonium salt was prepared in situ from p-benzylamine.

Example I-10—Preparation of a Film on a Steel Plate (AISI 316L) Using a Diazonium Salt Prepared In Situ in the Presence of Iron Filings The protocol is identical to that of example I-1. A steel plate AISI 316L was used in this case. The IR spectrum obtained (FIG. 5) confirms the presence of the expected film, of which the thickness increases with the reaction time.

Figure 6A:
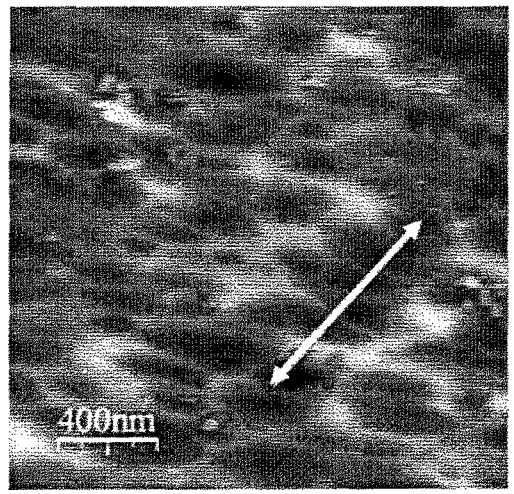
FIG. 6 shows an AFM image of a diamond surface coated with a primer film (FIG. 6a) and a profilometric curve (length X (nm)/height Z(Å)) of this surface indicated by a double arrow on the AFM image (FIG. 6b).
Figure 6B:
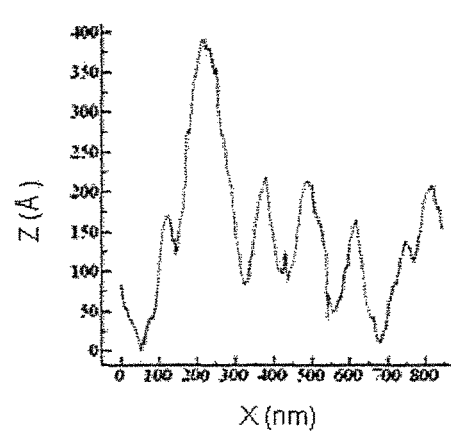

Example I-11—Preparation of a Film on a Diamond Using a Diazonium Salt Prepared In Situ in the Presence of Iron Filings The protocol is identical to that of example I-1. A piece of diamond was used in this case. An AFM image (FIG. 6) confirms the presence of the expected film, of which the thickness increases with the reaction time. The profilometric analysis shows the presence of the film at the surface.

II—Adhesion Primer and Monomer

Example II-1—Preparation of a Film on a Gold Plate Using a Diazonium Salt Prepared In Situ and 2-Hydroxyethylmethacrylate (HEMA) in the Presence of Iron Filings 4 ml of a solution of NaNO$_2$ at 0.1 M in water were added to 4 ml of a solution of p-phenylenediamine at 0.1 M in HCl (0.5 M), in order to form the aminophenyl mono diazonium salt. 1 ml of HEMA, then 200 mg of iron filings were added to this diazonium salt solution. A gold plate was then added to the reaction medium for 15 min. The plate was then rinsed in water with acetone, and subjected to ultrasound in DMF and then in water before being dried.

Figure 9:
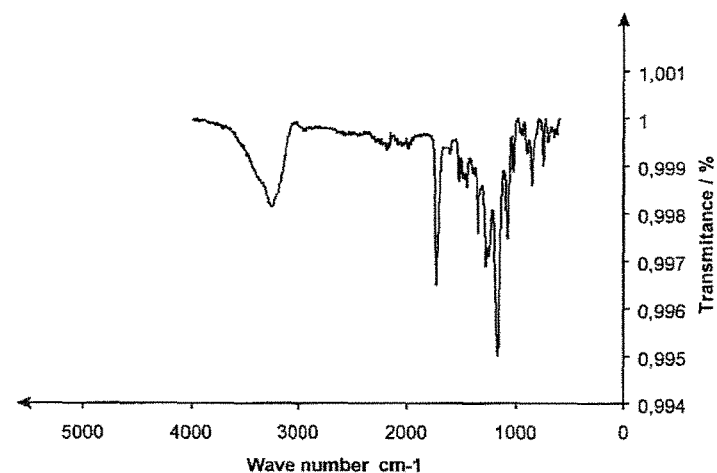
FIG. 9 shows the IR spectrum of a gold plate treated according to an alternative of the method of this invention, i.e. with a solution of which the diazonium salt was prepared in situ using a monomer.

The XPS spectrometry (X photoelectron spectroscopy) and IR analyses confirm the presence of the film expected, of which the thickness increases with the reaction time. FIG. 9 shows the IR spectrum of a plate after the treatment.

Table 3 provided below combines a set of thickness values obtained for the same reagents when their concentrations, the exposure time or the amount of filings were varied.

TABLE 3

| HEMA (mol · l$^{-1}$) | Diazonium (mol · l$^{-1}$) | Time (min) | Iron (mg) | Thickness (nm) |
|---|---|---|---|---|
| 0.9 | 0.05 | 1 | 200 | 10 |
| 0.9 | 0.05 | 3 | 200 | 50 |
| 0.9 | 0.05 | 5 | 200 | 90 |
| 0.9 | 0.05 | 10 | 200 | 140 |
| 0.9 | 0.05 | 15 | 200 | 200 |
| 0.45 | 0.025 | 1 | 200 | <10 |
| 0.45 | 0.025 | 3 | 200 | 20 |
| 0.45 | 0.025 | 5 | 200 | 40 |
| 0.45 | 0.025 | 10 | 200 | 90 |

TABLE 3-continued

| HEMA (mol · l$^{-1}$) | Diazonium (mol · l$^{-1}$) | Time (min) | Iron (mg) | Thickness (nm) |
|---|---|---|---|---|
| 0.45 | 0.025 | 15 | 200 | 120 |
| 0.9 | 0.05 | 10 | 5 | <10 |
| 0.9 | 0.05 | 10 | 50 | 30 |
| 0.9 | 0.05 | 10 | 100 | 70 |
| 0.9 | 0.05 | 10 | 150 | 100 |
| 0.9 | 0.05 | 10 | 200 | 150 |

The increase in the exposure time, the primer and the monomer concentrations, and the amount of filings, enables the thickness of the film formed to be increased.

Example II-2—Test of the Film Thickness

To show the influence of various parameters on the thickness of the organic film, the method was applied to a gold plate, placed in the presence of a solution containing an adhesion primer, 4-aminophenyldiazonium, and a monomer, HEMA, under non-electrochemical conditions allowing for the formation of a radical entity based on the adhesion primer. This choice was motivated in particular by the presence of characteristic absorption bands at 1726, 1454 and 1166 nm of the poly-HEMA.

A solution of adhesion primer in water was prepared by adding 4 ml of a solution of NaNO$_2$ at 0.1 M (4.10$^{-4}$ moles) to 4 ml of a solution at 0.1 M (4.10$^{-4}$ moles) of p-phenylenediamine in HCl (0.5 M), under agitation. 1 ml (8.24 mmoles) of HEMA and a gold plate were added to this solution.

2-1 Influence of the Reaction Time

The solution was then placed under non-electrochemical conditions allowing for the formation of radicals on the adhesion primer by adding 200 mg of iron filings. The plate was then removed from the reaction medium and immediately rinsed with water then acetone and dimethylformamide (DMF) under ultrasound, and finally dried under an argon current.

Figure 10A:
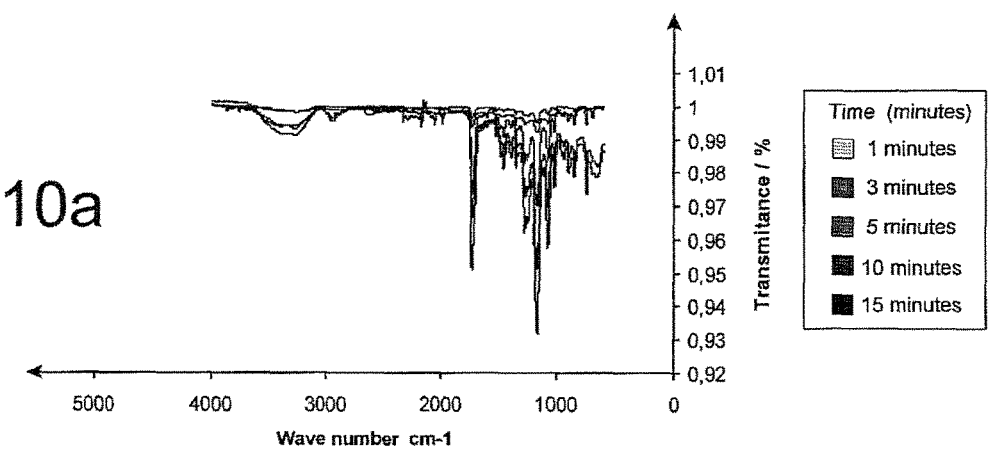
FIG. 10 shows, for a gold plate treated according to this invention, with a primer and a monomer, on the one hand, the IR spectrum of said gold plate treated at different exposure times (FIG. 10a) and, on the other hand, the IR spectrum of said gold plate treated according to the amount of iron filings (FIG. 10b).

As shown by the IR spectrum in FIG. 10a, the time of exposure of the sample to the reaction medium has an influence on the thickness of the film obtained. Indeed, the increase in the intensity of the absorption bands of the HEMA at 1726, 1454 and 1166 nm indicates an increase in the thickness of the film over time.

The thickness of the films was measured using a profilometer: it ranged from 12 nm to 200 nm for an exposure time ranging from 1 to 15 minutes.

2-2 Influence of Non-Electrochemical Conditions Allowing for the Formation of Radicals on the Adhesion Primer Given that the amount of radicals present in the solution has a notable influence on the reaction, the method was carried out with a variable amount of iron filings for a reaction time set at 10 min.

Figure 10B:
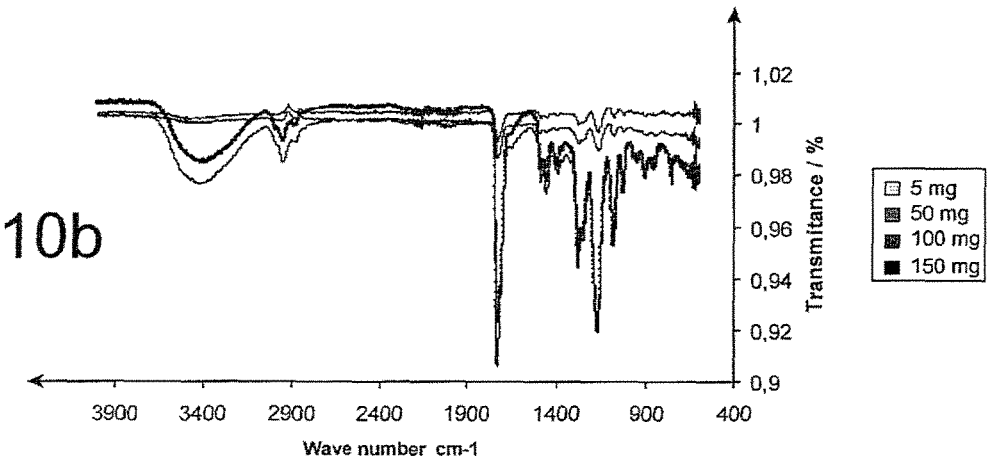

As shown by the IR spectrum in FIG. 10b, the amount of iron filings present in the reaction medium has an influence on the thickness of the film obtained. A minimum amount of filings is necessary in order to generate enough radicals in the reaction medium and make it possible to obtain a grafted film of an IR-detectable thickness. Beyond a certain maximum amount of filings, the variations in thickness of the film obtained are negligible.

Example II-3—Preparation of a Film on a Gold Plate Using Commercial p-Nitrophenyldiazonium and HEMA in the Presence of Iron Filings The experiment was conducted according to the protocol described in example II-2, using commercial p-nitrophenyldiazonium (Aldrich®) solubilised at 0.05 M in an HCl solution (0.5 M). The gold plate was then immersed in the solution for around 15 min. The plate was then rinsed with water and acetone, and subjected to ultrasound in DMF and then in water before being dried.

As above, the XPS spectrometry (X photoelectron spectroscopy) and IR analyses confirmed the presence of the film expected, of which the thickness increases with the reaction time.

Example II-4—Preparation of a Film on a Gold Plate Using a Diazonium Salt Created In Situ and HEMA in a Basic Medium The procedure is identical to that of example II-2. 0.3 ml of a NaOH solution at 2.5×10$^{-3}$ M were substituted for the iron filings in order to allow for a slight increase in the pH to above 4.

The XPS and IR analyses confirm the presence of the film expected, of which the thickness increases with the reaction time.

Example II-5—Preparation of a Film on a Conductive Carbon Felt Using a Diazonium Salt Created In Situ and Acrylic Acid (AA) in the Presence of Iron Filings The example was performed according to the procedure described in example II-2. The monomer used in this case was acrylic acid (1 ml) and the sample was constituted by carbon felt.

The XPS analysis, as shown by the spectrum of FIG. 11, confirms the presence of the expected film.

Example II-6—Preparation of a Sequential Film on a Gold Plate Using a Diazonium Salt Prepared In Situ, HEMA and AA in the Presence of Iron Filings First, a plate was prepared and cleaned according to the procedure of example II-2.

A new solution of the same diazonium salt was then prepared and, to it, 1 ml of acrylic acid, then 200 mg of iron filings were added. The plate previously prepared according to example II-2 was then placed in the reaction medium for a variable time, at the end of which it was cleaned and dried as described above.

FIG. 12 shows the IR spectrum obtained for such a plate after 15 minutes of reaction. The characteristic bands of the AAP (acrylic acid polymer) at 1590 and 1253 nm appear on the spectrum of example 2.

Example II-7—Preparation of a Statistical Film on a Gold Plate Using a Diazonium Salt Prepared In Situ, HEMA and AA in the Presence of Iron Filings The procedure used is identical to that of example II-2, except that 0.5 ml of acrylic acid and 0.5 ml of HEMA were added to the diazonium salt solution.

Figure 13:
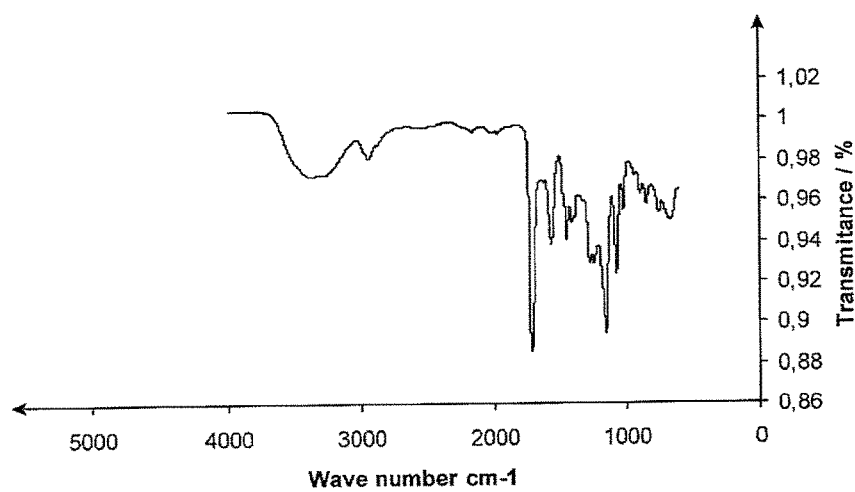
FIG. 13 shows the IR spectrum of a gold plate treated according to the method of this invention for forming a statistical film.

The IR spectrum obtained is shown in FIG. 13: it confirms the presence of the expected statistical film constituted in particular by the two monomers.

Example II-8—Preparation of a Film on a Gold Plate Using a Diazonium Salt Prepared In Situ and 4-Vinyl-Pyridine (4VP) in the Presence of Iron Filings 200 mg of iron filings, then a dispersion of 1 ml of 4 vinyl-pyridine in 10 ml of water, prepared by an ultrasound treatment, were added to a diazonium salt solution prepared according to example II-2, containing a gold plate. After a variable reaction time, the plate is then cleaned and dried according to the procedures described above.

Figure 14:
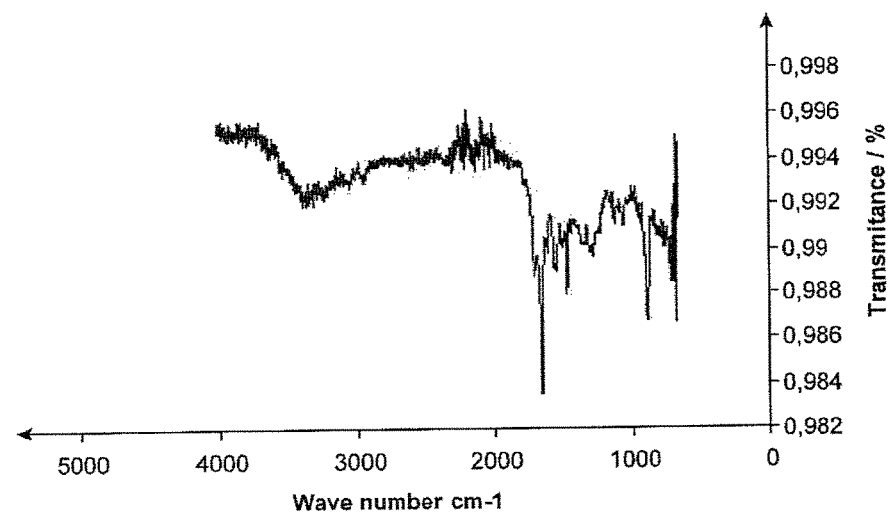
FIG. 14 shows the IR spectrum of a gold plate treated according to the method of this invention for forming a film based on a monomer that is insoluble in the reaction solvent.

The IR spectrum obtained for the plate is shown in FIG. 14. The characteristic bands at 1602, 1554 and 1419 nm validate the presence of the expected film.

Example II-9—Preparation of a Film on a Glass Plate Using a Diazonium Salt Prepared In Situ and HEMA in the Presence of Iron Filings The protocol is identical to that of example II-2, except that a glass plate is used in this case.

Figure 15:
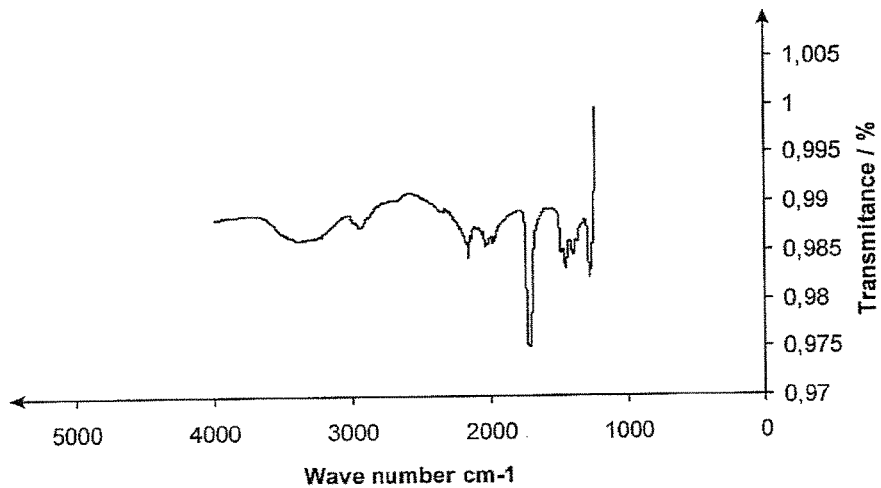
FIG. 15 shows the IR spectrum of a glass plate treated according to the method of this invention with a primer and a monomer.

The IR spectrum shown in FIG. 15 confirms the presence of the expected film, the thickness of which increases with the reaction time.

Example II-10—Preparation of a Film on Carbon Nanotubes Using a Diazonium Salt Prepared In Situ and HEMA in the Presence of Iron Filings 200 mg of iron filings and 1 ml of HEMA were added to a diazonium salt solution prepared as indicated in example II-2. Then, 100 mg of multiwall carbon nanotubes in the form of a carpet were added to this solution. The layer, after reaction, was cleaned according to the protocol described in example 2 before being dried.

Figure 16A:
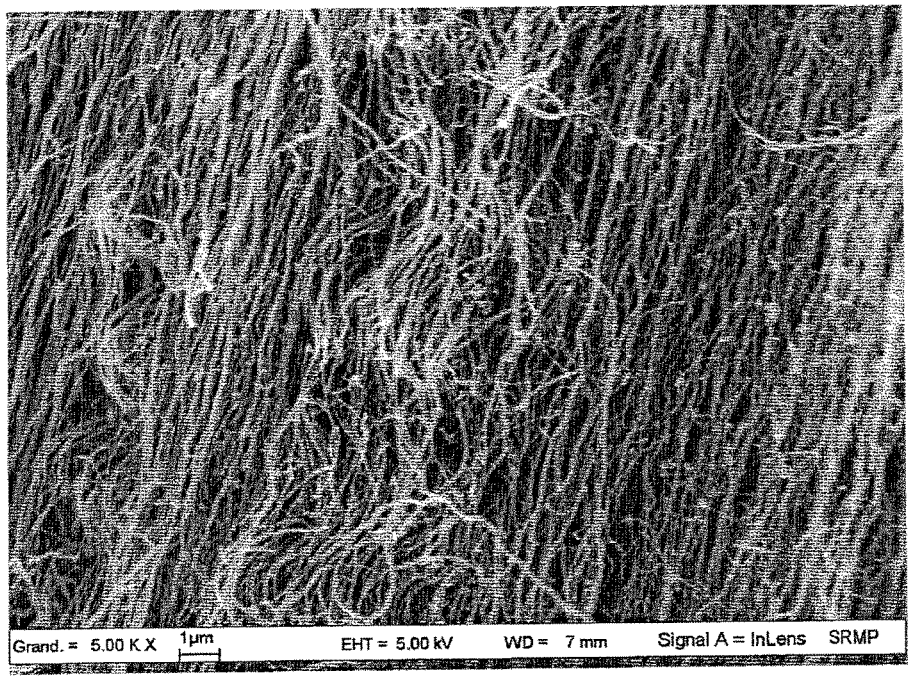
FIG. 16 shows a photograph of carbon nanotubes (FIG. 16a) and a photograph of carbon nanotubes after a treatment according to the invention with a primer and a monomer (FIG. 16b).
Figure 16B:
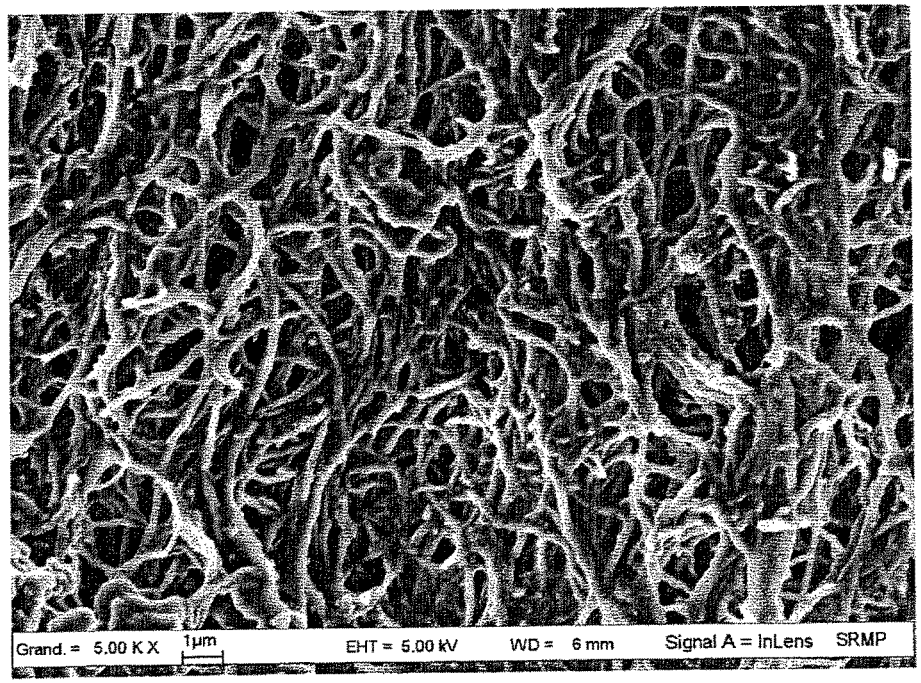

The photographs obtained by scanning electron microscopy (SEM), shown in FIG. 16, correspond to nanotubes before (FIG. 16a) and after (FIG. 16b) treatment.

Example II-11—Preparation of a Film on a PTFE (Teflon®) Surface Using a Diazonium Salt Prepared In Situ and HEMA in the Presence of Iron Filings 4 ml of a solution of NaNO$_2$ at 0.1 M in water were added to 4 ml of a solution of p-phenylenediamine at 0.1 M in HCl (0.5 M) so as to form the diazonium salt. 1 ml of HEMA, then 200 mg of iron filings were added to this diazonium salt solution. A Teflon® part measuring 4 cm$^2$ was then introduced to the reaction medium for 15 min, the plate was then rinsed in water and acetone and exposed to ultrasound in DMF, then water, before being dried.

Figure 17:
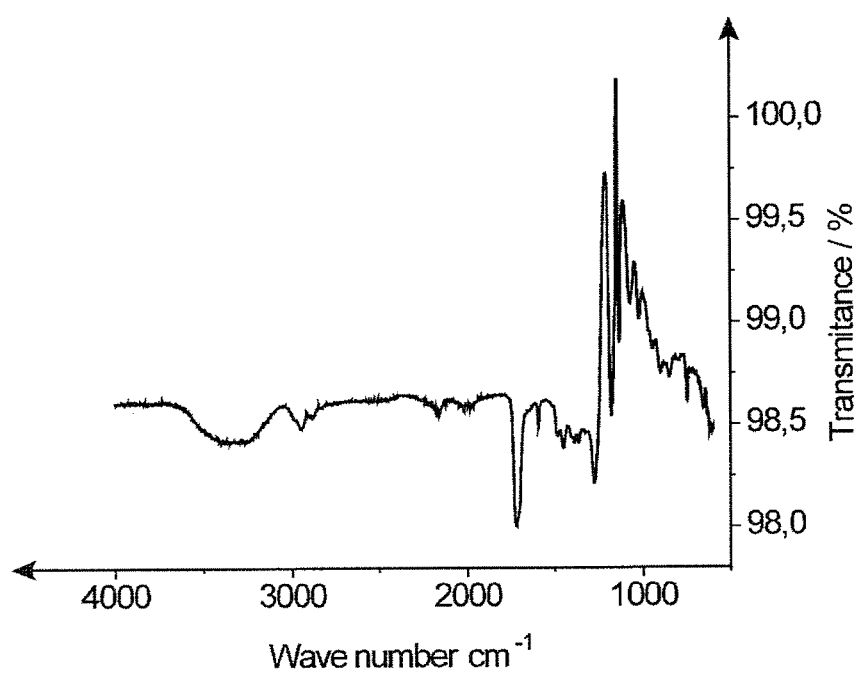
FIG. 17 shows the IR spectrum of a PTFE plate treated according to the method of this invention with a primer and a monomer.

The spectrometry and IR analyses (FIG. 17) confirm the presence of the expected film, the thickness of which increases with the reaction time.

Example II-12—Application of the Method to Different Samples

The method was successfully applied to a large number of samples of various types, and different monomers were used. The diazonium salt used in this example was prepared in situ using p-phenylenediamine.

The results obtained for each type of sample according to the monomer are shown in table 4 below. For each of the samples tested, the presence of the organic film was verified using IR spectra.

TABLE 4

| Support | Monomer | Time (min) | Film |
| --- | --- | --- | --- |
| Gold | HEMA | 15 | yes |
| Gold | Acrylic acid | 15 | yes |
| Gold | Acrylonitrile | 15 | yes |
| Silicon wafer | HEMA | 20 | yes |
| Silicon wafer | Acrylic acid | 20 | yes |
| Silicon wafer | Acrylonitrile | 20 | yes |
| Aluminum | HEMA | 30 | yes |
| Aluminum | Acrylic acid | 30 | yes |
| Aluminum | Acrylonitrile | 30 | yes |
| Nanotubes(c) | HEMA | 15 | yes |
| Nanotubes (c) | Acrylic acid | 15 | yes |
| Felt | HEMA | 15 | yes |
| Felt | Acrylic acid | 15 | yes |
| Felt | Acrylonitrile | 15 | yes |
| Platinum | HEMA | 15 | yes |
| Platinum | Acrylic acid | 15 | yes |
| Platinum | Acrylonitrile | 15 | yes |
| Stainless steel | HEMA | 15 | yes |
| Stainless steel | Acrylic acid | 15 | yes |
| Stainless steel | Acrylonitrile | 15 | yes |
| Zinc | HEMA | 15 | yes |
| Zinc | Acrylic acid | 15 | yes |
| Zinc | Acrylonitrile | 15 | yes |
| Titanium | HEMA | 15 | yes |
| Titanium | Acrylic acid | 15 | yes |
| Titanium | Acrylonitrile | 15 | yes |
| Nickel | HEMA | 15 | yes |
| Nickel | Acrylic acid | 15 | yes |
| Nickel | Acrylonitrile | 15 | yes |
| Wood | HEMA | 45 | yes |
| Paper | HEMA | 45 | yes |
| Cotton | HEMA | 45 | yes |
| Teflon ® | HEMA | 30 | yes |

Example II-13—Preparation of a Film on Surfaces of Different Types (Gold Plate and Titanium Plate) for the Same Solution 4 ml of a solution of NaNO$_2$ at 0.1 M in water were added to a solution of p-phenylenediamine at 0.1 M in HCl (0.5 M). 1 ml of HEMA, then 200 mg of iron filings were added to this diazonium salt solution. A gold plate and simultaneously a titanium plate measuring 4 cm$^2$ were then placed in the reaction medium for 15 min. The plates were then rinsed with water and acetone, and subjected to ultrasound in DMF, then water, before being dried.

The spectrometry and IR analyses (FIG. 18) confirm the presence of the expected film for the two substrates.

Example II-14—Preparation of a Film on a Glass Plate Using a Diazonium Salt Prepared In Situ and Butylmethacrylate in the Presence of Iron Filings 200 mg of iron filings, then a dispersion of 1 ml of butylmethacrylate (BUMA) in 10 ml of water prepared by ultrasound were added to a diazonium salt solution prepared according to example II-2 and containing a glass plate that has been pre-cleaned by a "piranha" solution treatment (i.e. a mixture of 60/40 by volume of concentrated sulfuric acid and water oxygenated at 110 volumes). After a reaction time of 10 minutes, the plate is then cleaned and dried according to the procedures described above.

A spot test was then performed on the glass plate thus coated (FIG. 19b) and on a pristine glass plate used as a control (FIG. 19a). A change in the physical property of the glass plate thus coated, which becomes water-repellent, can be observed by the variation in the surface angle between the drop and the surface.

Example II-15—Preparation of a Film on a Gold Plate Having a Commercial Ink Mask Based on a Diazonium Salt Prepared In Situ and Hydroxyethylmethacrylate (HEMA) or Acrylic Acid (AA) in the Presence of Iron Fillings The protocol used is identical to that of example II-2 for HEMA and 5 for AA. Prior to its introduction to the reaction medium, the plate was coated with a mask: different patterns were produced on the gold plate using a black-colored ink felt pen (Staedtler®-Lumocolor®).

After reaction, the plate was washed with water, DMF and acetone in order to remove the reaction products, then washed more vigorously with ultrasound with the same solvents. The surface was then rinsed again with acetone, then dried before being analyzed by Infrared spectroscopy (IR) (C=O bands for each of the polymers) and by Atomic Force Microscopy (AFM).

Figure 20A:
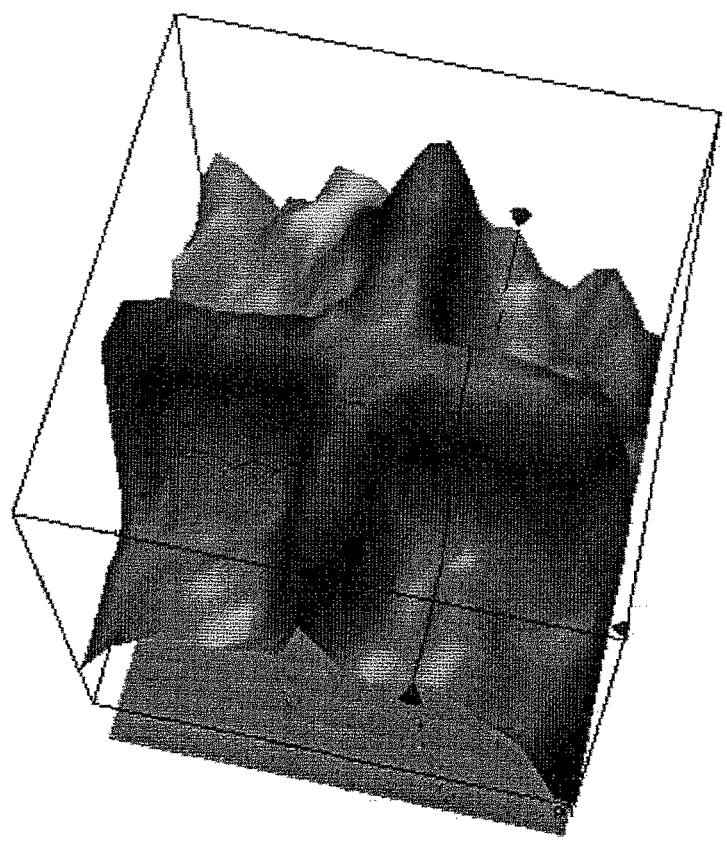
FIG. 20 shows the IR/AFM mapping obtained for gold plates coated with a commercial ink mask after treatment by the process in the presence of hydroxyethylmethacrylate (FIG. 20a) or acrylic acid (FIG. 20b) and removal of the mask.
Figure 20B:
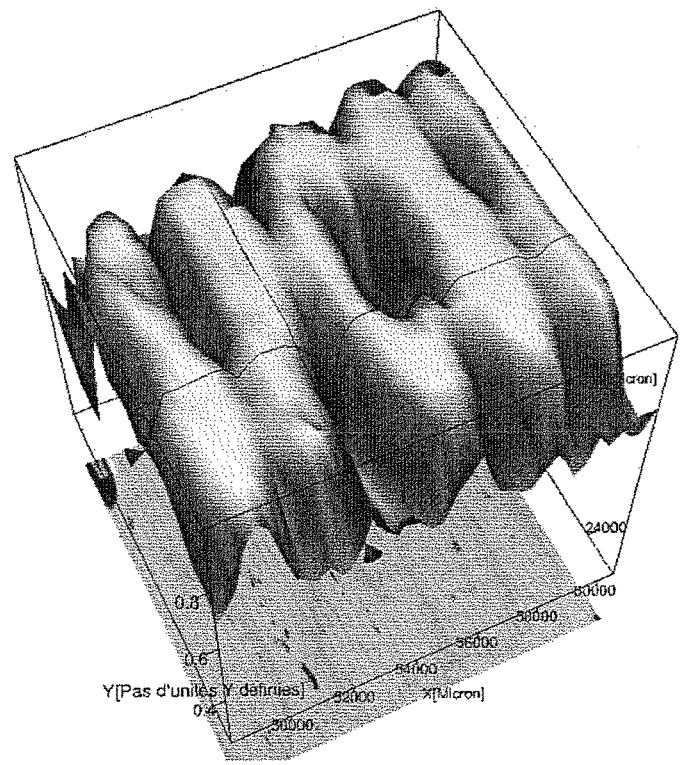

The different mappings (IR/AFM) obtained are shown in FIG. 20. FIG. 20A shows the presence of a cross-shaped pattern and FIG. 20B shows another pattern, which are not covered by the organic film (it is a transmittance measurement, also, the areas in relief correspond to non-grafted areas).

Example II-16—Preparation of a Film on a Gold Plate Having a Thiol Mask Based on a Diazonium Salt Prepared in Situ and Acrylic Acid (AA) in the Presence of Iron Fillings The protocol used is identical to that of example II-15. Prior to its introduction into the reaction medium, a drop of long-chain (C18) ethanolic thiol solution was deposited on the plate, and the plate was treated after evaporation of the ethanol.

After the treatment, the plate was then cleaned and analyzed as in example II-15.

Figure 21A:
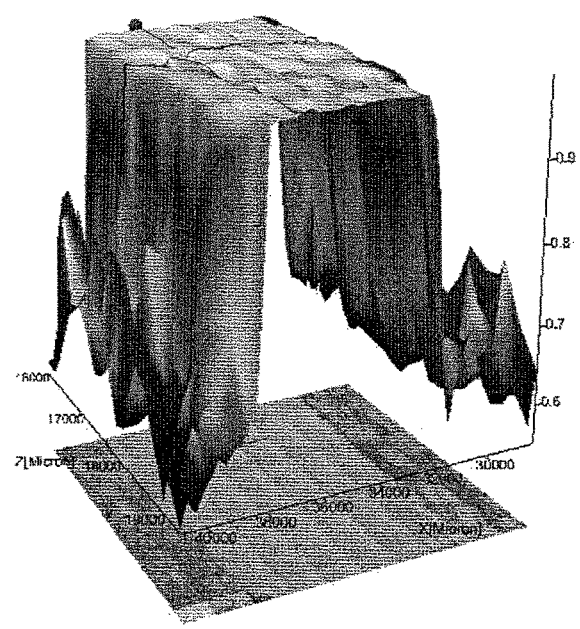
FIG. 21 shows the IR/AFM mapping obtained for a gold plate coated with a thiol mask after treatment by the process in the presence of acrylic acid and removal of the mask.
Figure 21B:
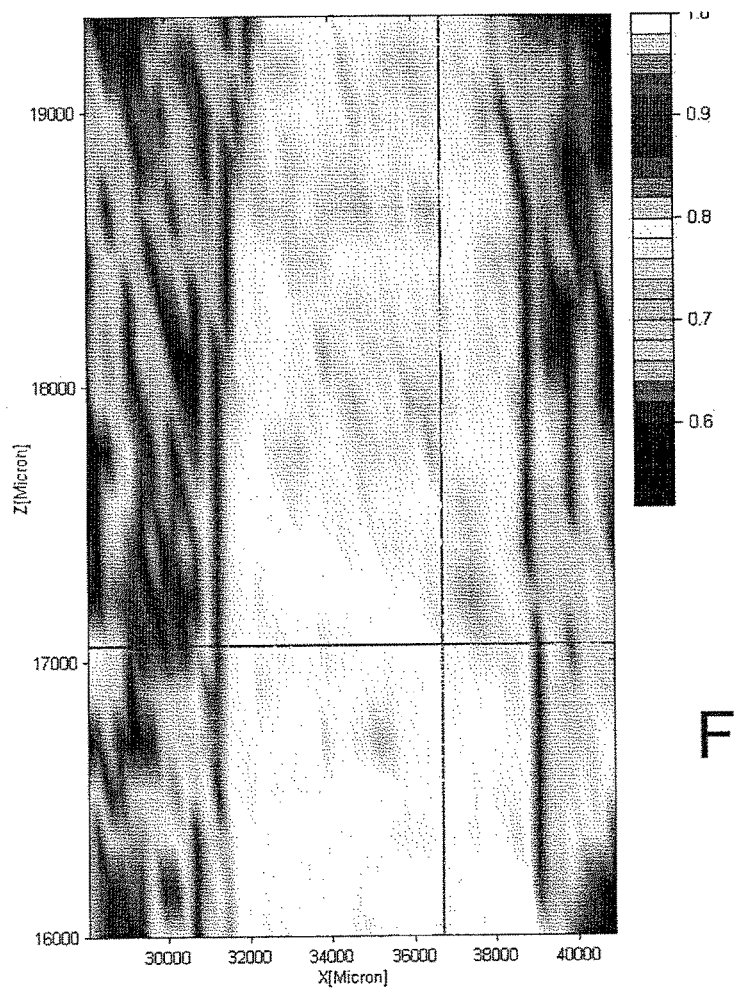

The IR/AFM mapping is shown in FIGS. 21a and 21b, which respectively show a three-dimensional view (a transmittance measurement, also, the areas in relief correspond to the non-grafted areas) and a planar view of the plate (the light area corresponding to the non-grafted area). It can be noted in these figures that the areas that were covered with the mask do not have a grafted film.

Example II-17—Preparation of a Film on a Gold Surface Having a Thiol Microprinted Mask Based on a Diazonium Salt Prepared In Situ and Hydroxyethylmethacrylate (HEMA) in the Presence of Iron Fillings The protocol used is identical to that of example II-15. Prior to its introduction into the reaction medium, the plate is covered with a thiol mask using a PDMS (polydimethylsiloxane) buffer having micrometric patterns and previously impregnated with a long-chain (C18) ethanolic thiol solution. The plate was treated after evaporation of the ethanol.

After the treatment, the plate was cleaned and analyzed as in example II-15.

Figure 22A:
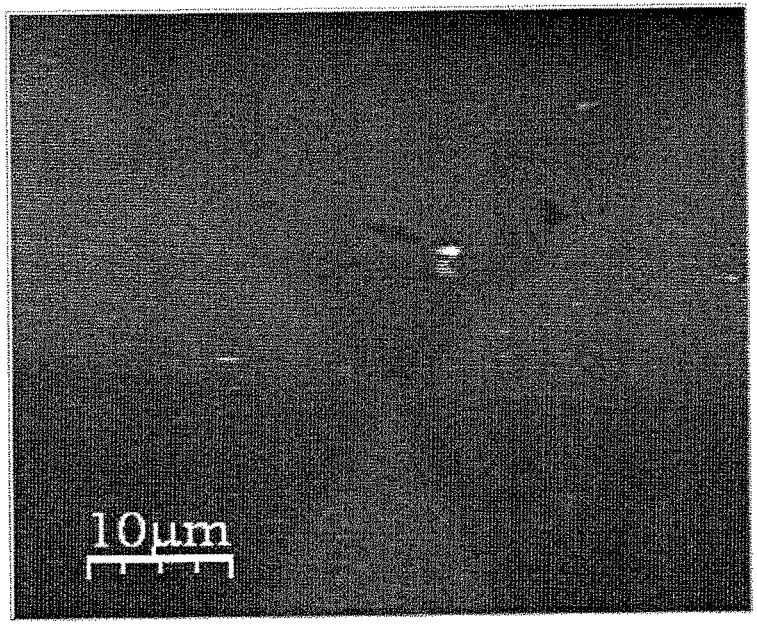
FIG. 22 shows the IR/AFM mapping obtained for a gold plate coated with a thiol mask after treatment by the process in the presence of hydroxyethylmethacrylate and removal of the mask with different patterns (FIG. 22a and FIG. 22b).
Figure 22B:
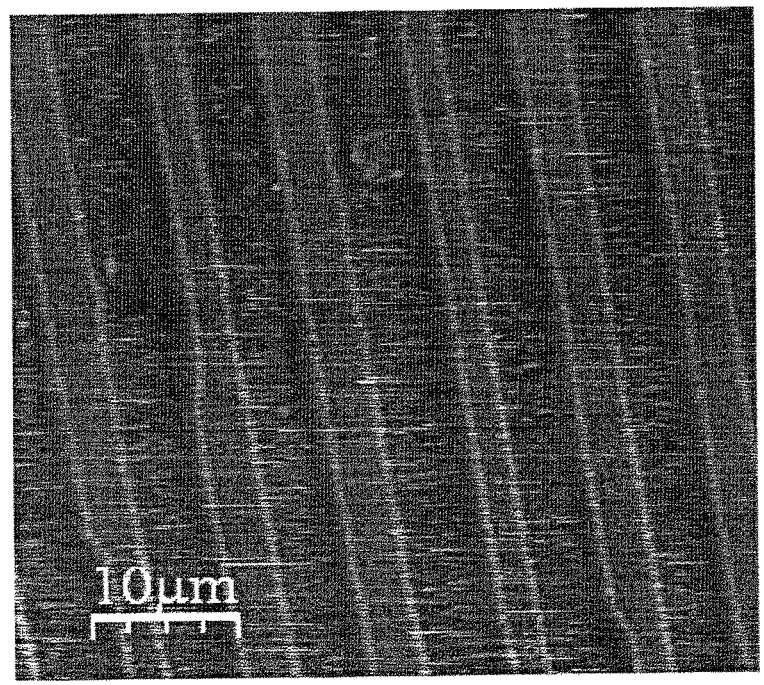
Figure 23:
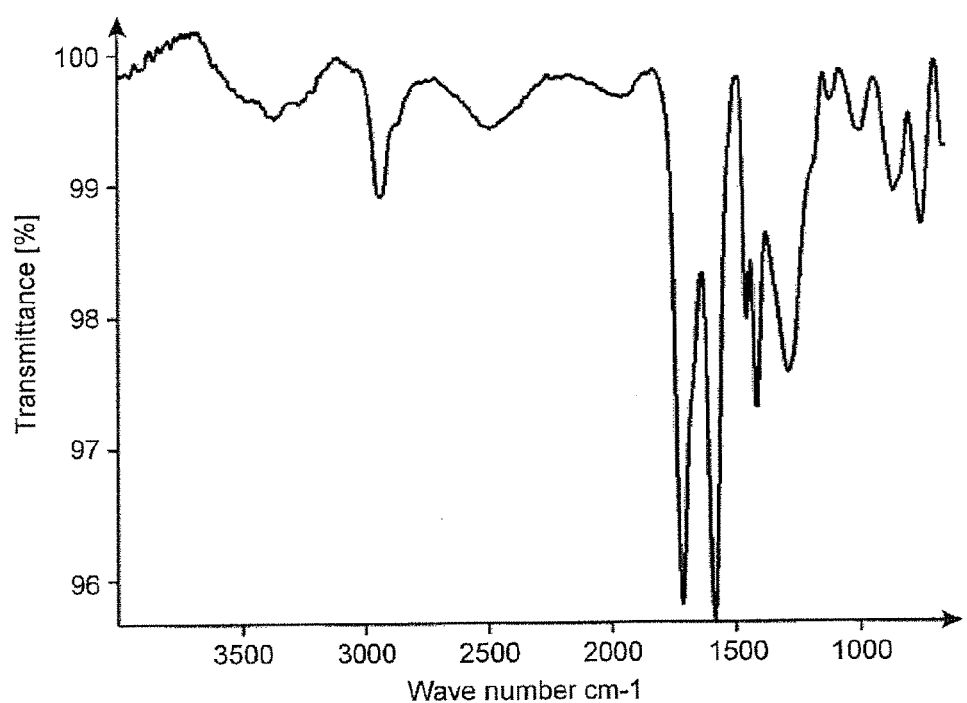
FIG. 23 shows the IRRAS spectrum of a gold plate coated with a film comprising PHEMA and a cyclodextrin derivative.

The AFM mapping is shown in FIG. 22a, which shows that the grafted surface corresponds to the reverse of the triangular micrometric patterns appearing on the buffer and in FIG. 22b, which shows micrometric patterns corresponding to lines (a transmittance measurement, also, the areas in relief correspond to the non-grafted areas).

Example II-18—Preparation of a Film on a Gold Plate Using a Diazonium Salt from Para-Benzylamine, Prepared In Situ in the Presence of Non Porous Electron Irradiated PVDF Membrane and with Acetonitrile (ACN)

4 ml of a solution of $NaNO_2$ at 0.1 M in water were added to 4 ml of a solution of para-benzylamine at 0.1 M in HCl (0.5 M), in order to form the diazonium salt.

To 4 ml of this solution, were added to 4 ml of acetonitrile (ACN). An electron irradiated PVDF membrane (2 $cm^2$, thickness 9 μm, electron irradiation dose: 100 kGy) was substituted for iron filings presented in the former examples. A gold plate was then added to the reaction medium for 15 min. The plate was then rinsed in water with acetone, and subjected to ultrasound in DMF and then a basic soda solution with a pH=9.5 so as to deprotonate the primary amine, before being dried.

The IR analyses confirmed the presence of the expected film, of which the thickness increased with the reaction time.

Example II-19—Preparation of a Film on a Gold Plate Using a Diazonium Salt from Para-Benzylamine, Prepared In Situ in the Presence of Nanoporous Electron Irradiated PVDF Membrane and with Acetonitrile (ACN)

4 ml of a solution of $NaNO_2$ at 0.1 M in water were added to 4 ml of a solution of para-benzylamine at 0.1 M in HCl (0.5 M), in order to form the diazonium salt.

A nanoporous electron irradiated PVDF membrane (2 $cm^2$, thickness 9 μm, electron irradiation dose: 100 kGy, fluence: $10^{10}$ pores/$cm^2$, pore diameter: 50 nm) was substituted for iron filings presented in the former examples. A gold plate was then added to the reaction medium for 15 min. The plate was then rinsed in water with acetone, and subjected to ultrasound in DMF and then a basic soda solution with a pH=9.5 so as to deprotonate the primary amine, before being dried.

The IR analyses confirmed the presence of the expected film, of which the thickness increased with the reaction time.

Example II-20—Preparation of a Film on a Gold Plate Using a Diazonium Salt from Para-Benzylamine, Prepared In Situ in the Presence of Non Porous Electron Irradiated PVDF Membrane and With Acrylic Acid (AA)

6.5 ml of a solution of $NaNO_2$ at 0.1 M in water were added to 6.5 ml of a solution of para-benzylamine at 0.1 M in HCl (0.5 M), in order to form the diazonium salt.

To this solution, were added to 2 ml of acrylic acid (AA) and the resulting solution was bubbled with Ar for 15 min.

An electron irradiated PVDF membrane (2 $cm^2$, thickness 9 μm, electron irradiation dose: 100 kGy) was substituted for iron filings presented in the former examples. A gold plate was then added to the reaction medium for 15 min under inert atmosphere (Ar). The plate was then rinsed in water with acetone, and subjected to ultrasound before being dried.

The IR analyses confirmed the presence of the expected film, of which the thickness increased with the reaction time.

Example II-21—Preparation of a Film on a Gold Plate Using a Diazonium Salt from Para-Benzylamine, Prepared In Situ in the Presence of Nanoporous Electron Irradiated PVDF Membrane and With Acrylic Acid (AA)

6.5 ml of a solution of $NaNO_2$ at 0.1 M in water were added to 6.5 ml of a solution of para-benzylamine at 0.1 M in HCl (0.5 M), in order to form the diazonium salt.

To this solution, were added to 2 ml of acrylic acid (AA) and the resulting solution was bubbled with Ar for 15 min.

A nanoporous electron irradiated PVDF membrane (2 $cm^2$, thickness 9 µm, electron irradiation dose: 100 kGy, fluence: $10^{10}$ pores/$cm^2$, pore diameter: 50 nm) was substituted for iron filings presented in the former examples. A gold plate was then added to the reaction medium for 15 min under inert atmosphere (Ar). The plate was then rinsed in water with acetone, and subjected to ultrasound before being dried.

The IR analyses confirmed the presence of the expected film, of which the thickness increased with the reaction time.

Example II-22—Preparation of a Film on a Gold Plate Using a Diazonium Salt from Para-Benzylamine, Prepared In Situ in the Presence of Non Porous Electron Irradiated PVDF Membrane and with Acrylic Acid (AA) and Acetonitrile (ACN)

4 ml of a solution of $NaNO_2$ at 0.1 M in water were added to 4 ml of a solution of para-benzylamine at 0.1 M in HCl (0.5 M), in order to form the diazonium salt.

To 4 ml of this solution, were added to 11 ml of acetonitrile (ACN) and 2 ml of acrylic acid (AA), the resulting solution was then bubbled with Ar for 15 min.

An electron irradiated PVDF membrane (2 $cm^2$, thickness 9 µm, electron irradiation dose: 100 kGy) was substituted for iron filings presented in the former examples. A gold plate was then added to the reaction medium for 15 min under inert atmosphere (Ar). The plate was then rinsed in water with acetone, and subjected to ultrasound before being dried.

The IR analyses confirmed the presence of the expected film, of which the thickness increased with the reaction time.

Example II-23—Preparation of a Film on a Gold Plate Using a Diazonium Salt from Para-Benzylamine, Prepared In Situ in the Presence of Nanoporous Electron Irradiated PVDF Membrane and with Acrylic Acid (AA) and Acetonitrile (ACN)

4 ml of a solution of $NaNO_2$ at 0.1 M in water were added to 4 ml of a solution of para-benzylamine at 0.1 M in HCl (0.5 M), in order to form the diazonium salt.

To 4 ml of this solution, were added to 11 ml of acetonitrile (ACN) and 2 ml of acrylic acid (AA), the resulting solution was then bubbled with Ar for 15 min.

A nanoporous electron irradiated PVDF membrane (2 $cm^2$, thickness 9 µm, electron irradiation dose: 100 kGy, fluence: $10^{10}$ pores/$cm^2$, pore diameter: 50 nm) was substituted for iron filings presented in the former examples. A gold plate was then added to the reaction medium for 15 min under inert atmosphere (Ar). The plate was then rinsed in water with acetone, and subjected to ultrasound before being dried.

The IR analyses confirmed the presence of the expected film, of which the thickness increased with the reaction time.

Example II-24—Preparation of a Film on a Gold Plate Using Commercial p-Nitophenyldiazonium and 2-Hydroxyethylmethacrylate (HEMA) in the Presence of Ferrocene At 2 ml of dimethylformamid (DMF) were added 0.04 mole of ferrocene and 1 ml of HEMA (3 $10^{-3}$ M). At this solution were added 2 ml of 0.015 mole p-nitrophenyldiazonium tetrafluoroborate solution in DMF. A gold plate was then added to the reaction medium for 30 minutes. The plate was then rinsed with DMF, acetone, and subjected to ultrasounds in DMF (3 minutes) and then rinsed in acetone before being dried.

The IR analyses confirm the presence of the film expected, of which the thickness increases with the reaction time. The specific poly-HEMA bands at 1726, 1454 and 1166 $cm^{-1}$ are visible on the IR spectrum of a plate after the treatment.

Example II-25—Preparation of a Film on the Surface of Multiwall Carbon Nanotubes (MWCNTs) Using Commercial p-Nitophenyldiazonium and Butylmethacrylate (BUMA) in the Presence of Ferrocene 10.2 mg of MWCNTs were subjected to ultrasounds in 8 ml of DMF. At this solution was added 5 ml of a solution of BUMA and 0.04 mole of ferrocene. The resulting mixture was stirred during 3 minutes and then 0.015 mole of p-nitrophenyldiazonium tetrafluoroborate were added. After a 2 hours reaction, the nanotubes were filtered and washed several times with DMF and acetone. Finally, the MWCNTs were dried in a vacuum oven (100° C., $10^{-2}$ Torr).

The XPS spectrometry (X photoelectron spectroscopy) and scanning electrons microscopy (SEM) analyses confirm the presence of the film expected, of which the thickness increases with the reaction time.

Example II-26—Preparation of a Film on the Surface of a Carpet of Multiwall Carbon Nanotubes (MWCNTs) Using Commercial p-Nitophenyldiazonium and 2-Hydroxyethylmethacrylate (HEMA) in the Presence of Ferrocene At 12 ml of DMF were added 0.04 mole of ferrocene, 5 ml of HEMA and the carpet of MWCTs supported by a silicon substrate (1 $cm^2$ area, length of the tubes 275 µm). At this solution was added 103.9 mg (0.015 mole) of p-nitrophenyldiazonium tetrafluoroborate. After 2 hours reaction, the nanotubes were rinsed several times with DMF and acetone. Finally, the MWCNTs were dried in a vacuum oven (100° C., $10^{-2}$ Torr).

The XPS spectrometry (X photoelectron spectroscopy) and scanning electrons microscopy (SEM) analyses confirm the presence of the film expected, of which the thickness increases with the reaction time.

III—Functionalisable Films

Example III-1—Film Comprising PHEMA and CD Functionalization on a Gold Plate Per-(3,6)-anhydro-β-cyclodextrine (PaCD) (M=1008 g/mol) was first prepared according to the protocol described in Gadelle, A.; Defaye, *J. Angew. Chem.*, Int. Ed. Engl. 1991, 30, 78. The carboxylic acid function of PaCD (10 mg) was then activated by forming an activated ester using N,N'-diisopropylcarbodiimide (DIC) (6 eq.) in DMF (5 ml) under agitation for 6 hours in the presence of catalytic amounts (0.05 eq.) of dimethyl amino pyridine (DMAP).

A gold plate with a surface of 2 cm$^2$ coated with a film, around 10 nm in thickness, comprising poly(2-hydroxyethyl)methacrylate (PHEMA) and produced according to the modalities of example II-3, was placed in a closed test tube containing 6 ml of DMF as well as the activated PaCD.

The reaction mixture was left under agitation for 72 hours at room temperature, then the plate was removed and rinsed in DMF and acetone before being dried.

An XPS and IRRAS analysis confirms that the film comprises a cyclodextrin functionalization.

The capture of lead by a film comprising CD functionalization such as those of this example was demonstrated using a quartz scale (QCM 922 SEIKO®). A quartz with a gold deposit (supplied by SEIKO) comprising a film as produced above was immersed in a solution of PbNO$_3$ (10$^{-4}$ M) for 130 s. The variation in the resonance frequency of the quartz demonstrates the complexing.

Example III-2—Film Comprising PAA and CD Functionalization, Comprising a Linking Group, on a Gold Plate The PaCD was prepared according to example II-1. A propanol spacer was added to the PaCD to form a functionalizing compound comprising a linking group (LG).

NaH (350 mg; 28 eq.) and 3-bromo-1-propanol (0.6 ml; 28 eq.) were added to a solution of PaCD (250 mg) in DMF (10 ml). After 24 hours, methanol (5 ml) is added to the reaction medium, then the solution is evaporated and the solid obtained is solubilised in water (0.5 ml) before being precipitated in acetone (300 ml). After filtration, the beige solid obtained is filtered on a Büchner funnel and dried. A mixture of propanol spacer PaCDs in various degrees, from 4 to 14 propanols, is obtained.

A gold plate with a surface of 2 cm$^2$ with a PAA film of around 100 nm, prepared according to the modalities of example II-2 from acrylic acid, was placed in a test tube containing the mixture of propanol spacer PaCDs (10 mg) solubilised in DMF (6 ml).

The reaction medium was left under agitation for 72 hours at room temperature, then the plate was removed and rinsed in DMF and acetone before being dried.

The XPS analysis confirmed the presence of cyclodextrin. Indeed, the peak of 01, at 534 eV that appears is typical of the ester bonds of cyclodextrin. Similarly, on the spectrum of C$_1$, the peak centered at 289 eV corresponds to C=O bonds.

On the IRRAS spectrum, an intense band at 1740 cm$^{-1}$ appears, typical of the valence band C=O (ester), which confirms the formation of an ester. In addition, the bands appearing at 1250 cm$^{-1}$ typical of C—O bonds (valence band) demonstrate the presence of cyclodextrin on the substrate.

The capture of lead by a film comprising CD functionalization such as those of this example was demonstrated using a quartz scale (QCM 922 SEIKO®). A quartz with a gold deposit (supplied by SEIKO) comprising a film as produced above was immersed in a solution of PbNO$_3$ (10$^{-4}$ M) for 180 s. The variation in the resonance frequency of the quartz demonstrates the complexing.

Example III-3—Film Comprising PHEMA and Calixarene Functionalization on a Gold Plate In this example, the derivative of calixarene shown below, which was produced according to the literature (Bulletin of the Korean Chemical Society (2001), 22(3), 321-324), was used.

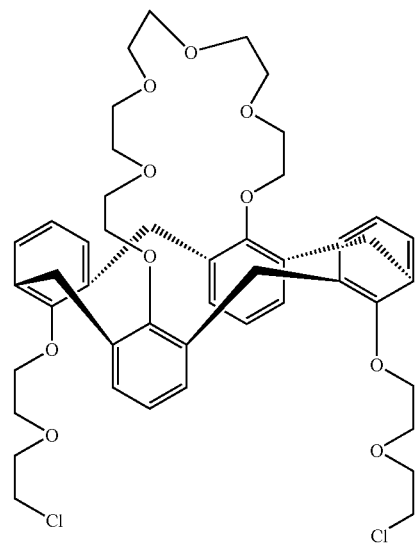

A gold plate with a surface of 2 cm$^2$ coated with a film, around 5 nm in thickness, comprising poly(2-hydroxyethyl)methacrylate (PHEMA) and produced according to the modalities of example II-3, was placed in a closed test tube containing 10 ml of dichloromethane as well as 10 mg of K$_2$CO$_3$. 20 mg of a calix[4]arene derivative were added to this solution, and the reaction medium was brought to reflux under agitation for 72 h. The plate was then rinsed with acetone, water and dichloromethane.

Figure 24:
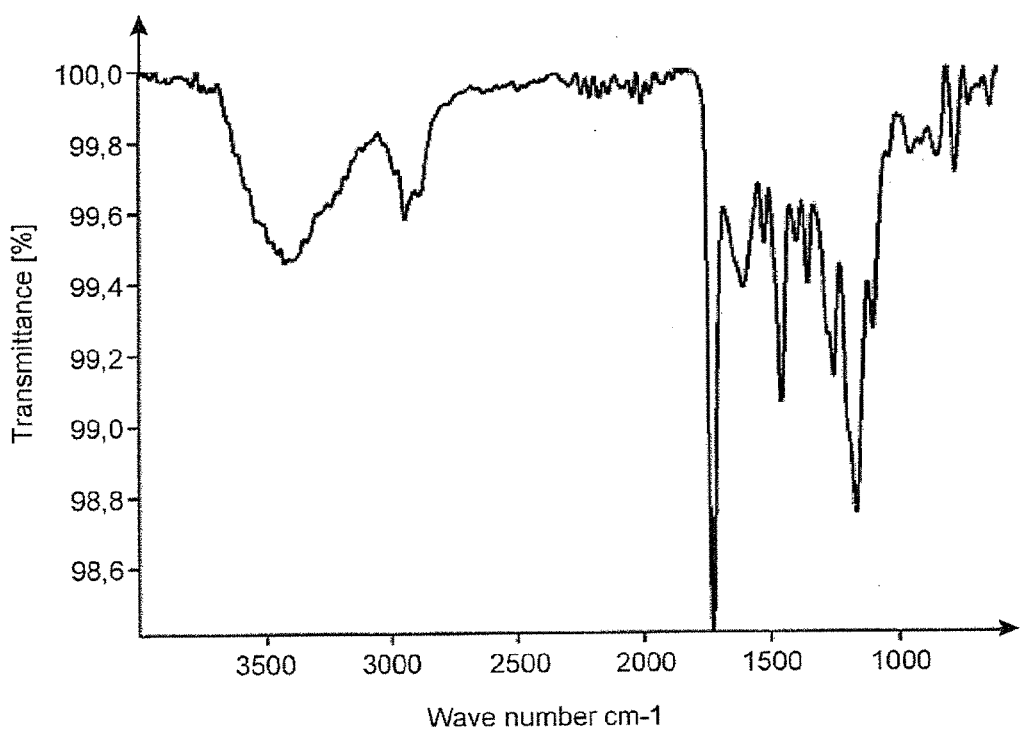
FIG. 24 shows the IRRAS spectrum of a gold plate coated with a film comprising PHEMA and a calixarene derivative.

On the IRRAS spectrum, shown in FIG. 24, a band at 1600 cm$^{-1}$ appears, which is typical of the C=C band (aromatic) (valence band), demonstrating the presence of calixarene grafted on the film.

Example III-4—Film Comprising Polybenzyl Amine and Porphyrin Functionalization on a Gold Plate A porphyrin of which the carboxylic acid function was activated by the formation of an activated ester was used. The activated ester was formed by a reaction of tetrakis (benzoic acid)-4,4',4"4'"-(Porphyrin-5,10,15,20-tetrayl) (10 mg; 1.26 10$^{-5}$ mol) with N,N'-diisopropylcarbodiimide (6 eq.) in DMF in the presence of a catalytic amount of DMAP (0.05 eq).

A gold plate with a surface of 2 cm$^2$ comprising a polybenzyl amine film, with a thickness of 0.6 nm and prepared according to the modalities of example I-1, was placed in a round-bottom flask containing the activated porphyrin.

The reaction medium was left under agitation for 72 h at room temperature, then the plate was removed and rinsed in DMF and acetone before being dried.

Figure 25A:
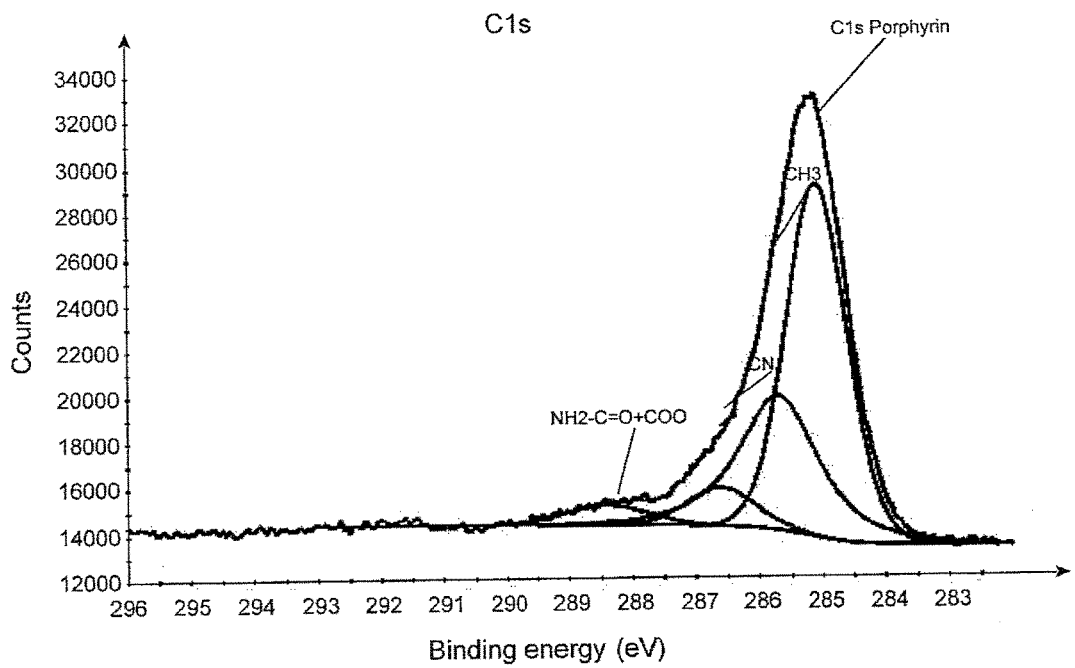
FIG. 25 shows the XPS spectra $C_{1s}$ (25a) and $N_{1s}$ (25b) of a gold plate coated with a film developed from a single primer and comprising a porphyrin derivative.
Figure 25B:
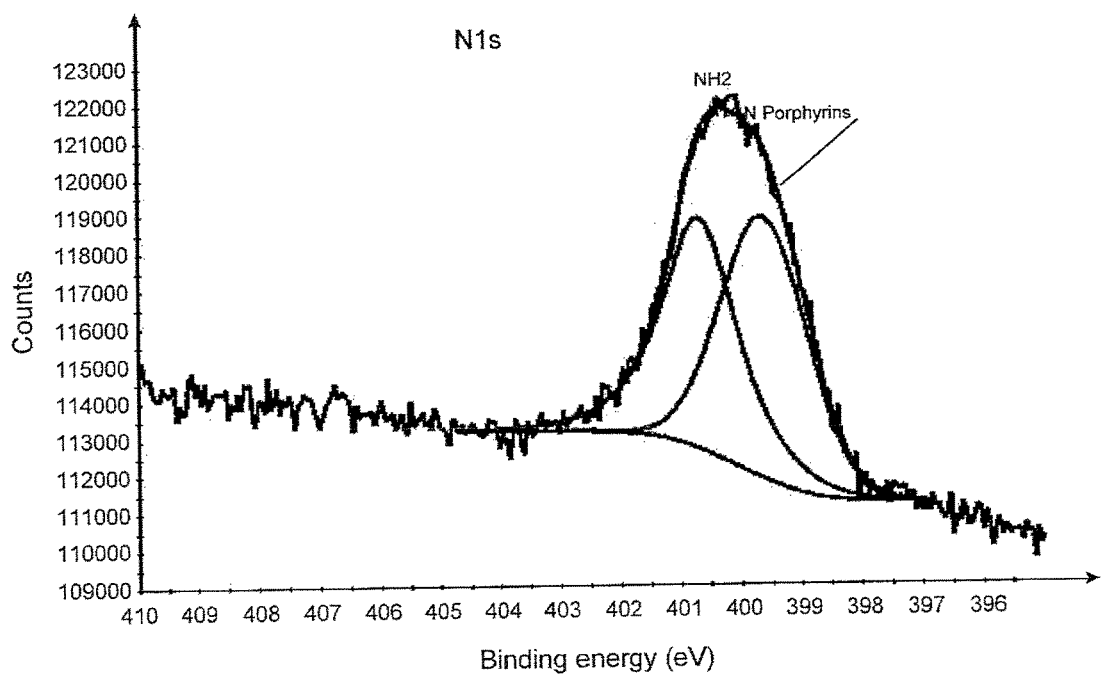

The XPS analysis confirmed the presence of porphyrin on the film. Indeed, the peak centered at 189.5 eV on the spectrum of $C_1$, shown in FIG. 25a, corresponds to the C=C bond of the amide that is formed with the surface as well as the porphyrin acids not attached to the film. Similarly, the spectrum $N_{1S}$, shown in FIG. 25b, is composed of two peaks of which one, centered at 399.5 eV, is typical of the nitrogens included in an aromatic cycle and corresponds to that of the porphyrin nitrogens.

IV—Films Comprising Nano-Objects

Figure 26:
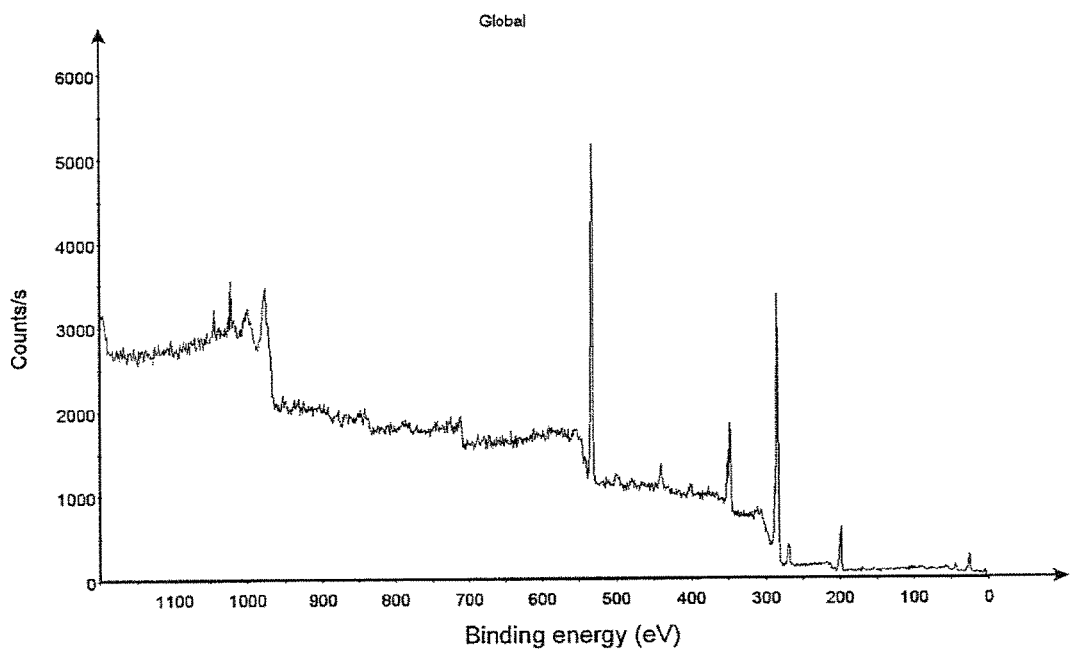
FIG. 26 shows an XPS spectrum (global) of a film comprising PAA, grafted on a gold plate, before incorporation of the Pt nanoparticles.
Figure 27:
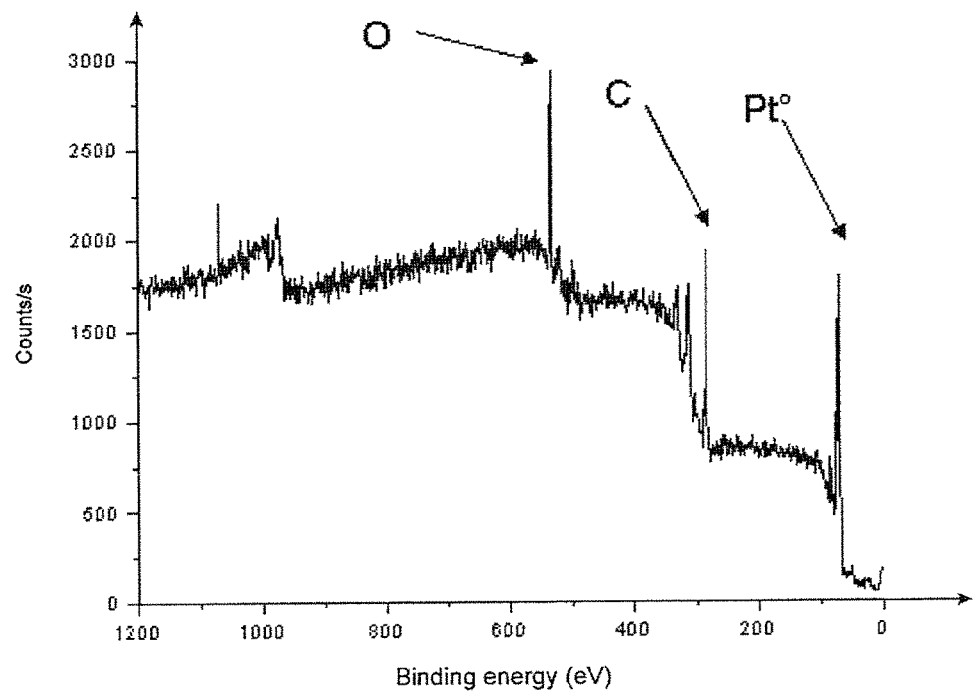
FIG. 27 shows an XPS spectrum (global) of a film comprising PAA, grafted on a gold plate, after incorporation of the Pt nanoparticles.

Example IV-1—Incorporation of Platinum Nanoparticles in a Film Comprising Polyacrylic Acid Grafted on Au An organic copolymer film derived from acrylic acid (AA) and a diazonium salt prepared in situ, grafted on a gold plate and comprising platinum nanoparticles was prepared.
1-1. Synthesis of the Stabilizer: HEA-16-Cl
In a 50-ml round-bottom flask equipped with a coolant, 29.2 mmol of N—N-dimethyl ethanolamine and 35 mmol (1.2 eq) of hexadecyl chloride were dissolved in 15 ml of absolute ethanol. The mixture was then brought to reflux for 24 h. The ethanol was then evaporated and the reaction mixture cooled at room temperature. The white solid that formed was recrystallised in an acetone/ethanol mixture to yield the N,N-dimethyl-N-hexadecyl-N-(2-hydroxyethyl) ammonium chloride denoted HEA-16-Cl.
1-2. Preparation of the Colloidal Suspension of Platinum (0): Pt-HEA-16-Cl
The colloidal suspension was prepared at 20° C. 3.6 mg of sodium borohydride ($NaBH_4$) were added to 300 mg of HEA-16-Cl dissolved in 5 ml of ultra pure water. This solution was then rapidly added under vigorous agitation to 5 ml of ultra pure water containing 12 mg of platinum tetrachloride ($PtCl_4$). The reduction of the Pt(IV) into Pt(0) is characterized by a change in coloring from pale yellow to black/brown. The suspension was left for one hour under mechanical agitation before use. This suspension is stable for a number of weeks.
1-3. Grafting of a Film Comprising Polyacrylic Acid on Au
In a 50-ml beaker, the following were added, in order: 2 ml of 1-4 diaminophenyl (0.1 M), 2 ml of sodium nitrite ($NaNO_2$, 0.1 M) and 1 ml of acrylic acid (AA). 50 mg of iron powder were then added to the solution and a 5 cm$^2$ gold plate was placed in the medium. After 45 minutes, the plate was removed from the reaction medium, then rinsed (water/ethanol/acetone) and dried.
An XPS analysis confirmed the presence of the PAA film.
1-4. Incorporation of Pt Nanoparticles in the Film Comprising PAA
First, the gold plate coated with the organic film was immersed in a soda solution 0.5 M for 5 minutes, then dried without additional rinsing. This step made it possible to convert the carboxylic acid groupings, precursor of the affinity group, of the PAA into carboxylate groupings, which have an affinity for the particles. 1 ml of a colloidal suspension of Pt(0) was then deposited on the gold plate coated with the film. After 15 minutes, the plate was rinsed (water/ethanol/acetone) before being dried and then analyzed by XPS.
The XPS analysis showed the presence of platinum (0) in a significant amount after the treatment, as shown in FIG. 27, which corresponds to an XPS spectrum of the film after integration of the particles, by comparison with FIG. 26, which corresponds to the film before incorporation of the particles.

Example IV-2—Incorporation of Gold Nanoparticles in a Film Comprising Polyacrylic Acid Grafted on Steel (AISI 316L)

An organic copolymer film derived from acrylic acid (AA) and a diazonium salt prepared in situ, grafted on a steel plate (AISI 316L) and comprising gold nanoparticles was prepared.
2-1. Synthesis of the Stabilizer: HEA-16-Cl
The stabilizer was prepared according to example I-1.
2-2. Preparation of the Colloidal Suspension of Gold (0): Au-HEA-16-Cl
The colloidal suspension was prepared at 20° C. 3.6 mg of sodium borohydride ($NaBH_4$) were added to 300 mg of HEA-16-Cl dissolved in 5 ml of ultra pure water. This solution was then rapidly added under vigorous agitation to 5 ml of ultra pure water containing 12 mg of gold salt ($AuHCl_4$). The reduction of the Au(IV) into Au(0) is characterized by a change in coloring from pale yellow to brick red. The suspension was left for one hour under mechanical agitation before use. This suspension is stable for a number of weeks.
2-3. Grafting of a Film Comprising Polyacrylic Acid on Steel (AISI 316L)
In a 50-ml beaker, the following were added, in order: 2 ml of 1-4 diaminophenyl (0.1 M), 2 ml of sodium nitrite ($NaNO_2$, 0.1 M) and 1 ml of acrylic acid (AA). 50 mg of iron powder were then added to the solution and a 5 cm$^2$ gold plate was placed in the medium. After 45 minutes, the plate was removed from the reaction medium, then rinsed (water/ethanol/acetone) and dried.
An XPS analysis confirmed the presence of the PAA film.
2-4. Incorporation of Au Nanoparticles in the Film Comprising PAA
First, the steel plate (AISI 316L) coated with the organic film was immersed in a soda solution 0.5 M for 5 minutes, then dried without additional rinsing. This step made it possible to convert the carboxylic acid groupings, precursor of the affinity group, of the PAA into carboxylate groupings, which have an affinity for the particles. 1 ml of a colloidal suspension of Au(0) was then deposited on the steel plate (AISI 316L) coated with the film. After 15 minutes, the plate was rinsed (water/ethanol/acetone) before being dried and then analyzed by XPS.
The XPS analysis showed the presence of gold (0) in a significant amount because the steel (AISI 316L) is no longer visible.

Example IV-3—Incorporation of Platinum Nanoparticles in a Film Comprising Polyacrylic Acid Grafted on Carbon Nanotubes An organic copolymer film derived from acrylic acid (AA) and a diazonium salt prepared in situ, grafted on a carbon nanotube carpet and comprising platinum nanoparticles was prepared.
3-1. Synthesis of the Stabilizer: HEA-16-Cl
The stabilizer was prepared according to the protocol described in example IV-1.
3-2. Preparation of the Colloidal Suspension of Platinum (0): Pt-HEA-16-Cl
The suspension was produced as described in example IV-1.
3-3. Grafting of a Film Comprising Polyacrylic Acid on the Nanotube Carpet
200 mg of iron filings and 1 ml of acrylic acid were added to a diazonium salt solution prepared as indicated in example II-2. Then, 100 mg of carbon nanotubes in carpet form were added. The carpet, after reaction, was cleaned according to the protocol described in example IV-2 before being dried.

3-4. Incorporation of Pt Nanoparticles in the Film Comprising PAA

First, the nanotube carpet coated with the organic film was immersed in a soda solution 0.5 M for 5 minutes, then dried without additional rinsing. This step made it possible to convert the carboxylic acid groupings, precursor of the affinity group, of the PAA into carboxylic groupings, which have an affinity for the particles. 1 ml of a colloidal suspension of Pt(0) was then deposited on the nanotube carpet coated with the film. After 15 minutes, the nanotube carpet was rinsed (water/ethanol/acetone) before being dried and then analyzed by XPS.

Figure 28:
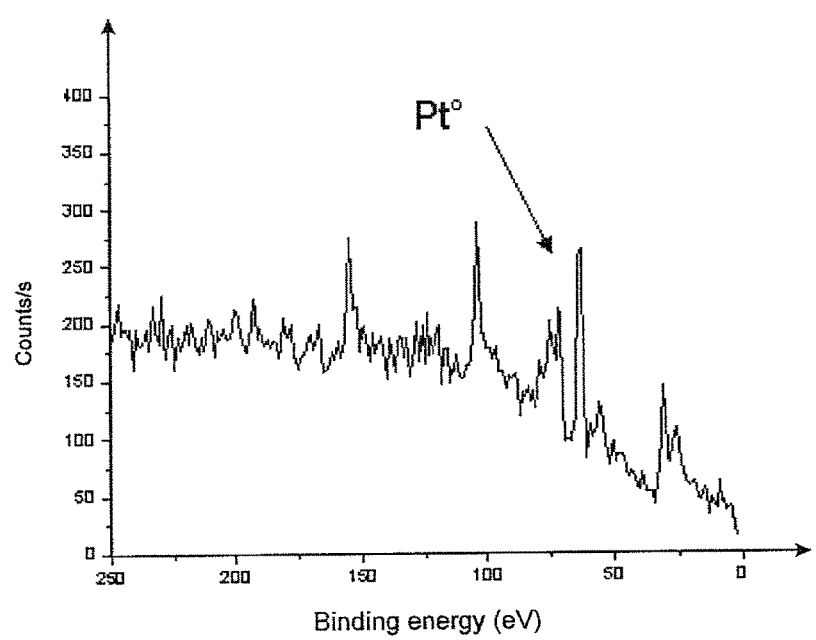
FIG. 28 shows an XPS spectrum (global) of a film comprising PAA, grafted on carbon nanotubes, after incorporation of the Pt nanoparticles.

The XPS analysis showed the presence of platinum (0) as indicated on the spectrum shown in FIG. 28.

Example IV-4—Incorporation of Platinum Nanoparticles in a Polybenzyl Amine Film Grafted on Au An organic film derived from a diazonium salt prepared in situ, grafted on a gold plate and comprising platinum nanoparticles was prepared.

4-1. Synthesis of the Stabilizer: HEA-16-Cl

The stabilizer was prepared as indicated in example IV-1.

4-2. Preparation of the Colloidal Suspension of Platinum (0): Pt-HEA-16-Cl

The procedure is identical to that of example IV-1.

4-3. Grafting of a Polybenzyl Amine Film on Au

In a 50-ml beaker, the following were added, in order: 2 ml of p-amino-benzyl amine (0.1 M), 2 ml of sodium nitrite (NaNO$_2$, 0.1 M) then, 50 mg of iron powder were then added to the solution and 5 cm$^2$ gold plate was placed in the medium. After 45 minutes, the plate was removed from the reaction medium, then rinsed (water/ethanol/acetone) and dried.

The XPS analysis confirmed the presence of the organic polybenzyl amine film.

4-4. Incorporation of Pt Nanoparticles in the Polybenzyl Amine Film

First, the gold plate coated with the organic film was immersed in a soda solution 0.5 M for 5 minutes, then dried without additional rinsing. This step made it possible to transform the ammonium groupings, precursors of the affinity group, into amino groupings that have an affinity for the particles. 1 ml of a colloidal suspension of Pt(0) was then deposited on the gold plate coated with the film. After 15 minutes, the plate was rinsed (water/ethanol/acetone) before being dried and then analyzed by XPS.

The XPS analysis showed the presence of platinum (0) in a significant amount.

Example IV-5—Incorporation of Silica Nanoparticles in a Film Comprising Polyacrylic Acid Grafted on Au An organic copolymer film derived from acrylic acid (AA) and a diazonium salt prepared in situ, grafted on a gold plate and comprising silica nanoparticles was prepared.

Small (around 12 nm in diameter), non-porous and finely divided commercial silica particles (supplied by DEGUSA®) were used.

Each particle is substantially spherical and has a specific surface of around 200 m$^2 \cdot$g$^{-1}$ and contains around 1 mmol·g$^{-1}$ of silanol groupings.

The colloidal solution of silica particles was obtained by mixing 10 mg of silica in 10 ml of distilled water.

5-1. Grafting of a Film Comprising Polyacrylic Acid on Au

The grafting was performed as indicated in example IV-1.

5-2. Incorporation of Silica Particles in the Film Comprising PAA

The incorporation of particles was performed according to the protocol of example IV-1.

The infrared analysis confirmed the presence of particles in the film.

Example IV-6—Incorporation of Platinum Nanoparticles in a Film Comprising Polyacrylic Acid Grafted on Glass and Plastic Organic copolymer films derived from acrylic acid (AA) and a diazonium salt prepared in situ, grafted on a plastic (polyethylene) and glass plate and comprising platinum nanoparticles were prepared.

The preparation of the organic films and the incorporation of the particles were performed according to the protocols presented in example IV-1.

The XPS analysis showed the incorporation of particles in each of the films.

Example IV-7—Coalescence of Nanoparticles Present in the Films

The surfaces of the glass and gold supports of the preceding examples, coated with an organic film comprising Au or Pt nanoparticles, were treated for 5 min with a heat gun at around 500° C. A modification in the surface appearance was observed during the treatment and the initial iridescent appearance disappeared, with a resulting uniformity due to the coalescence of the particles.

Example IV-8—Metallization of the Film by Chemical Reduction of a Metal Salt Solution Using Nanoparticles Present in the Film A metallization bath was prepared with two solutions, the first containing 3 g of copper sulfate, 14 g of potassium sodium tartrate and 4 g of sodium hydroxide in 100 ml of distilled water. The second solution is an aqueous formaldehyde solution with a weight percent of 37.02. The two solutions were mixed in a ratio of 10/1, and 20 ml of the resulting mixture were taken for immersion for 5 min of the supports, glass or gold, coated with an organic film comprising Au or Pt nanoparticles, obtained according to examples IV-1, IV-4 and IV-6. The surfaces of the supports were then rinsed in water and acetone, and dried under an argon flux. A change in the appearance of the surface was noted, and a metal film was obtained.

Example IV-9—Metallization of the Film by Chemical Reduction of a Metal Salt Solution Using Palladium Nanoparticles Present in the Film 9-1 Preparation of Colloïdale Tetraoctadecylammonium Bromide Stabilized Palladium Colloid (Pd/[C$_{18}$H$_{37}$]4N$^+$Br$^-$)

The tetraoctadecylammonium bromide stabilized palladium colloid (Pd/[C$_{18}$H$_{37}$]4N$^+$Br$^-$) was synthesized as follows: Palladium(II) acetate (Fluka, 4 g, 17.8 mmol) and tetraoctadecylammonium bromide (Fluka, 5 g, 4.5 mmol) were suspended in 200 mL of a 5:1 (v/v) mixture of toluene and THF at 30° C. After addition of 25 mL of absolute ethanol, the mixture was refluxed at 65° C. for 12 h. The color of the solution turned to deep brown-black.

To initiate the precipitation of the colloids, an excess (100 mL) of absolute ethanol was added slowly with vigorous shaking. The solution was allowed to stand for 5 h at room temperature to complete the precipitation.

The slightly colored supernatant solution was decanted, and the precipitate was dried under reduced pressure. A gray-black powder (2.1 g, 88% yield based on palladium) containing 79 wt % of palladium was isolated. The powder was readily re-suspended in toluene.

9-2. Grafting of Polyacrylic Acid Film on Poly-Ethylene and Poly-Propylene Plastic The grafting was performed as indicated in example IV-1. Copolymeric films derived from AA or HEMA and from an in-situ synthetized diazonium salt have been grafted on plastic supports (poly-ethylene and poly-propylene). Films derived from diazonium alone have also been synthetized. Such films have been obtained according to the protocols depicted above.

9-3 Incorporation of Colloïdal Paladium Pd/[$C_{18}H_{37}$]$_4$N$^+$ Br$^-$ in PAA Film and Metallization of this Film The incorporation of particles was performed by immersion of the coated poly-ethylene and poly-propylene supports in the toluene solution containing Pd/[$C_{18}H_{37}$]$_4$N$^+$Br$^-$ for 30 seconds, the support being then rinsed with toluene and dried. Metallization has been performed as indicated in Example IV-8.

The invention claimed is:

1. A method for preparing an organic film at the surface of a solid support, wherein it includes a step of contacting said surface with a liquid solution including:
    at least one aprotic solvent,
    at least one cleavable aryl salt and
    at least one radically polymerisable monomer different from said cleavable aryl salt, said organic film being polymeric or copolymeric and having a monomer unit sequence in which the first unit is constituted by a derivative of the cleavable aryl salt and the other units are derived from said cleavable aryl salt and from polymerizable monomers, wherein said contacting is under non-electrochemical conditions enabling formation of radical entities based on the cleavable aryl salt, wherein the cleavable aryl salts generate said radical entities without reacting with the surface on which said radical entities are intended to be grafted.

2. The preparation method of claim 1, wherein said aprotic solvent is chosen from the group constituted by dimethylformamide (DMF), acetone and dimethyl sulfoxide (DMSO).

3. The preparation method of claim 1, wherein said cleavable aryl salt is chosen from the group constituted by aryl diazonium salts, aryl ammonium salts, aryl phosphonium salts and aryl sulfonium salts.

4. The preparation method of claim 1, wherein said cleavable aryl salt is chosen from the group constituted by aryl diazonium salts, aryl ammonium salts, aryl phosphonium salts and aryl sulfonium salts and wherein said aryl group is chosen from the aromatic or heteroaromatic carbon structures, possibly mono- or polysubstituted, constituted by one or more aromatic or heteroaromatic cycles each comprising 3 to 8 atoms, the heteroatom(s) being capable of being N, O, P or S, and the substituent(s) possibly containing one or more heteroatoms or alkyl groups in $C_1$ to $C_6$.

5. The preparation method of claim 1, wherein said cleavable aryl salt has the following formula (I):

$$R-N_2^+, A^- \qquad (I)$$

in which:
    A represents a monovalent anion and
    R represents an aryl group.

6. The preparation method of claim 1, wherein said cleavable aryl salt has the following formula (I):

$$R-N_2^+, A^- \qquad (I)$$

in which:
    A represents a monovalent anion and
    R represents an aryl group chosen from the aromatic or heteroaromatic carbon structures, possibly mono- or polysubstituted, constituted by one or more aromatic or heteroaromatic cycles each comprising 3 to 8 atoms, the heteroatom(s) being capable of being N, O, P or S, and the substituent(s) possibly containing one or more heteroatoms or alkyl groups in $C_1$ to $C_6$.

7. The preparation method of claim 1, wherein said cleavable aryl salt has the following formula (I):

$$R-N_2^+, A^- \qquad (I)$$

in which:
    A represents a monovalent anion chosen from the inorganic anions, the halogenborates and the organic anions and
    R represents an aryl group.

8. The preparation method of claim 1, wherein said cleavable aryl salt is chosen from the group constituted by phenyldiazonium tetrafluoroborate, 4-nitrophenyldiazonium tetrafluoroborate, 4-bromophenyldiazonium tetrafluoroborate, 4-aminophenyldiazonium chloride, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)diazenyl]benzenediazonium sulphate, 9,10-dioxo-9,10-dihydro-1-anthracenediazonium chloride, 4-nitronaphthalenediazonium tetrafluoroborate and naphthalenediazonium tetrafluoroborate.

9. The preparation method of claim 1, wherein said cleavable aryl salt concentration in said liquid solution is between around $10^{-6}$ and 5 M.

10. The preparation method of claim 1, wherein said cleavable aryl salt is prepared in situ in said liquid solution.

11. The preparation method of claim 1, wherein said liquid solution also contains at least one surfactant.

12. The preparation method of claim 1, wherein the non-electrochemical conditions allowing for the formation of radical entities are chosen from the group constituted by thermal, kinetic, chemical, photochemical or radiochemical conditions and a combination thereof, to which the cleavable aryl salt is subjected.

13. The preparation method of claim 1, wherein the non-electrochemical conditions allowing for the formation of radical entities are chemical conditions.

14. The preparation method of claim 1, wherein said liquid solution also includes one or more chemical initiator(s).

15. The preparation method of claim 1, wherein said liquid solution also includes one or more chemical initiator(s) chosen from:
    a reducing metal in a finely divided form,
    a metallocene,
    an organic or inorganic base in proportions sufficient for the pH of the liquid solution to be greater than or equal to 4,
    a pre-irradiated polymeric matrix.

16. The preparation method of claim 1, wherein the surface of said solid support has at least one atom capable of being involved in a radical reaction.

17. The preparation method of claim 1, wherein said solid support and/or the surface of said solid support are made of a material chosen from the group constituted by metals, wood, paper, cotton, felt, silicon, carbon nanotubes, fluoropolymers and diamond.

18. The preparation method of claim 1, wherein the surface of the solid support contacted with said liquid solution comprises at least one area covered with a mask.

19. The preparation method of claim 1, wherein the surface of the solid support contacted with said liquid solution comprises at least one area covered with a mask and wherein the mask is not soluble in the solvent of said liquid solution.

20. The preparation method of claim 1, wherein the surface of the solid support contacted with said liquid solution comprises at least one area covered with a mask composed of alkylthiols.

21. The preparation method of claim 1, wherein said radically polymerisable monomer is a molecule comprising at least one ethylene-type bond.

22. The preparation method of claim 1, wherein said radically polymerisable monomer is a molecule with the following formula (II):

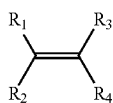

(II)

in which the $R_1$ to $R_4$ groups, identical or different, represent a non-metallic monovalent atom, a hydrogen atom, a saturated or unsaturated chemical group, a —$COOR_5$ group in which $R_5$ represents a hydrogen atom or an alkyl group in $C_1$-$C_{12}$, a nitrile, a carbonyl, an amine or an amide.

23. The preparation method of claim 1, wherein said radically polymerisable monomer is chosen from the group constituted by vinyl acetate, acrylonitrile, methacrylonitrile, methyl methacrylate, ethyl methacrylate, butyl methacrylate, propyl methacrylate, hydroxyethyl methacrylate, hydroxypropyl methacrylate, glycidyl methacrylate and their derivatives; the acrylamides, aminoethyl, propyl, butyl, pentyl and hexyl methacrylamides, the cyanoacrylates, the di-acrylates and di-methacrylates, the tri-acrylates and tri-methacrylates, the tetra-acrylates and tetra-methacrylates tetramethacrylate pentaerythritol, styrene and its derivatives, parachloro-styrene, pentafluoro-styrene, N-vinyl pyrrolidone, 4-vinyl pyridine, 2-vinyl pyridine, the vinyl halides, acryloyl or methacryloyl, di-vinylbenzene (DVB), and vinyl cross-linking agents based on acrylate, methacrylate and derivatives thereof.

24. The preparation method of claim 1, wherein the amount of said radically polymerisable monomer represents between 18 and 40 times the solubility of said monomer at room temperature or at the reaction temperature.

25. The preparation method of claim 1, wherein said method includes a preliminary step during which said at least one radically polymerisable monomer different from the cleavable aryl salt is dispersed or emulsified in the presence of at least one surfactant, or by ultrasound, before it is mixed with the liquid solution including at least one aprotic solvent and at least one cleavable aryl salt.

26. The preparation method of claim 1, wherein said method includes the following steps, consisting of:
a) adding said at least one radically polymerisable monomer to a solution containing said at least one cleavable aryl salt different from said monomer in the presence of said at least one aprotic solvent and optionally at least one chemical initiator,
b) placing the solution obtained in step (a) under said non-electrochemical conditions allowing for the formation of radical entities based on said cleavable aryl salt and possibly based on said chemical initiator,
c) placing the surface of the solid support in contact with the solution of step (b).

27. The preparation method of claim 1, wherein said method includes the following steps, consisting of:
a') placing the surface of the solid support in contact with a solution containing said at least one cleavable aryl salt in the presence of said at least one aprotic solvent, and at least one radically polymerisable monomer different from said cleavable aryl salt and possibly at least one chemical initiator,
b') placing the surface of the solid support in contact with the solution of step (a') under non-electrochemical conditions allowing for the formation of radical entities based on said cleavable aryl salt and possibly based on said chemical initiator,
c') possibly adding at least one radically polymerisable monomer different from said cleavable aryl salt to the solution obtained in step (b').

28. The preparation method of claim 1, wherein said method includes an additional step, prior to the grafting, of cleaning the surface on which the organic film is to be formed.

29. The preparation method of claim 1, wherein the method has an additional step of functionalising said organic film.

30. The preparation method of claim 1, wherein the method has an additional step of functionalising said organic film and wherein the functionalisation is performed by placing said organic film in contact with a functionalisation solution comprising at least one functionalizing compound.

31. The preparation method of claim 1, wherein the method has an additional step of functionalising said organic film and wherein the functionalisation is performed by placing said organic film in contact with a functionalisation solution comprising at least one functionalizing compound which has a chelating structure.

32. The preparation method of claim 1, wherein the method has an additional step of functionalising said organic film and wherein the functionalisation is performed by placing said organic film in contact with a functionalisation solution comprising at least one functionalizing compound which is a derivative of a biomolecule.

33. The preparation method of claim 1, wherein the surface of the support is placed in contact with a suspension of at least one nano-object (NB) in a suspension solvent and in that the film and the nano-object have a physicochemical affinity.

34. The preparation method of claim 1, wherein the surface of the support is placed in contact with a suspension of nano-objects (NBs) which are nanoparticles (NPs) or nanocrystals (NCs) in a suspension solvent and in that the film and the nano-objects have a physicochemical affinity.

35. The preparation method of claim 1, wherein the surface of the support is placed in contact with a suspension of nano-objects (NBs) which are metal or metal alloy nanoparticles (NPs) or nanocrystals (NCs) in a suspension solvent and in that the film and the nano-objects have a physicochemical affinity.

36. The preparation method of claim 1, wherein the surface of the support is placed in contact with a suspension of nano-objects (NBs) in a suspension solvent, wherein the film and the nano-objects have a physicochemical affinity and wherein said NBs are capable of coalescing under the action of a coalescence agent and at least one zone of the surface of the support, coated with the film comprising the NBs, is exposed to a coalescence agent.

37. The preparation method of claim 1, wherein the surface of the support is placed in contact with a suspension of nano-objects (NBs) in a suspension solvent, wherein the film and the nano-object have a physicochemical affinity and wherein said NBs are capable of coalescing under the action of a coalescence agent which is a modification of the temperature or irradiation and at least one zone of the surface of the support, coated with the film comprising the NBs, is exposed to a modification of the temperature or irradiation.

38. A method for metallizing an organic film prepared at the surface of a solid support including the steps consisting of:
  (1) preparing, at the surface of a solid support, an organic film by contacting said surface with a liquid solution including:
    at least one solvent,
    at least one cleavable aryl salt, and
    at least one radically polymerisable monomer different from said cleavable aryl salt,
  under non-electrochemical conditions enabling the formation of radical entities based on the cleavable aryl salt, wherein the cleavable aryl salts generate said radical entities without reacting with the surface on which said radical entities are intended to be grafted,
  (2) placing the surface of the support in contact with a suspension of at least one nano-object (NB) in a suspension solvent, the film and the nano-object having a physicochemical affinity, so an organic film comprising nano-objects (NBs) is obtained at the surface of the solid;
  (3) placing the film obtained in step (2) in contact with a solution containing at least one metal salt capable of being reduced by said NBs, said organic film being polymeric or copolymeric and having a monomer unit sequence in which the first unit is constituted by a derivative of the cleavable aryl salt and the other units are derived from said cleavable aryl salt and from polymerizable monomers.

39. The metallization method of claim 38, wherein the nano-objects (NBs) in the suspension are nanoparticles (NPs) or nanocrystals (NCs) in a suspension solvent.

40. The metallization method of claim 38, wherein the nano-objects (NBs) in the suspension are metal or metal alloy nanoparticles (NPs) or nanocrystals (NCs) in a suspension solvent.

41. The metallization method of claim 38, wherein the solvent in said liquid solution is an aprotic solvent preferably chosen from the group constituted by dimethylformamide (DMF), acetone and dimethyl sulfoxide (DMSO).

42. The metallization method of claim 38, wherein the solvent in said liquid solution is a protic solvent preferably chosen from the group constituted by water, deionised water, distilled water, acidified or not, acetic acid, hydroxylated solvents, low-molecular-weight liquid glycols such as ethyleneglycol, and mixtures thereof.

43. The metallization method of claim 38, wherein said cleavable aryl salt is chosen from the group constituted by aryl diazonium salts, aryl ammonium salts, aryl phosphonium salts and aryl sulfonium salts.

44. The metallization method of claim 38, wherein said cleavable aryl salt is chosen from the group constituted by aryl diazonium salts, aryl ammonium salts, aryl phosphonium salts and aryl sulfonium salts and wherein said aryl group is chosen from the aromatic or heteroaromatic carbon structures, possibly mono- or polysubstituted, constituted by one or more aromatic or heteroaromatic cycles each comprising 3 to 8 atoms, the heteroatom(s) being capable of being N, O, P or S, and the substituent(s) possibly containing one or more heteroatoms or alkyl groups in $C_1$ to $C_6$.

45. The metallization method of claim 38, wherein said cleavable aryl salt has the following formula (I):

$$R-N_2^+, A^- \qquad (I)$$

in which:
  A represents a monovalent anion and
  R represents an aryl group.

46. The metallization method of claim 38, wherein said cleavable aryl salt has the following formula (I):

$$R-N_2^+, A^- \qquad (I)$$

in which:
  A represents a monovalent anion and
  R represents an aryl group chosen from the aromatic or heteroaromatic carbon structures, possibly mono- or polysubstituted, constituted by one or more aromatic or heteroaromatic cycles each comprising 3 to 8 atoms, the heteroatom(s) being capable of being N, O, P or S, and the substituent(s) possibly containing one or more heteroatoms or alkyl groups in $C_1$ to $C_6$.

47. The metallization method of claim 38, wherein said cleavable aryl salt has the following formula (I):

$$R-N_2^+, A^- \qquad (I)$$

in which:
  A represents a monovalent anion chosen from the inorganic anions, the halogenborates and the organic anions and
  R represents an aryl group.

48. The metallization method of claim 38, wherein said cleavable aryl salt is chosen from the group constituted by phenyldiazonium tetrafluoroborate, 4-nitrophenyldiazonium tetrafluoroborate, 4-bromophenyldiazonium tetrafluoroborate, 4-aminophenyldiazonium chloride, 2-methyl-4-chlorophenyldiazonium chloride, 4-benzoylbenzenediazonium tetrafluoroborate, 4-cyanophenyldiazonium tetrafluoroborate, 4-carboxyphenyldiazonium tetrafluoroborate, 4-acetamidophenyldiazonium tetrafluoroborate, 4-phenylacetic acid diazonium tetrafluoroborate, 2-methyl-4-[(2-methylphenyl)diazenyl]benzenediazonium sulphate, 9,10-dioxo-9,10-dihydro-1-anthracenediazonium chloride, 4-nitronaphthalenediazonium tetrafluoroborate and naphthalenediazonium tetrafluoroborate.

49. The metallization method of claim 38, wherein said cleavable aryl salt concentration in said liquid solution is between around $10^{-6}$ and 5 M.

50. The metallization method of claim 38, wherein said cleavable aryl salt is prepared in situ in said liquid solution.

51. The metallization method of claim 38, wherein said liquid solution also contains at least one surfactant.

52. The metallization method of claim 38, wherein the non-electrochemical conditions allowing for the formation of radical entities are chosen from the group constituted by thermal, kinetic, chemical, photochemical or radiochemical conditions and a combination thereof, to which the cleavable aryl salt is subjected.

53. The metallization method of claim 38, wherein the non-electrochemical conditions allowing for the formation of radical entities are chemical conditions.

54. The metallization method of claim 38, wherein said liquid solution also includes one or more chemical initiator(s).

55. The metallization method of claim 38, wherein said liquid solution also includes one or more chemical initiator(s) chosen from:
a reducing metal in a finely divided form,
a metallocene,
an organic or inorganic base in proportions sufficient for the pH of the liquid solution to be greater than or equal to 4,
a pre-irradiated polymeric matrix.

56. The metallization method of claim 38, wherein the surface of said solid support has at least one atom capable of being involved in a radical reaction.

57. The metallization method of claim 38, wherein said solid support and/or the surface of said solid support are made of a material chosen from the group constituted by metals, wood, paper, cotton, felt, silicon, carbon nanotubes, fluoro-polymers and diamond.

58. The metallization method of claim 38, wherein the surface of the solid support contacted with said liquid solution comprises at least one area covered with a mask.

59. The metallization method of claim 38, wherein the surface of the solid support contacted with said liquid solution comprises at least one area covered with a mask and wherein the mask is not soluble in the solvent of said liquid solution.

60. The metallization method of claim 38, wherein the surface of the solid support contacted with said liquid solution comprises at least one area covered with a mask composed of alkylthiols.

61. The metallization method of claim 38, wherein said radically polymerisable monomer is a molecule comprising at least one ethylene-type bond.

62. The metallization method of claim 38, wherein said radically polymerisable monomer is a molecule with the following formula (II):

(II)

in which the $R_1$ to $R_4$ groups, identical or different, represent a non-metallic monovalent atom, a hydrogen atom, a saturated or unsaturated chemical group, a $COOR_5$ group in which $R_5$ represents a hydrogen atom or an alkyl group in $C_1$-$C_{12}$, a nitrile, a carbonyl, an amine or an amide.

63. The metallization method of claim 38, wherein said radically polymerisable monomer is chosen from the group constituted by vinyl acetate, acrylonitrile, methacrylonitrile, methyl methacrylate, ethyl methacrylate, butyl methacrylate, propyl methacrylate, hydroxyethyl methacrylate, hydroxypropyl methacrylate, glycidyl methacrylate and their derivatives; the acrylamides, aminoethyl, propyl, butyl, pentyl and hexyl methacrylamides, the cyanoacrylates, the di-acrylates and di-methacrylates, the tri-acrylates and tri-methacrylates, the tetra-acrylates and tetra-methacrylates tetramethacrylate pentaerythritol, styrene and its derivatives, parachloro-styrene, pentafluoro-styrene, N-vinyl pyrrolidone, 4-vinyl pyridine, 2-vinyl pyridine, the vinyl halides, acryloyl or methacryloyl, di-vinylbenzene (DVB), and vinyl cross-linking agents based on acrylate, methacrylate and derivatives thereof.

64. The metallization method of claim 38, wherein the amount of said radically polymerisable monomer represents between 18 and 40 times the solubility of said monomer at room temperature or at the reaction temperature.

65. The metallization method of claim 38, wherein said method includes a preliminary step during which said at least one radically polymerisable monomer different from the cleavable aryl salt is dispersed or emulsified in the presence of at least one surfactant, or by ultrasound, before it is mixed with the liquid solution including at least one solvent and at least one cleavable aryl salt.

66. The metallization method of claim 38, wherein said method includes the following steps, consisting in:
a) adding said at least one radically polymerisable monomer to a solution containing said at least one cleavable aryl salt different from said monomer in the presence of said at least one solvent and optionally at least one chemical initiator,
b) placing the solution obtained in step (a) under said non-electrochemical conditions allowing for the formation of radical entities based on said cleavable aryl salt and possibly based on said chemical initiator,
c) placing the surface of the solid support in contact with the solution of step (b).

67. The metallization method of claim 38, wherein said method includes the following steps, consisting of:
a') placing the surface of the solid support in contact with a solution containing said at least one cleavable aryl salt in the presence of said at least one solvent, and at least one radically polymerisable monomer different from said cleavable aryl salt and possibly at least one chemical initiator,
b') placing the surface of the solid support in contact with the solution of step (a') under non-electrochemical conditions allowing for the formation of radical entities based on said cleavable aryl salt and possibly based on said chemical initiator,
c') possibly adding at least one radically polymerisable monomer different from said cleavable aryl salt to the solution obtained in step (b').

68. The metallization method of claim 38, wherein said method includes an additional step, prior to the grafting, of cleaning the surface on which the organic film is to be formed.

69. The metallization method of claim 38, wherein the method has an additional step of functionalising said organic film.

70. The metallization method of claim 38, wherein the method has an additional step of functionalising said organic film and wherein the functionalisation is performed by placing said organic film in contact with a functionalisation solution comprising at least one functionalizing compound.

71. The metallization method of claim 38, wherein the method has an additional step of functionalising said organic film and wherein the functionalisation is performed by placing said organic film in contact with a functionalisation solution comprising at least one functionalizing compound which has a chelating structure.

72. The metallization method of claim 38, wherein the method has an additional step of functionalising said organic film and wherein the functionalisation is performed by placing said organic film in contact with a functionalisation solution comprising at least one functionalizing compound which is a derivative of a biomolecule.

* * * * *